(12) United States Patent
Katsumura et al.

(10) Patent No.: US 10,186,479 B2
(45) Date of Patent: *Jan. 22, 2019

(54) SEMICONDUCTOR DEVICE, PACKAGE, AND VEHICLE

(71) Applicant: Panasonic Intellectual Property Management Co., Ltd., Osaka (JP)

(72) Inventors: Hidenori Katsumura, Hyogo (JP); Shinya Tokunaga, Kanagawa (JP); Masaya Sumita, Hyogo (JP); Hiroyoshi Yoshida, Kyoto (JP); Yasuhiro Sugaya, Osaka (JP); Kazuhide Uriu, Osaka (JP); Osamu Shibata, Kanagawa (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 9 days.

This patent is subject to a terminal disclaimer.

(21) Appl. No.: 15/426,142

(22) Filed: Feb. 7, 2017

(65) Prior Publication Data

US 2017/0162490 A1 Jun. 8, 2017

Related U.S. Application Data

(63) Continuation of application No. PCT/JP2015/004191, filed on Aug. 21, 2015.

(30) Foreign Application Priority Data

Aug. 29, 2014 (JP) .................................. 2014-175257

(51) Int. Cl.
*H01L 23/495* (2006.01)
*H01L 25/00* (2006.01)
(Continued)

(52) U.S. Cl.
CPC ........ *H01L 23/49589* (2013.01); *B60R 11/04* (2013.01); *H01L 23/3114* (2013.01); (Continued)

(58) Field of Classification Search
CPC . H01L 2924/15311; H01L 2924/15192; H01L 2224/92247; H01L 2224/83385; (Continued)

(56) References Cited

U.S. PATENT DOCUMENTS 5,498,901 A 3/1996 Chillara et al.
6,310,388 B1 * 10/2001 Bissey .............. H01L 23/49589
257/532

(Continued)

FOREIGN PATENT DOCUMENTS

JP 61-102770 5/1986
JP 63-004662 1/1988
(Continued)

OTHER PUBLICATIONS

International Search Report of PCT application No. PCT/JP2015/004191 dated Nov. 2, 2015.

*Primary Examiner* — Thanh T Nguyen
(74) *Attorney, Agent, or Firm* — McDermott Will & Emery LLP

(57) ABSTRACT

A semiconductor device includes a metal plate capacitor that includes a heat-resistant metal plate and a capacitor unit including a sintered dielectric formed on at least one surface of the heat-resistant metal plate, a semiconductor chip disposed on the metal plate capacitor, a connector configured to electrically connect the semiconductor chip and the metal plate capacitor, and a protector configured to protect the semiconductor chip, the metal plate capacitor, and the connector.

25 Claims, 44 Drawing Sheets

US 10,186,479 B2
Page 2

(51) Int. Cl.
| | |
|---|---|
| *B60R 11/04* | (2006.01) |
| *H01L 23/31* | (2006.01) |
| *H01L 23/498* | (2006.01) |
| *H01L 23/64* | (2006.01) |
| *H01L 23/00* | (2006.01) |
| *H01L 49/02* | (2006.01) |
| *H04N 5/225* | (2006.01) |
| *H01L 23/48* | (2006.01) |
| *H01L 23/367* | (2006.01) |

(52) U.S. Cl.
CPC ...... *H01L 23/481* (2013.01); *H01L 23/49541* (2013.01); *H01L 23/49568* (2013.01); *H01L 23/49822* (2013.01); *H01L 23/49838* (2013.01); *H01L 23/642* (2013.01); *H01L 24/16* (2013.01); *H01L 24/48* (2013.01); *H01L 25/00* (2013.01); *H01L 28/65* (2013.01); *H04N 5/2252* (2013.01); *B60R 2300/105* (2013.01); *B60R 2300/301* (2013.01); *H01L 23/367* (2013.01); *H01L 23/49548* (2013.01); *H01L 23/49861* (2013.01); *H01L 24/49* (2013.01); *H01L 2224/16265* (2013.01); *H01L 2224/32145* (2013.01); *H01L 2224/45144* (2013.01); *H01L 2224/45147* (2013.01); *H01L 2224/48091* (2013.01); *H01L 2224/48137* (2013.01); *H01L 2224/48145* (2013.01); *H01L 2224/48265* (2013.01); *H01L 2224/48463* (2013.01); *H01L 2224/48464* (2013.01); *H01L 2224/49113* (2013.01); *H01L 2224/49175* (2013.01); *H01L 2224/49433* (2013.01); *H01L 2224/73265* (2013.01); *H01L 2224/83101* (2013.01); *H01L 2224/83385* (2013.01); *H01L 2224/92247* (2013.01); *H01L 2924/00014* (2013.01); *H01L 2924/1205* (2013.01); *H01L 2924/15192* (2013.01); *H01L 2924/15311* (2013.01); *H01L 2924/181* (2013.01); *H01L 2924/19105* (2013.01); *H01L 2924/19107* (2013.01); *H04N 5/2257* (2013.01); *H04N 5/2258* (2013.01)

(58) Field of Classification Search
CPC . H01L 2224/83101; H01L 2924/19105; H01L 2224/49175; H01L 2224/48464; H01L 2224/48463; H01L 2224/48137; H01L 2224/48091; H01L 24/49; H01L 2224/16265; H01L 23/49548; H01L 23/367; H01L 2924/1205; H01L 2224/48145; H01L 2224/49113; H01L 2224/32145; H01L 23/49822; H01L 23/49541; H01L 23/3114; H01L 23/481; H01L 25/00; H01L 23/49861; H01L 2224/48265; H01L 2924/00014; H01L 2224/49433; H01L 2224/45147; H01L 2224/45; H01L 23/49589; H01L 23/49568; H01L 28/65; H01L 24/48; H01L 24/16; H01L 23/642; H01L 23/49838; H01L 2924/19107; H01L 2224/73265; H04N 5/2258; H04N 5/2257; H04N 5/2252; B60R 2300/301; B60R 2300/105; B60R 11/04
See application file for complete search history.

(56) References Cited

U.S. PATENT DOCUMENTS

| | | | |
|---|---|---|---|
| 6,538,313 B1 * | 3/2003 | Smith | H01L 23/3107 257/528 |
| 2006/0141225 A1 | 6/2006 | Borland | |
| 2009/0238954 A1 | 9/2009 | Suh et al. | |
| 2011/0204015 A1 * | 8/2011 | West | B65D 3/22 215/316 |
| 2012/0032301 A1 * | 2/2012 | Kasuga | H01G 9/15 257/532 |
| 2017/0077019 A1 * | 3/2017 | Sugaya | H01G 4/33 |

FOREIGN PATENT DOCUMENTS

| | | |
|---|---|---|
| JP | 5-152506 | 6/1993 |
| JP | 5-267557 | 10/1993 |
| JP | 5-335501 | 12/1993 |
| JP | 11-026290 | 1/1999 |
| JP | 2006-019596 | 1/2006 |
| JP | 2006-191110 | 7/2006 |
| JP | 2010-157529 | 7/2010 |
| JP | 2011-519472 | 7/2011 |

* cited by examiner

SEMICONDUCTOR DEVICE, PACKAGE, AND VEHICLE

BACKGROUND

1. Technical Field

The present disclosure relates to a semiconductor device included in, for example, an image processing apparatus to achieve improved safety of a vehicle and the like, a package, and a vehicle, and a vehicle and various electronic devices can provide improved performance when the semiconductor device and the package are mounted.

2. Description of the Related Art

Recently, increasing safety has been required for a vehicle. The safety and performance of a vehicle are improved by cameras (optical devices using, for example, visible light and infrared) attached to front and rear sides of the vehicle, and radars (using, for example, ultrasonic, laser, and milliwaves). In addition, for example, a HDMI (registered trademark) device is used in the field of in-vehicle communication with devices mounted on a vehicle, and the field of high speed communication with portable terminals.

A semiconductor device and a package according to the present disclosure are applicable to various electronic devices as well as a vehicle.

The safety and performance of a vehicle and various electronic devices can be improved by using the semiconductor device according to the present disclosure, and the package on which the semiconductor device is mounted.

FIG. 47 is a sectional view of an exemplary conventional signal processing semiconductor package. The following describes the conventional semiconductor package with reference to FIG. 47. FIG. 47 is a sectional view for description of an exemplary conventional plastic ball grid array (PBGA) semiconductor package. Conventional semiconductor package 1 includes semiconductor chip 2, substrate unit 3, wire 4 which electrically connects substrate unit 3 and semiconductor chip 2, and molding unit 5 which protects these components. Solder ball 6 is formed on one surface of substrate unit 3, and semiconductor package 1 can be mounted on a circuit board (not illustrated).

However, in such a conventional semiconductor device, when high-speed signal processing is performed, jitters cause a problem. Jitters are generated due to fluctuation of power-supply voltages referred to as Vdd and Vss (Vdd for drain voltage, and Vss for source voltage) inside a semiconductor.

It is conventionally disclosed that a laminated ceramic capacitor is included as a bypass capacitor in the package together with the semiconductor chip to improve a jitter characteristic. The laminated ceramic capacitor advantageously has a large capacity at low cost. In a semiconductor chip integrally including an analog circuit and a digital circuit, power division is required in some cases. The laminated ceramic capacitor needs to be disposed at each dividing position to achieve such a semiconductor chip in which power division is required.

However, when the semiconductor chip and the laminated ceramic capacitor are disposed on an identical surface, an increased mount area is needed, which is a problem. In addition, when the laminated ceramic capacitor is mounted by soldering, prevention of soldering re-melting in the following soldering reflow process needs to be provided. The laminated ceramic capacitor is disposed outside of the semiconductor chip and outside of a wire bonding region connected with the semiconductor chip. As a result, the semiconductor device has an increased projected area, which is another problem. When the projected area is increased, a circuit length between the semiconductor chip and the laminated ceramic capacitor is increased, equivalent series resistance (ESR) and equivalent series inductance (ESL) are increased, and a jitter value is increased. The jitter refers to fluctuation and disorder of a signal waveform in a time axial direction. When the jitter value is increased, for example, data error in a digital circuit is caused in some cases, and a signal quality in an analog circuit decreases in some cases.

It is disclosed to include a stacked capacitor using tape automated bonding (TAB) to solve such a problem. PTL 2 discloses that a capacitor achieved by insulating film 9 and metal foil 10 is included as a bypass capacitor on a bottom surface of the semiconductor chip in the package. More detailed description will be made below with reference to FIG. 48.

FIG. 48 is a sectional view of a semiconductor package including a conventional parallel plate capacitor achieved by an insulating film and a metal foil. In FIG. 48, reference sign 7 denotes a TAB. Semiconductor chip 2 is formed on one surface of TAB 7, and metal foil 10 is formed on the other surface of TAB 7 through insulating film 9. TAB 7, insulating film 9, and metal foil 10 are included in capacitor unit 11. Wires 4 electrically connect semiconductor chip 2 and lead frame 12, and TAB 7 and lead frame 12.

TAB 7 is a tape flexible circuit board. In a TAB tape, wiring achieved by copper wires formed by etching is provided on a film made of polyimide.

However, when capacitor unit 11 is formed by using TAB 7, it is difficult to satisfy characteristics required for a bypass capacitor. In addition, it is difficult to form a ceramic sinter film having a high dielectric constant. This is partly because it is difficult to perform high temperature processing at 400° C. or higher when the TAB tape is used. This is because a polyimide material used as the TAB tape is not resistant to a temperature of 400° C. or higher. In addition, when the TAB tape is used, a dielectric material used to form capacitor unit 11 is selected from a limited range of dielectric materials formed at lower than 400° C., in other words, at 300° C. or lower, which is a temperature threshold to which the TAB tape is resistant. As a result, insulating film 9 that can be formed on the surface of the TAB tape is mainly made of resin and thus has a low dielectric constant. As a result, it is often difficult to form a large-capacity bypass capacitor that is not degraded through high speed signal processing, and thus provides an effect of reducing variation of power-supply voltage.

FIG. 49 is a sectional view of a semiconductor package including a conventional capacitor obtained by forming a dielectric on a lead frame. In FIG. 49, it is disclosed to use, as the dielectric, for example, tantalum oxide (dielectric constant $\varepsilon=20$ to 27 approximately), $BaTiO_3$ ($\varepsilon=2000$ approximately), $SrTiO_3$ ($\varepsilon=150$ to 200), $BaSrTiO_3$ ($\varepsilon=200$ to 450), and $PbLaZrTiO_3$ ($\varepsilon=750$ to 4000), and to use, as the lead frame, for example, 42FN, 50FN, and kovar (PTL 2).

As described above, a conventional heat-resistant metal material cannot be used in place of the TAB to form a capacitor. For example, exemplary components of kovar (Kovar) are Ni of 29%, Co of 17%, Si of 0.2%, Mn of 0.3%, and Fe of 53.5%, in weight %. A main component of 42FN (also referred to as 42 alloy) is 42Ni—Fe (mass %), and a main component of 50FN is 50Ni—Fe (mass %). These metal materials, which have excellent thermal resistances, have such a problem that, when the materials are fabricated as a lead frame having a fine pattern and subjected to thermal processing at high temperatures of 300° C. or higher, 600° C. or higher, and 900° C. or higher, a fine part is likely to deform.

In other words, when a capacitor is formed on a heat-resistant metal plate shaped in a lead frame having a fine pattern through thermal processing at high temperatures of 300° C. or higher, and 400° C. or higher, a polyimide reinforced portion provided to prevent a dimensional change at a fine part becomes deformed and burnt during heating, resulting in a largely decreased dimensional accuracy of the lead frame.

CITATION LIST

Patent Literature

PTL 1: Unexamined Japanese Patent Publication No. H05-152506
PTL 2: Unexamined Japanese Patent Publication No. 2006-019596

SUMMARY

However, with the conventional configuration, when high-speed signal processing is performed through high-speed transferring of image information or the like, operation of a semiconductor becomes unreliable at a higher transmission speed, and jitters are likely to occur, which has been a problem.

The present disclosure is intended to solve the above-described problem, and to achieve reliable operation of a semiconductor and reduction of jitters even when signal processing is performed at high speed.

A semiconductor device according to an aspect of the present disclosure includes a metal plate capacitor including a heat-resistant metal plate and a capacitor unit that is formed on at least one surface of the heat-resistant metal plate, a semiconductor chip disposed on the metal plate capacitor, a connector configured to electrically connect the semiconductor chip and the capacitor, and a protector configured to protect the semiconductor chip, the metal plate capacitor, and the connector. The metal plate capacitor is included in the semiconductor device. A capacitor component necessary for speeding-up of the semiconductor chip can be freely supplied to the semiconductor chip, thereby achieving significant reduction of jitters in signal processing, and improved external noise resistance.

A package according to another aspect of the present disclosure includes a semiconductor device including: a metal plate capacitor including a heat-resistant metal plate and a capacitor unit that is formed on at least one surface of the heat-resistant metal plate; a semiconductor chip disposed on the metal plate capacitor; a connector configured to electrically connect the semiconductor chip and the capacitor; and a protector configured to protect the semiconductor chip, the metal plate capacitor, and the connector, and a wiring substrate on which the semiconductor device is mounted. The metal plate capacitor is included in the semiconductor device. A capacitor component necessary for speeding-up of the semiconductor chip can be freely supplied to the semiconductor chip, thereby achieving significant reduction of jitters in signal processing, and improved external noise resistance.

A vehicle according to another aspect of the present disclosure is a vehicle on which a package is mounted, the package including a semiconductor device including: a metal plate capacitor including a heat-resistant metal plate and a capacitor unit that is formed on at least one surface of the heat-resistant metal plate; a semiconductor chip disposed on the metal plate capacitor; a connector configured to electrically connect the semiconductor chip and the capacitor; and a protector configured to protect the semiconductor chip, the metal plate capacitor, and the connector, and a wiring substrate on which the semiconductor device is mounted. The metal plate capacitor is included in the semiconductor device. A capacitor component necessary for speeding-up of the semiconductor chip can be freely supplied to the semiconductor chip, thereby achieving significant reduction of jitters in signal processing, improved external noise resistance, and speeding-up of signal processing in the vehicle.

According to the present disclosure, a capacitance component necessary for speeding-up of a semiconductor chip can be freely supplied from a metal plate capacitor to the semiconductor chip. This can achieve significant reduction of jitters in signal processing, improved external noise resistance, and noise reduction in high-speed signal processing in, for example, a vehicle.

BRIEF DESCRIPTION OF THE DRAWINGS

FIG. 29A is a top view for description of a semiconductor chip, a metal plate capacitor, a Vdd line, a Vss line, a signal line, and the like;

FIG. 29B is a side view for description of the semiconductor chip, the metal plate capacitor, the Vdd line, the Vss line, the signal line, and the like;

FIG. 44A is a perspective view for description of one process among a series of processes performed on a semiconductor device in which a through-hole into which at least one semiconductor chip can be inserted is formed at a central part of the metal plate capacitor or the like;

FIG. 44B is a perspective view for description of one process among the series of processes performed on the semiconductor device in which a through-hole into which at least one semiconductor chip can be inserted is formed at a central part of the metal plate capacitor or the like;

FIG. 44C is a perspective view for description of one process among the series of processes performed on the semiconductor device in which a through-hole into which at least one semiconductor chip can be inserted is formed at a central part of the metal plate capacitor or the like;

DETAILED DESCRIPTION

Exemplary embodiments of the present disclosure will be described below with reference to the following exemplary embodiments. A first exemplary embodiment describes an example with a ball grid array (BGA) for a semiconductor device according to the present disclosure and a vehicle including the semiconductor device. A second exemplary embodiment and any following embodiments describe examples with a quad flat package (QFP), a quad for non-lead package (QFN), and a wafer level chip size package (WLCSP) for the semiconductor device according to the present disclosure.

The semiconductor device according to the present disclosure can be achieved through selection from among various product forms such as the BGA, the QFP, the QFN, and the WLCSP in accordance with, for example, usage of the semiconductor device.

It is advantageous to combine the content of the first exemplary embodiment with the contents of the second exemplary embodiment and any following embodiments, and also to combine the contents of the second exemplary embodiment and any following embodiments with the content of the first exemplary embodiment.

First Exemplary Embodiment

The semiconductor device according to the present disclosure and the vehicle including the semiconductor device will be described as the first exemplary embodiment with reference to FIG. 1A and FIG. 1B.

Figure 1A:
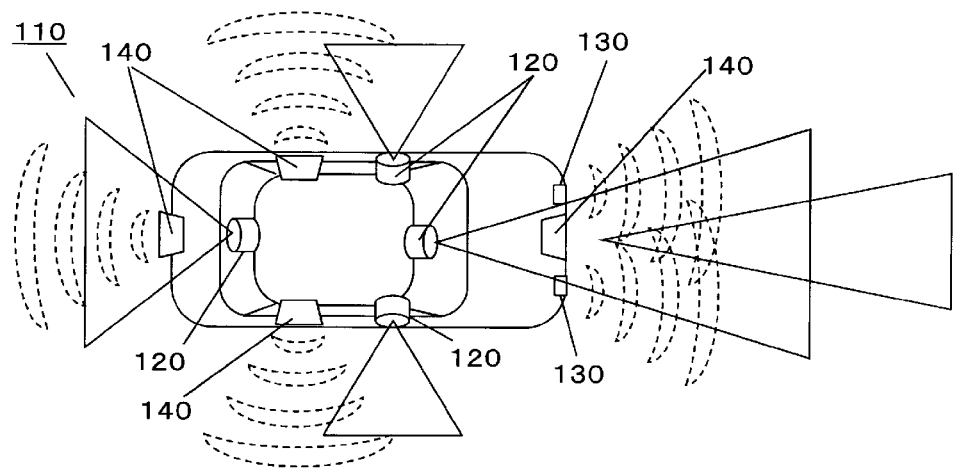
FIG. 1A is a top view for description of an exemplary vehicle according to the present disclosure.
Figure 1B:
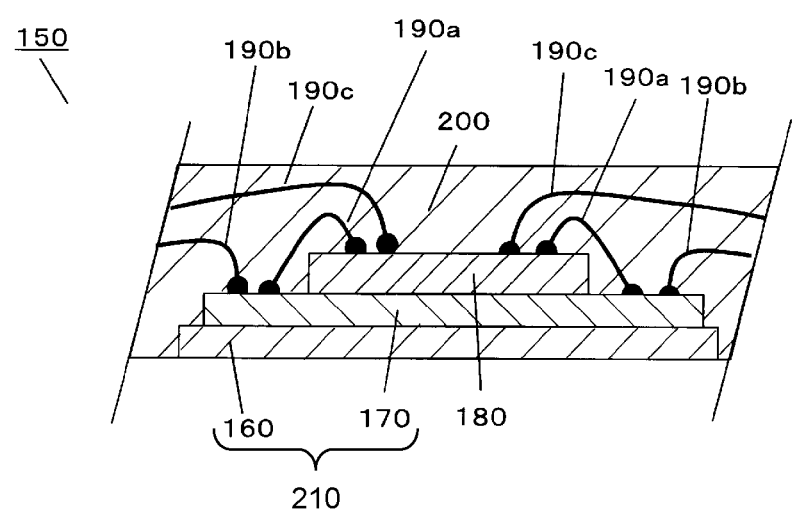
FIG. 1B is a sectional view illustrating an exemplary semiconductor device according to the present disclosure.

FIG. 1A is a top view for description of an exemplary vehicle according to the present disclosure, and FIG. 1B is a sectional view illustrating an exemplary semiconductor device according to the present disclosure.

Vehicle 110 illustrated in FIG. 1A includes the semiconductor device according to the present disclosure. As illustrated in FIG. 1A, it is proposed to incorporate various devices in vehicle 110 to improve travel safety.

In FIG. 1A, cameras 120 are incorporated in front, side, and rear parts of vehicle 110. Laser radar 130 and milliwave radar 140 are incorporated in the front and side parts of vehicle 110. Improving safety of vehicle 110 when, for example, traveling requires incorporation of various sensors such as cameras 120, laser radar 130, and milliwave radar 140, and high-speed processing of various signals transferred from these sensors.

In FIG. 1A, vehicle 110 is provided with a plurality of cameras 120 each configured to perform image capturing within a predetermined image capturing range and perform image processing at high speed. Such a system illustrated in FIG. 1A can function as an around view monitor. For a wider image capturing range and high-speed processing of various kinds of information within the image capturing range, it is needed to reduce generation of a jitter or the like in a semiconductor device configured to perform image processing for cameras 120. Vehicle 110 includes an on-board package including a wiring substrate on which a semiconductor device to be described later is mounted.

FIG. 1B is a sectional view of an exemplary semiconductor device according to the present disclosure. Semiconductor device 150 includes heat-resistant metal plate 160, and capacitor unit 170 formed on at least one surface of heat-resistant metal plate 160. Semiconductor chip 180 is disposed on capacitor unit 170. Semiconductor chip 180 and metal plate capacitor 210 are electrically connected with each other through connector 190a including, for example, a wire. Metal plate capacitor 210 is electrically connected with a BGA resin substrate unit (not illustrated) and a QFP lead frame (not illustrated) through connector 190b including, for example, a wire. Semiconductor chip 180 is electrically connected with, for example, a BGA wiring substrate unit (not illustrated) and a QFP lead frame (not illustrated) through connector 190c including, for example, a wire. Semiconductor chip 180, heat-resistant metal plate 160, and capacitor unit 170 formed on at least one surface of heat-resistant metal plate 160 are protected by protector 200 made of, for example, molding resin. It is advantageous that metal plate capacitor 210 includes a sintered dielectric. A capacitor made of dielectric powder consolidated with organic material such as epoxy resin has a low dielectric constant (for example, a relative dielectric constant K of 30 approximately). A sintered dielectric obtained through vanishing of an organic component serving as a binding agent during sintering, however, has a high dielectric constant (for example, a relative dielectric constant K of 500 or larger), providing excellent reliability.

Figure 2:
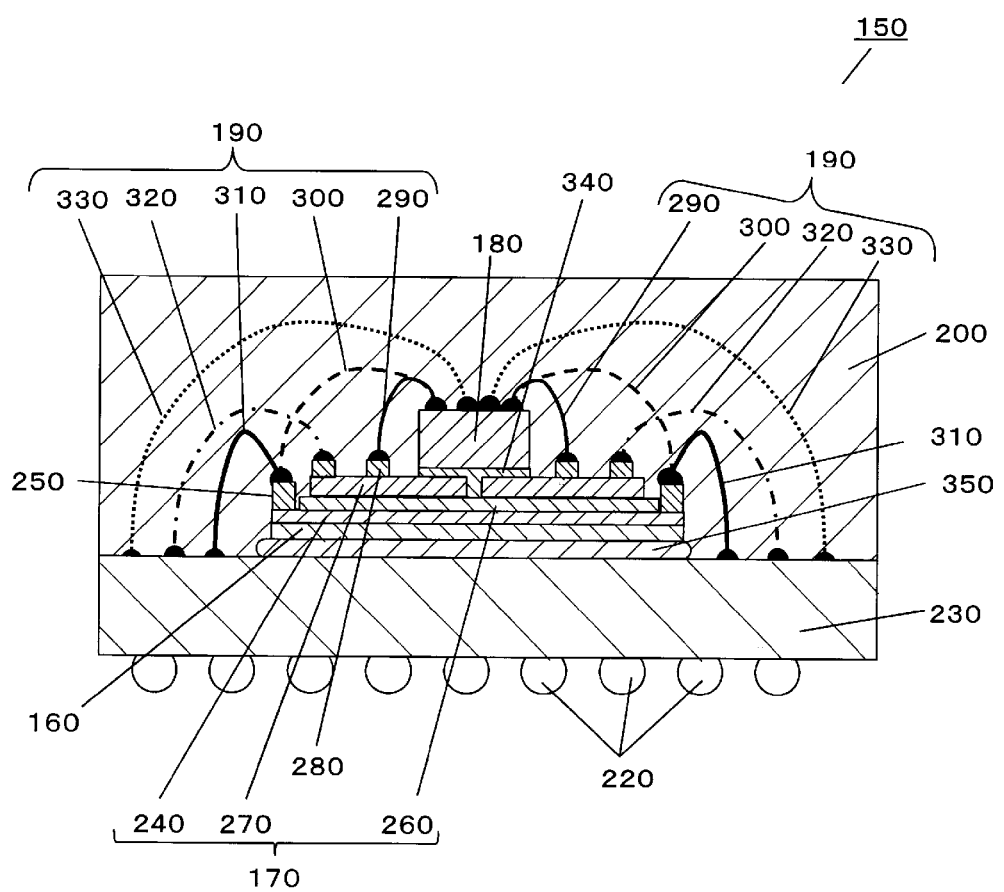
FIG. 2 is a sectional view illustrating an exemplary semiconductor device including a metal plate capacitor.

The following describes the BGA as an exemplary semiconductor device according to the present disclosure with reference to FIG. 2. Devices other than the BGA (for example, the QFP illustrated in FIGS. 20A and 20B, and the WLCSP illustrated in FIGS. 38A to 38C in the second exemplary embodiment to be described later) are each one form of semiconductor device 150 according to the present disclosure.

FIG. 2 is a sectional view illustrating an exemplary semiconductor device including the metal plate capacitor. As illustrated in FIG. 2, metal plate capacitor 210 includes heat-resistant metal plate 160, lower electrode 240, sintered dielectric 260, and upper electrode 270. Lower electrode 240, sintered dielectric 260, and upper electrode 270 serve as capacitor unit 170.

As illustrated in FIG. 2, it is advantageous to form lower auxiliary electrode 250 on lower electrode 240. It is also advantageous to form upper auxiliary electrode 280 on upper electrode 270.

In FIG. 2, semiconductor chip 180 and upper electrode 270 are electrically connected with each other through upper chip connector 290. Semiconductor chip 180 and lower electrode 240 are electrically connected with each other through lower chip connector 300. The lower electrode and a land electrode (to be described later; not illustrated) on a surface of resin substrate unit 230 are electrically connected with each other through lower land connector 310. Similarly, upper electrode 270 and the land electrode (not illustrated) on the surface of resin substrate unit 230 are electrically connected with each other through upper land connector 320. In addition, semiconductor chip 180 and the land electrode (not illustrated) on the surface of resin substrate unit 230 are electrically connected with each other through chip land connector 330.

It is advantageous to have a drain voltage (Vdd) at upper chip connector 290 and upper land connector 320, but the present disclosure is not necessarily limited to Vdd.

Similarly, it is advantageous have a source voltage (Vss) at lower chip connector 300 and lower land connector 310, but the present disclosure is not necessarily limited to Vss.

It is advantageous that chip land connector 330 is a signal line, but the present disclosure is not necessarily limited to the signal line.

In FIG. 2, semiconductor chip 180 is fixed to a surface of upper electrode 270 through die attachment 340, and it is advantageous that die attachment 340 is made of an insulating material. Die attachment 340 made of an insulating material can achieve insulation between a plurality of upper electrodes 270 adjacent to each other even when semiconductor chip 180 is fixed across the plurality of upper electrodes 270 adjacent to each other. With this configuration, the voltage (Vdd) can be supplied from a plurality of upper electrodes 270 to different positions on semiconductor chip 180 independently through upper chip connector 290. Accordingly, upper electrodes 270 adjacent to each other are each prevented from affecting any adjacent upper electrode 270, which leads to reduction of jitters in semiconductor chip 180.

In FIG. 2, it is advantageous to employ a wire bonding technology utilizing wires made of, for example, copper and gold, for connectors 190 such as upper chip connector 290, lower chip connector 300, upper land connector 320, lower auxiliary electrode 250, and chip land connector 330.

In FIG. 2, resin substrate unit 230 and metal plate capacitor 210 are bonded to each other through bonding member 350. Use of insulating adhesive agent as bonding member 350 allows insulation between resin substrate unit 230 and metal plate capacitor 210, and formation of a wiring pattern (not illustrated) on the surface of resin substrate unit 230, overlapping with metal plate capacitor 210. Conductive adhesive agent, or conductive or insulating adhesive agent having a high thermal conductivity may be used as bonding member 350 in accordance with usage. The conductive adhesive agent may be used to electrically connect the land electrode (not illustrated) formed on the surface layer of resin substrate unit 230, and lower electrode 240 (for example, a Vss electrode). A buildup or a typical wiring substrate including a through via may be used as resin substrate unit 230.

In FIG. 2, upper auxiliary electrode 280 is provided on the surface of upper electrode 270. As illustrated in FIG. 2, influence on sintered dielectric 260 at wire bonding can be reduced by providing upper auxiliary electrode 280 and directly and electrically connecting, in place of upper electrode 270, upper auxiliary electrode 280 with upper chip connector 290, upper land connector 320, and any other connector.

Similarly, in FIG. 2, lower auxiliary electrode 250 is provided on a surface of lower electrode 240. As illustrated in FIG. 2, workability of wire bonding can be improved by providing lower auxiliary electrode 250 and directly and electrically connecting lower auxiliary electrode 250 at a higher position, in place of lower electrode 240 at a lower position, with lower chip connector 300, lower land connector 310, and any other connector.

As illustrated in FIG. 2, bumps 220 are formed on a surface of resin substrate unit 230, on which metal plate capacitor 210 is not formed, which allows highly dense mounting of semiconductor device 150 as the BGA on another wiring substrate (not illustrated).

The use of heat-resistant metal plate 160 allows use of, as a dielectric material, a thermoset dielectric (dielectric material obtained by dispersing a dielectric such as barium titanate in, for example, epoxy resin) that is thermally cured at 200° C. to 300° C., and also allows use of, as a dielectric material, sintered dielectric 260 obtained through baking at 600° C. or higher, and further at 850° C. or higher. A thermoset dielectric has a low relative dielectric constant (K) of 10 to 50 approximately, but the use of sintered dielectric 260 as a dielectric allows increase of the relative dielectric constant (K) up to 500 approximately. In this manner, the use of sintered dielectric 260 allows improvement of the capacity of capacitor unit 170, electric property, and reliability.

Sintered dielectric 260 is desirably thermally processed at a high temperature of 600° C. or higher, and further 800° C. or higher. The thermal processing at a high temperature of 600° C. or higher can remove, for example, a resin component (also called as a binding agent) having a low relative dielectric constant (K) included in the dielectric. Furthermore, the thermal processing at a high temperature of 800° C. or higher can improve denseness of the dielectric through sintering and the relative dielectric constant (K) of the dielectric, thereby improving insulation reliability.

As illustrated in FIG. 2, semiconductor device 150 including resin substrate unit 230 and bump 220 is small and light weighted. Semiconductor device 150 is an extremely preferable device in the field of in-vehicle devices. This is because semiconductor device 150 has improved noise resistance enough to reduce, for example, fluctuation of power-supply voltage due to external noise.

Semiconductor device 150 illustrated in FIG. 2 is expected to have the following advantages. The noise resistance of the semiconductor device can be achieved at low cost as compared to noise reduction by a capacitor embedded substrate as illustrated in FIG. 34B to be described later. In addition, the numbers of power sources and ground (GND) pins in semiconductor device 150 can be reduced. The number of allocated signal pins can be increased by the reduced numbers of power sources and ground pins, thereby achieving downsizing of the semiconductor device. In addition, metal plate capacitor 210 serves as a shield for semiconductor chip 180 and resin substrate unit 230, thereby achieving reduction in the number of layers such as interposers (for example, a four-layered plate can be replaced with a two-layered plate). In addition, the number of bypass capacitors on a mother board (or main board) of a user's device can be reduced.

Lower chip connector 300 which electrically connects semiconductor chip 180 with lower electrode 240 and lower auxiliary electrode 250, and upper chip connector 290 which electrically connects semiconductor chip 180 with upper electrode 270 and upper auxiliary electrode 280 may be referred to as a first connector. Similarly, lower land connector 310 and connector 320 may be referred to as a second connector. Lower land connector 310 electrically connects the land electrode (not illustrated in FIG. 2, but illustrated as land electrode 480 in FIG. 14 to be described later) provided to resin substrate unit 230 with lower electrode 240 and lower auxiliary electrode 250. Upper land connector 320 electrically connects land electrode with upper electrode 270 and upper auxiliary electrode 280. In FIG. 2, semiconductor chip 180, heat-resistant metal plate 160, capacitor unit 170 formed on at least one surface of heat-resistant metal plate 160, the first connector, and the second connector are protected by protector 200.

The following describes, with reference to FIGS. 3A to 8, a method for manufacturing the metal plate capacitor included in semiconductor device 150 described with reference to FIG. 2, and an exemplary structure of the metal plate capacitor.

Figure 3A:
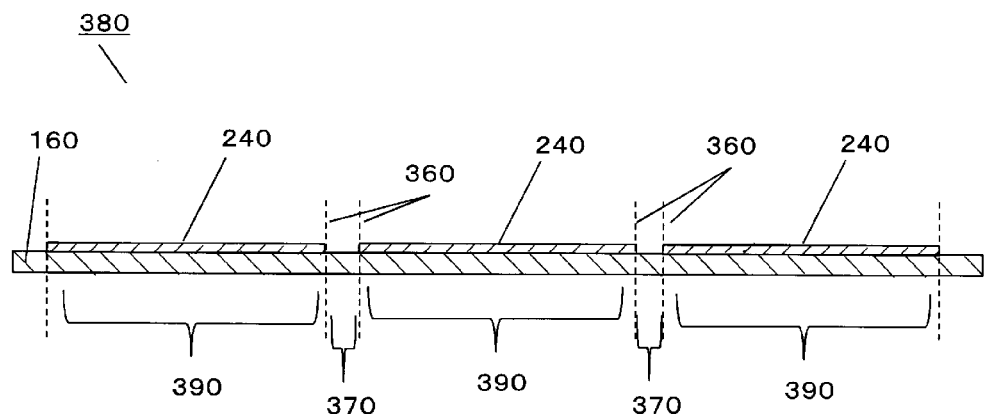
FIG. 3A is a sectional view illustrating an exemplary method for manufacturing a metal plate capacitor to be included in a semiconductor device.
Figure 3B:
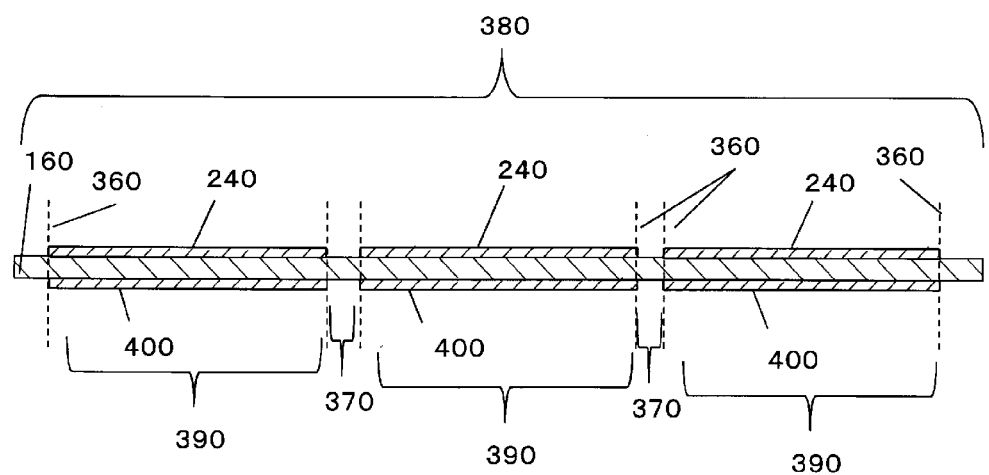
FIG. 3B is a sectional view illustrating an exemplary method for manufacturing a metal plate capacitor to be included in the semiconductor device.

FIGS. 3A and 3B are each a sectional view illustrating an exemplary method for manufacturing a metal plate capacitor to be included in a semiconductor device. In FIGS. 3A and 3B, auxiliary line 360 corresponds to the size of individually separated metal plate capacitor 210 or a dividing position.

First, as illustrated in FIG. 3A, heat-resistant metal plate 160 is prepared. Heat-resistant metal plate 160 is a metal member having a thickness of 50 μm or larger and thermal resistance (for example, that is resistant to baking at 850° C. to 950° C. in oxidizing atmosphere, or that is not largely warped by heating processing). Then, lower electrode 240 is formed on at least one surface of heat-resistant metal plate 160 by using, for example, a screen printing technology. It is advantageous to use, as lower electrode 240, Ag electrode paste for sintering containing silver of 50 mass % to 100 mass % inclusive, or AgPd electrode paste for sintering containing silver of 50 mass % or more, which is commercially available and resistant to baking at 850° C. to 950° C. approximately. Then, as illustrated with auxiliary line 360 in FIG. 3A, lower electrode 240 is formed by printing this electrode paste on one surface of heat-resistant metal plate 160 in alignment with dividing part 370 (or slightly over dividing part 370). This direct formation of lower electrode 240 on the surface of heat-resistant metal plate 160 leads to improved capacitor characteristic and improved wire bonding property of a capacitor part.

Figure 4A:
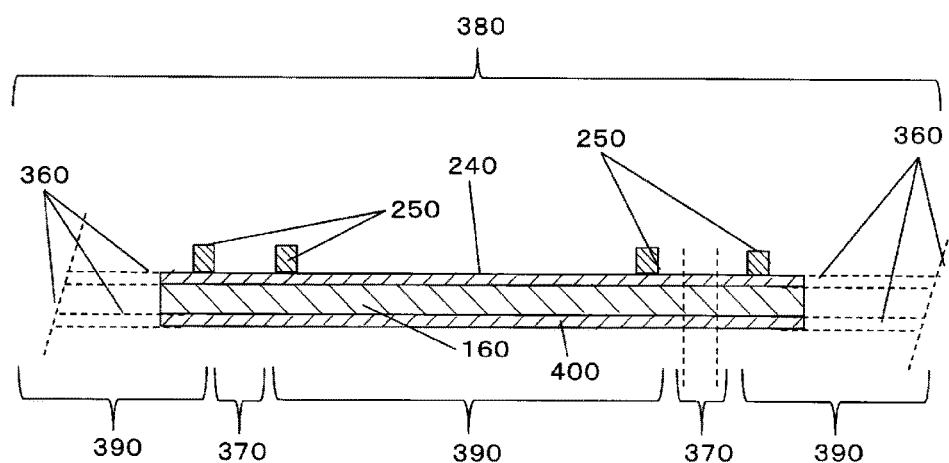
FIG. 4A is a sectional view illustrating an exemplary method for manufacturing a metal plate capacitor to be included in a semiconductor device.
Figure 4B:
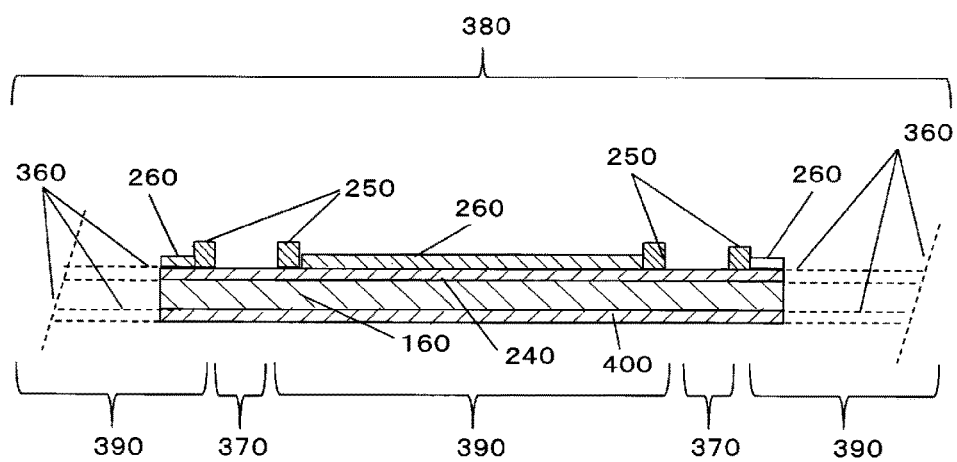
FIG. 4B is a sectional view illustrating an exemplary method for manufacturing a metal plate capacitor to be included in a semiconductor device.

When heat-resistant metal plate 160 has a small thickness of 50 μm or smaller, heat-resistant metal plate 160 has reduced flatness and deforms in some cases. In order to prevent deformation, in other words, warp generation of the heat-resistant metal plate during thermal processing, it is advantageous to form, for example, back electrode 400 on the other surface of heat-resistant metal plate 160 as illustrated in FIG. 4B. Back electrode 400 is made of Ag electrode paste or AgPd electrode paste commercially available and resistant to baking at 850° C. to 950° C. approximately. This can prevent generation of warp and distortion of heat-resistant metal plate 160 due to difference in the thermal expansion coefficient between heat-resistant metal plate 160, and lower electrode 240, sintered dielectric 260, upper electrode 270, and any other component during, for example, baking, and allows back electrode 400 to be used as an electrode of the heat-resistant metal plate.

In FIGS. 3A and 3B, single unit 390 corresponds to each metal plate capacitor 210. As illustrated in FIGS. 4A and 4B, it is advantageous to manufacture, as multiple unit 380, a plurality of single units 390 arranged in X and Y directions with dividing parts 370 between single units 390. When single units 390 are treated as multiple unit 380, characteristic variation of the capacitor part formed in each single unit 390 can be reduced, and reduction can be achieved in quality variation and manufacturing cost. For example, when single unit 390 has a dimension of 9 mm×9 mm, a gap serving as a cutting margin illustrated with auxiliary lines 360 is 1 mm, and multiple unit 380 has an outline dimension of 300 mm×400 mm, 12 single units 390 are obtained for each multiple unit. Capacitor unit 170 formed in each single unit 390 in multiple unit 380 may be electrically examined, for example.

FIGS. 4A and 4B are each a sectional view illustrating an exemplary method for manufacturing a metal plate capacitor to be included in a semiconductor device.

As illustrated in FIG. 4A, lower auxiliary electrode 250 may be additionally provided on lower electrode 240. As illustrated in FIG. 4A, when lower auxiliary electrode 250 is provided and used as a wire bonding area (not denoted by a reference sign), the operability of wire bonding can be improved. In other words, wire bonding on a metal material having an excellent wire bonding property and selected as lower auxiliary electrode 250 can have improved adhesiveness and increased pull strength. It is advantageous that the width and length of lower auxiliary electrode 250 are each 100 μm or larger, more preferably 200 μm or larger for reliable bonding. Lower auxiliary electrode 250 may have an optional pattern shape. Thus, it is advantageous to use the pattern shape of lower auxiliary electrode 250 as an alignment mark in each process. The bonding area does not necessarily need to be on lower auxiliary electrode 250, but may be on lower electrode 240 or heat-resistant metal plate 160 (not illustrated). Lower auxiliary electrode 250 may be directly formed not only on the surface of lower electrode 240 but also on the surface of heat-resistant metal plate 160.

In FIG. 4A, lower auxiliary electrode 250 formed on lower electrode 240 may be formed of, for example, Ag electrode paste or AgPd electrode paste that is commercially available and resistant to baking at 850° C. to 950° C. approximately. When these electrode pastes and lower electrode 240 and lower auxiliary electrode 250 obtained by sintering the electrode pastes each contain a glass component of 10 mass % or more, preferably 5 mass % or more, more preferably glassless (less than 0.1 mass %), an improved wire bonding property and an improved simultaneous sintering property can be achieved. When an increased ratio (for example, 80 mass % or more, 90 mass % or more, 100 mass % or less) of Ag is contained, an improved wire bonding property can be achieved.

FIG. 4A illustrates one single unit 390 as part of multiple unit 380, and in FIG. 4A, another single unit or any other component is illustrated with auxiliary line 360 for omission.

FIG. 4B is a sectional view for description of formation of a dielectric on lower electrode 240. In FIG. 4B, the dielectric is desirably sintered dielectric 260. It is advantageous that the dielectric as sintered dielectric 260 is a barium titanate-based dielectric (BTO). After dielectric paste containing BTO is printed in a predetermined pattern, sintered dielectric 260 can be formed through sintering at 900° C. approximately (preferably between 850° C. and 950° C. inclusive; at a temperature lower than 850° C., sintered dielectric 260 has a low dielectric characteristic in some cases. A special and expensive heat-resistant metal plate needs to be selected for baking at a temperature higher than 950° C.). A dielectric constant, a temperature characteristic of the dielectric constant, a sintering start temperature, and the like can be adjusted by adding various kinds of additive agent to a dielectric material containing BTO as a primary component.

It is advantageous to select, as the dielectric constituting sintered dielectric 260, from dielectric materials such as SBT (strontium-bismuth tantalate) and BLT (bismuth-lanthanum titanate) as well as BTO (barium titanate) in accordance with usage and environment. In addition, when metal plate capacitor 210 serves as a bypass capacitor and is required to have a high frequency characteristic, a well-known dielectric material may be selected as appropriate for a high frequency and used as the dielectric constituting sintered dielectric 260.

Figure 5A:
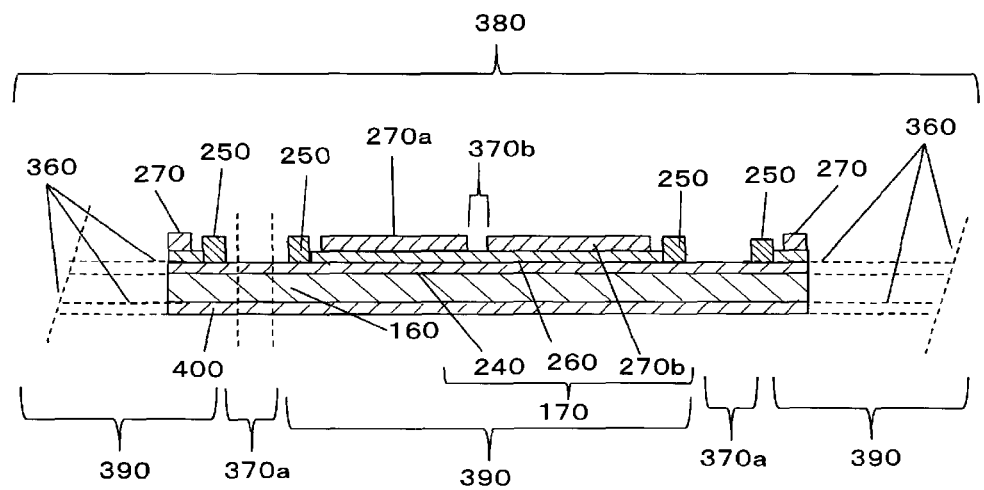
FIG. 5A is a sectional view for description of formation of a plurality of upper electrodes on a dielectric.
Figure 5B:
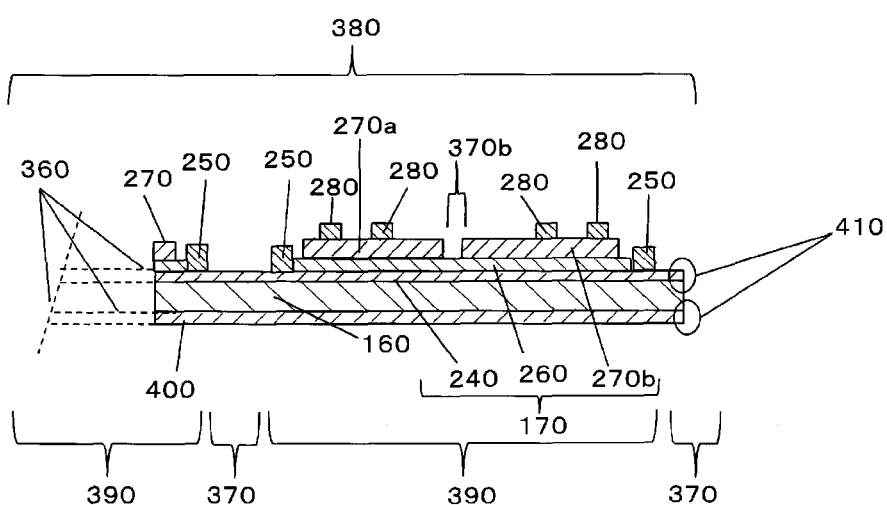
FIG. 5B is a sectional view for description of an exemplary sectional structure of an embedded capacitor unit finished upon formation of an auxiliary electrode on the upper electrode.

FIGS. 5A and 5B are a sectional view for description of formation of a plurality of upper electrodes on the dielectric, and a sectional view for description of an exemplary sectional structure of an embedded capacitor unit finished, respectively. As illustrated in FIG. 5A, it is advantageous that a plurality of upper electrodes 270 insulated from each other in a pattern shape are formed on one sintered dielectric 260. It is advantageous that a plurality of upper electrodes 270 independently insulated from each other in a pattern are formed on one sintered dielectric 260. This allows a predetermined voltage (for example, Vdd) to be supplied independently from a plurality of upper electrodes 270 to a plurality of positions on semiconductor chip 180 through a plurality of upper chip connector 290, thereby reducing jitters in semiconductor chip 180.

FIG. 5A illustrates formation of upper electrodes 270 as multiple unit 380. In order to form upper electrodes 270 on a surface of sintered dielectric 260, it is advantageous to use Ag electrode paste for sintering or AgPd electrode paste containing silver of 50 mass % to 100 mass % inclusive, which is commercially available and resistant to baking at 850° C. to 950° C. approximately. Reference sign 370a denotes a dividing part.

Dividing part 370b is formed between a plurality of upper electrodes 270 to insulate upper electrode 270a and upper electrode 270b adjacent to each other. In this manner, capacitor unit 170 including lower electrode 240, sintered dielectric 260, and upper electrode 270b is formed as a bypass capacitor independent from each other. Thereafter, upper auxiliary electrode 280 is formed as necessary on upper electrode 270 by using Ag electrode paste or AgPd electrode paste that is commercially available and resistant to baking at 850° C. to 950° C. approximately. The baking of lower electrode 240, sintered dielectric 260, upper electrode 270, and the like may be individually performed after each printing of the electrode paste and the dielectric paste, or may be collectively performed after formation of a stacked body obtained by printing and drying the electrode paste and the dielectric paste. Sintered dielectric 260, lower electrode 240, and the like may be each formed in two layers or more as necessary. These members may be collectively baked after each formed in two layers or more. The baking can be performed in a commercially available mesh belt furnace (with, for example, in/out of 30 minutes to 2 hours approximately and a highest temperature of 850° C. to 950° C.). To reliably remove a binding agent included in the paste, it is advantageous to perform baking by taking time for a temperature rising process using a batch furnace.

As illustrated in FIGS. 5A and 5B, it is advantageous to form, on one sintered dielectric 260, a plurality of upper electrodes 270a, upper electrodes 270b, and the like insulated from each other in an electrode dividing pattern. With the electrode dividing pattern, the electrodes can be formed as bypass capacitors corresponding to a plurality of respective power systems included in semiconductor chip 180. The plurality of bypass capacitors having the same temperature characteristic and dielectric constant are formed by providing, in this manner, a plurality of upper electrodes 270a and upper electrodes 270b insulated from each other on one sintered dielectric 260.

FIG. 5B illustrates cutting of part of multiple unit 380. Reference sign 410 in FIG. 5B denotes a fabricated connection part physically and electrically connecting heat-resistant metal plate 160 and lower electrode 240, or heat-resistant metal plate 160 and back electrode 400. Fabricated connection part 410 is positioned at a peripheral part of metal plate capacitor 210.

Upper auxiliary electrode 280 may be provided on upper electrode 270 as necessary. Thereafter, multiple unit 380 thus produced is divided or cut at dividing parts 370 to obtain single units 390. Then, evaluation of a predetermined characteristic (evaluation of capacity, or evaluation of an insulating property, leakage current, or the like) of each single unit 390 may be performed when single unit 390 is included in multiple unit 380 to maintain operability. Characteristic examination can be reliably performed when heat-resistant metal plate 160, and lower electrode 240 formed on the surface of heat-resistant metal plate 160, lower auxiliary electrode 250, and the like are used as ground electrodes at examination. Single unit 390 determined to be a non-defective product through the process of the examination (not illustrated) is formed into metal plate capacitor 210 illustrated in FIG. 7 to be described later through a cutting process described with reference to FIG. 6A and FIG. 6B.

Figure 6A:
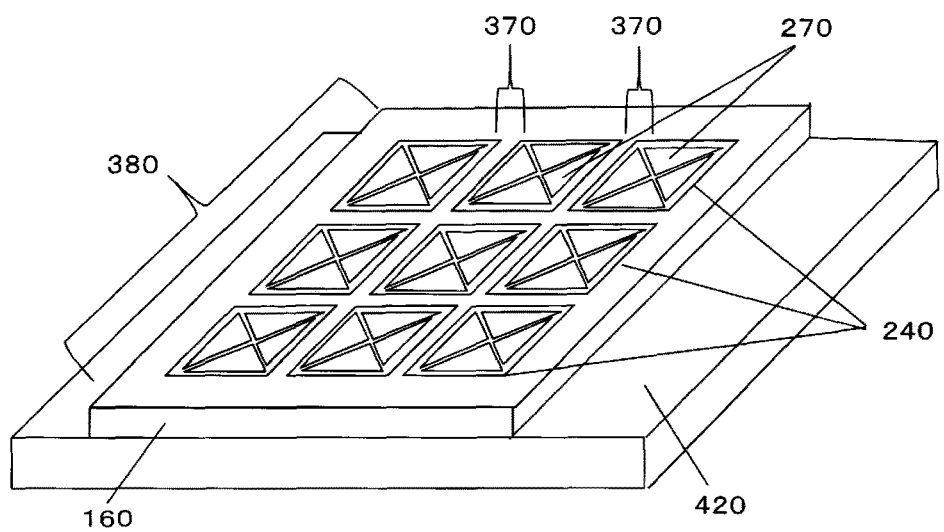
FIG. 6A is a perspective view for description of a multiple unit.
Figure 6B:
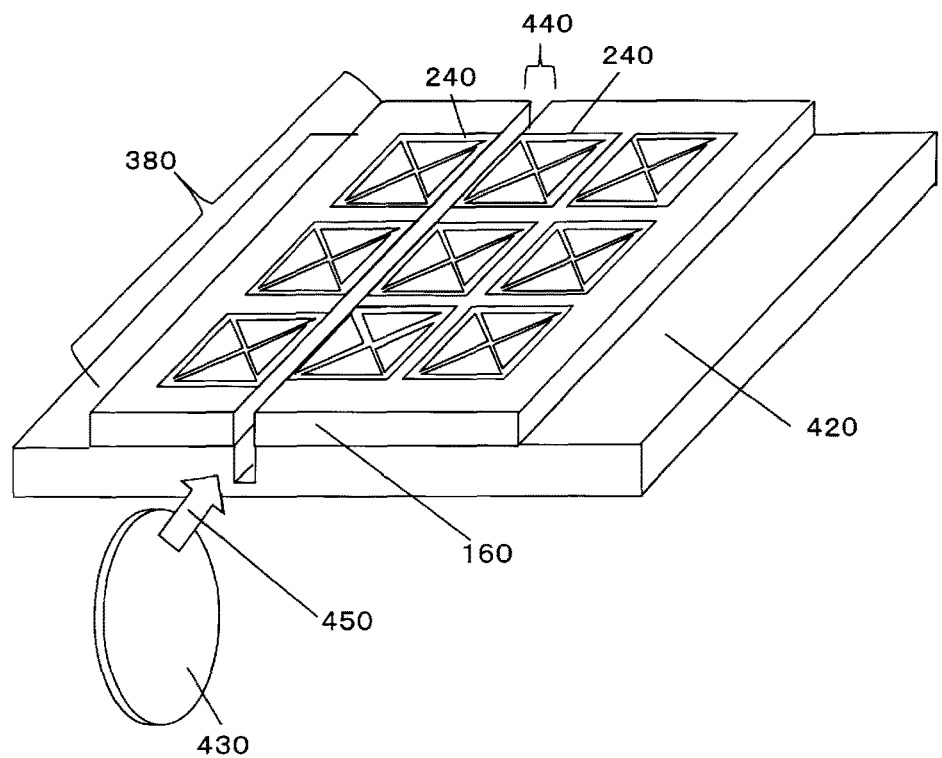
FIG. 6B is a perspective view for description of cutting and dividing of the multiple unit into a plurality of single units by dicing.

FIGS. 6A and 6B are each a perspective view for description of cutting and dividing of the multiple unit into a plurality of single units by dicing. As illustrated in FIG. 6A, multiple unit 380 is fixed on extendable dicing tape 420. Then, as illustrated in FIG. 6B, multiple unit 380 is cut by using dicing device 430 to form dividing groove 440. Thereafter, single units 390 adhesively fixed to dicing tape 420 are individually divided through a dicing tape extending process of expanding dicing tape 420. Metal plate capacitor 210 illustrated in FIG. 7 is obtained in this manner.

Figure 7:
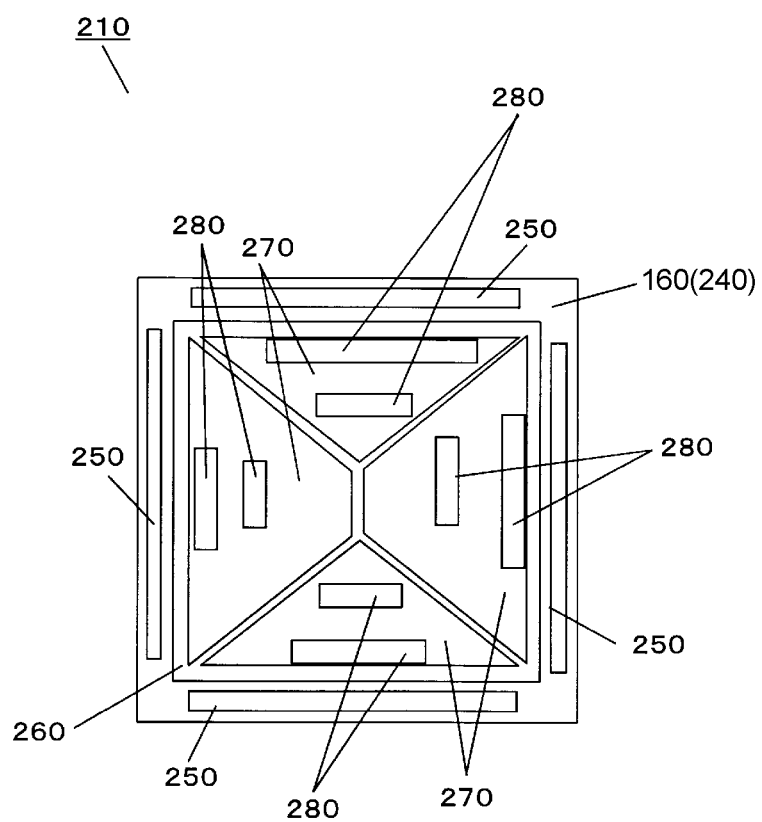
FIG. 7 is a top view illustrating an exemplary metal plate capacitor for which an electrical check or the like is completed.

FIG. 7 is a top view illustrating an exemplary metal plate capacitor on which, for example, an electrical check is completed. As illustrated in FIG. 7, metal plate capacitor 210 includes at least heat-resistant metal plate 160, and capacitor unit 170 including sintered dielectric 260 and upper electrode 270 that are formed on at least one surface of heat-resistant metal plate 160. Metal plate capacitor 210 can be manufactured by dividing and cutting multiple unit 380 illustrated in FIG. 6A into predetermined shapes by using, for example, the dicing device.

It is advantageous to provide as necessary upper auxiliary electrode 280 for wire bonding having a thickness of 5 µm or larger on part of upper electrode 270.

It is advantageous to provide lower electrode 240 between heat-resistant metal plate 160 and sintered dielectric 260. It is advantageous to provide lower electrode 240 between heat-resistant metal plate 160 and sintered dielectric 260, and further provide lower auxiliary electrode 250 having a thickness of 5 µm or larger, more preferably lower auxiliary electrode 250 having 10 µm or larger, on part of lower electrode 240, which is externally exposed from sintered dielectric 260. In this manner, lower auxiliary electrode 250 can be formed as an electrode for wire bonding having a thickness of 5 µm or larger.

A metal member used for heat-resistant metal plate 160 desirably contains aluminum (Al) of 0.5 mass % or more as an additive metal component in addition to a metal component such as iron (Fe) as a primary component. Use of heat-resistant metal plate 160 containing aluminum of 0.5 mass % or more can prevent oxidation and degradation of heat-resistant metal plate 160 at sintering of sintered dielectric 260. This is because, when the metal member is heated, the aluminum component contained in heat-resistant metal plate 160 diffuses across the surface of heat-resistant metal plate 160 and becomes a strong oxide film made of, for example, $Al_2O_3$ through oxidation, thereby preventing oxidation and degradation of the metal member itself. The oxide film made of, for example, $Al_2O_3$ formed on the surface of heat-resistant metal plate 160 serves as an adhesive component to lower electrode 240 and lower auxiliary electrode 250, thereby achieving an improved strength of adhesiveness of heat-resistant metal plate 160 with lower electrode 240 and lower auxiliary electrode 250. Heat-resistant metal plate 160 is special and expensive when the amount of aluminum contained in heat-resistant metal plate 160 is more than 20 mass %, and thus the contained amount of aluminum is desirably 20 mass % or less.

Sintered dielectric 260 is desirably a sintered dielectric material that contains no lead component, and preferably no glass component, and is obtained by sintering. Sintered dielectric 260 including no lead component is an environment-friendly material. When sintered dielectric 260 contains lead, in other words, when sintered dielectric 260 is formed of a dielectric material containing a lead component, at sintering, lead oxide (PbO) vaporizes and reaches heat-resistant metal plate 160, and reacts with heat-resistant metal plate 160. As a result, the iron (Fe) component of heat-resistant metal plate 160 is oxidized and corroded (rust is generated), and the strength of adhesiveness of heat-resistant metal plate 160 with lower electrode 240 and lower auxiliary electrode 250 is significantly reduced. When sintered dielectric 260 contains a glass component, the dielectric constant (ε or K) of sintered dielectric 260 is reduced, and the capacity of sintered dielectric 260 as a capacitor is reduced, affecting reliability in some cases. Sintered dielectric 260 of a dielectric material including no glass component and no lead component may be formed by baking a dielectric material (or dielectric paste) mainly made of, for example, BTO and additionally containing necessary inorganic additive agent at 850° C. to 950° C.

As illustrated in FIG. 7, metal plate capacitor 210 is formed by individually or collectively baking sintered dielectric 260, lower electrode 240, upper electrode 270, and any other component at 850° C. to 950° C. The outline or a projected shape from above of metal plate capacitor 210 is desirably a simple shape such as a rectangle or a square. When the outline of metal plate capacitor 210 is shaped in a rectangle or a square, deformation of capacitor unit 170 can be prevented during the process of thermal processing at 850° C. to 950° C. In this manner, like a typical lead frame, the outline of metal plate capacitor 210 has a simple shape such as a rectangle or a square including no fine pattern part. Such a simple outline shape prevents deformation and lack of the fine pattern part during the thermal processing. Capacitor unit 170 may be formed by collective baking after printing of a paste material and the like.

In addition, heat-resistant metal plate 160 functions as a constraining layer, and thus the dielectric can contract substantially in the Z direction, not in the X and Y directions, at sintering. As a result, the pattern shapes of sintered dielectric 260, upper electrode 270, and any other component do not change from printing until post-sintering, thereby maintaining a high dimensional accuracy.

The thickness of sintered dielectric 260 included in metal plate capacitor 210 is desirably between 3 μm and 50 μm inclusive, preferably between 5 μm and 30 μm inclusive, more preferably between 7 μm and 20 μm inclusive. When the thickness is smaller than 3 μm, the insulation reliability of sintered dielectric 260 has problem in some cases. When the thickness exceeds 50 μm, a capacity density decreases in some cases.

The thickness of heat-resistant metal plate 160 included in metal plate capacitor 210 is desirably between 50 μm and 300 μm inclusive, preferably between 100 μm and 200 μm inclusive, more preferably 150 μm or smaller. When the thickness is smaller than 50 μm, heat-resistant metal plate 160 has reduced stiffness, and accordingly, a mounting property when being handled, that is, after being separated, and shape stability at that time are reduced, so that sintered dielectric 260 becomes peeled off at baking, which results in problem with the insulating property in some cases. When the thickness of sintered dielectric 260 exceeds 300 μm, the thickness of semiconductor device 150 is affected.

It is advantageous that the dimension (or projected floor area) of metal plate capacitor 210 or single unit 390 is 1 mm×1 mm or larger and 30 mm×30 mm or smaller. When the dimension is smaller than 1 mm×1 mm, handling is difficult, and the shape of semiconductor chip 180 to be fixed on metal plate capacitor 210 is limited in some cases. When the dimension is larger than 30 mm×30 mm, planarity (or coplanarity) required at mounting of metal plate capacitor 210 is reduced in some cases.

Lower electrode 240 and heat-resistant metal plate 160 of metal plate capacitor 210 is desirably electrically connected with each other. When sintered dielectric 260 is formed on heat-resistant metal plate 160, an insulating metallic oxide layer is formed on the surface of heat-resistant metal plate 160 and potentially affects the electric connection between lower electrode 240 and heat-resistant metal plate 160. In this case, it is advantageous to have a configuration as illustrated in FIG. 8.

Figure 8:
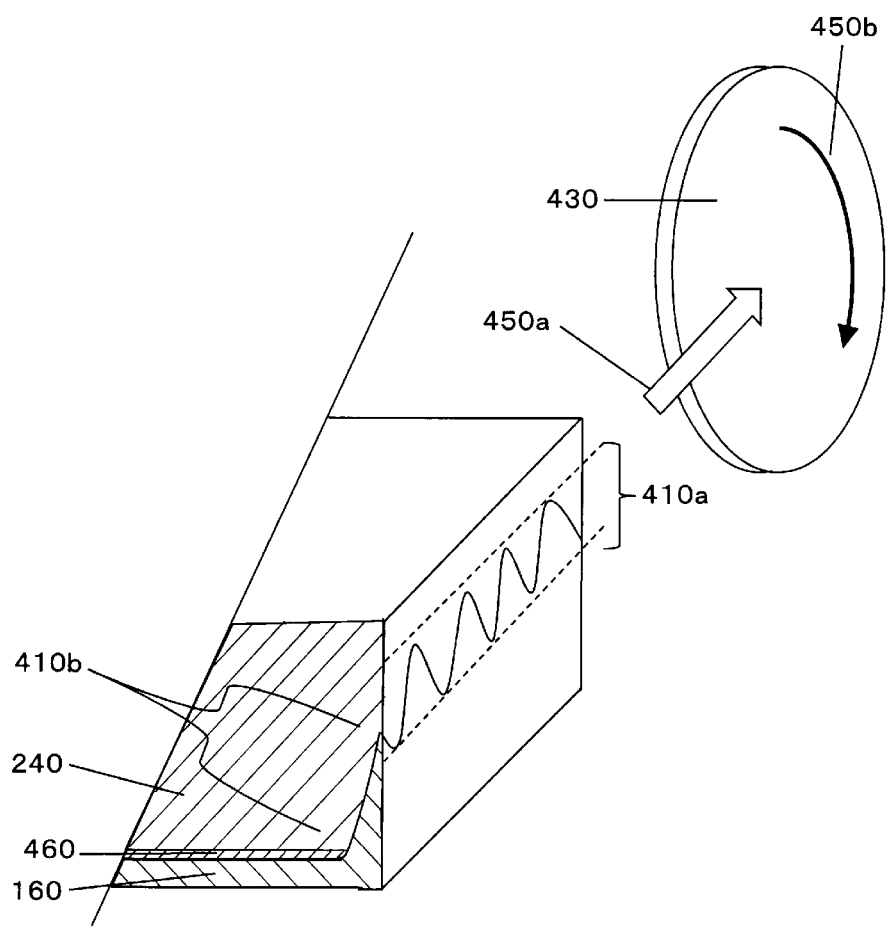
FIG. 8 is a perspective view for description of improvement of electric conduction between a heat-resistant metal plate and a lower electrode through an end part of the heat-resistant metal plate by fabricating a part where the heat-resistant metal plate and the lower electrode are stacked.

FIG. 8 is a perspective view for description of improvement of electric conduction between the heat-resistant metal plate and the lower electrode through an end part of the heat-resistant metal plate by fabricating a part where the heat-resistant metal plate and the lower electrode are stacked.

In FIG. 8, reference sign 460 denotes a metallic oxide layer. Heat-resistant metal plate 160 is desirably a stainless-steel plate containing aluminum of 0.5 mass % to 20 mass % inclusive to improve the thermal resistance. In this case, metallic oxide layer 460 desirably contains γ alumina as a primary component instead of α alumina. When the metallic oxide layer contains γ alumina of 60 mass % or more, the strength of adhesiveness between heat-resistant metal plate 160 and lower electrode 240 can be further improved. α alumina is corundum alumina γ alumina is spinel or cubic alumina.

As illustrated in FIG. 8, metallic oxide layer 460 is formed between heat-resistant metal plate 160 and lower electrode 240. The inventors have found that metallic oxide layer 460 is formed of α alumina, but metallic oxide layer 460 affects the electric connection between heat-resistant metal plate 160 and lower electrode 240 in some cases. In such a case, as illustrated in FIG. 8, heat-resistant metal plate 160 and lower electrode 240 are desirably connected with each other through fabricated connection part 410a and fabricated connection part 410b in a physically overlapping manner. In FIG. 8, fabricated connection part 410a indicates a physical connection part in an exposed part on a surface. Fabricated connection part 410a is a physical connection part between lower electrode 240 and heat-resistant metal plate 160, which is exposed on a side surface of metal plate capacitor 210. This physical connection part is observed as a wavy pattern and shape in some cases, like a hardening texture (also called a bare texture or simply a texture) of a Japanese sword, and a wood-grain pattern of Damascus steel, but the pattern and the shape are not particularly limited.

Fabricated connection part 410b indicates a physical connection structure in the internal structure of a fabricated part. Lower electrode 240 and heat-resistant metal plate 160 are connected with each other not only through fabricated connection part 410a exposed on an end face but also through fabricated connection part 410b as a physical connection part inside to largely improve physical connection stability. As illustrated in FIG. 8, fabricated connection part 410a and fabricated connection part 410b may exist physically and largely into lower electrode 240 and heat-resistant metal plate 160 across metallic oxide layer 460. Fabricated connection part 410 may physically exist inside as a rollover or a burr. When fabricated connection part 410 physically and largely exists into lower electrode 240 and heat-resistant metal plate 160 across metallic oxide layer 460, a physical connection interface between lower electrode 240 and heat-resistant metal plate 160 can have an increased area. As a result, lower electrode 240 and heat-resistant metal plate 160 are connected with each other in an electrically stable manner.

The physical connection of lower electrode 240 and heat-resistant metal plate 160 through breakdown of metallic oxide layer 460 may be achieved by using dicing device 430, by contacting a jig such as a rotating drill, by physical pressurization, or by spot irradiation with laser light. Alternatively, an electric method such as spot welding may be used. As described above, it is advantageous that the connection between heat-resistant metal plate 160 and lower electrode 240 is achieved physically, preferably electrically, by forming fabricated connection part 410a and fabricated connection part 410b for physically connecting heat-resistant metal plate 160 and lower electrode 240.

The position of formation of fabricated connection part 410 for physically connecting heat-resistant metal plate 160 and lower electrode 240 does not need to be limited to the peripheral part of metal plate capacitor 210. Fabricated connection part 410 may be formed at an optional part where metal plate capacitor 210 and lower electrode 240 overlap with each other. In an experiment performed by the inventors, an electric resistance between lower electrode 240 and heat-resistant metal plate 160 is 50 MΩ to 100 MΩ before fabricated connection part 410 was formed. However, the electric resistance between lower electrode 240 and heat-resistant metal plate 160 is desirably 20Ω or smaller when fabricated connection part 410 is formed at the peripheral part of metal plate capacitor 210 or an optional part inside a sheet capacitor. In the experiment performed by the inventors, the electric resistance is 10Ω or smaller, or 1Ω or smaller in some cases.

As described above, the electric connection between lower electrode 240 and heat-resistant metal plate 160 at fabricated connection part 410 is preferably a resistance of 20Ω or smaller, more preferably 10Ω or smaller. In addition, the position of fabricated connection part 410 does not need to be specified. In other words, when the electric conduction between lower electrode 240 and heat-resistant metal plate 160 has a resistance of 20Ω or smaller, more preferably 10Ω or smaller, it can be assumed that fabricated connection part 410a and fabricated connection part 410b are formed. The specification of the position of fabricated connection part 410 is not necessary, and a method for forming fabricated connection part 410 does not need to be limited.

Fabricated connection part 410 does not need to be limited to one place. Fabricated connection part 410 formed at the peripheral part, and fabricated connection part 410a and fabricated connection part 410b provided at an optional position of metal plate capacitor 210 through, for example, a manufacturing process may be both used.

Figure 9:
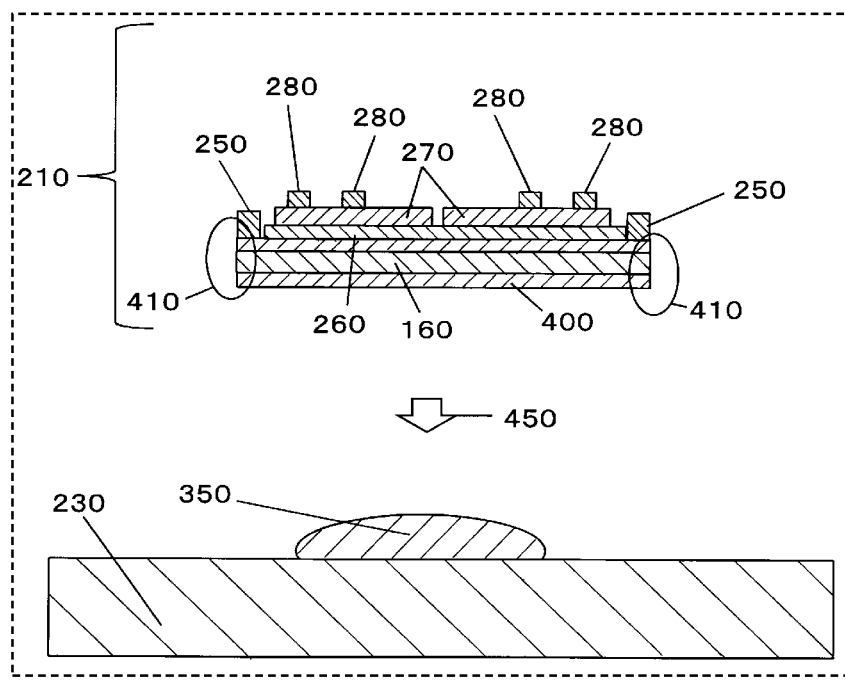
FIG. 9 is a sectional view illustrating fixation of the metal plate capacitor on a resin substrate unit through a bonding member.

FIG. 9 is a sectional view illustrating fixation of the metal plate capacitor on the resin substrate unit through the bonding member.

In FIG. 9, bonding member 350 may be, for example, commercially available conductive Ag paste (conductive) for die attachment, an insulating adhesive agent, or a commercially available insulating die attach film. When insulating bonding member 350 is used, insulation is achieved from, for example, resin substrate unit 230 and a conduction pattern formed on the surface of resin substrate unit 230. In FIG. 9, metal plate capacitor 210 is single unit 390 individually cut from multiple unit 380. As metal plate capacitor 210, single unit 390 determined to be a defective product by various characteristic examinations is removed and only single unit 390 determined to be a non-defective product is selectively used as non-defective metal plate capacitor 210 as illustrated in FIG. 9.

As illustrated in FIG. 9, bonding member 350 is applied to part of resin substrate unit 230, and metal plate capacitor 210 is mounted on bonding member 350 as illustrated with arrow 450. As necessary, bonding member 350 may be applied to a plurality of places on resin substrate unit 230.

Arrow 450 in FIG. 9 illustrates mounting of metal plate capacitor 210 onto resin substrate unit 230. As illustrated with arrow 450 in FIG. 9, metal plate capacitor 210 determined to be non-defective by, for example, an examination is mounted on resin substrate unit 230 to which bonding member 350 is applied. Thereafter, semiconductor chip 180 is mounted as illustrated in FIG. 10.

Figure 10:
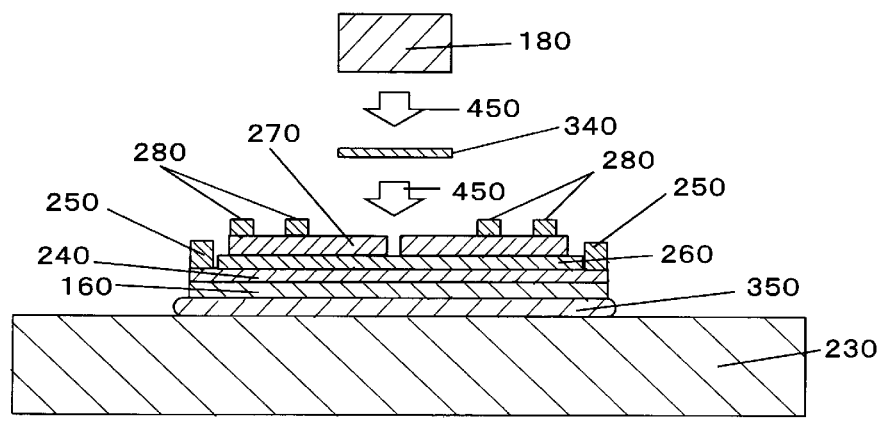
FIG. 10 is a sectional view for description of fixation of a semiconductor chip on the metal plate capacitor.

FIG. 10 is a sectional view for description of fixation of the semiconductor chip on the metal plate capacitor. As illustrated in FIG. 10, metal plate capacitor 210 is fixed onto resin substrate unit 230 through bonding member 350. When an insulating die attach film is used as die attachment 340, the insulating property between semiconductor chip 180 and upper electrode 270 can be maintained. When semiconductor chip 180 and a plurality of upper electrodes 270 overlap with each other, conduction between a plurality of upper electrodes 270 can be encumbered by using an insulating member as die attachment 340 that fixes semiconductor chip 180 to upper electrodes 270, and variation in Vdd supplied from a plurality of upper electrodes 270 to semiconductor chip 180 can be reduced.

Arrow 450 in FIG. 10 illustrates fixation of semiconductor chip 180 onto metal plate capacitor 210 through die attachment 340 made of an adhesive agent or a bonding sheet.

Die attachment 340 may be attached when semiconductor chip 180 is in a wafer state. Simultaneously with semiconductor chip 180, die attachment 340 can be separated through individual dicing as semiconductor chip 180 being integrated with die attachment 340. In this manner, die attachment 340 may be mounted on capacitor unit 170 as illustrated in FIG. 10 while being previously attached to semiconductor chip 180. Die attachment 340 may be a commercially available product having a thickness of 10 μm to 100 μm approximately.

It is advantageous to perform again various electrical examinations of, for example, capacity, dielectric characteristic, and insulating property when a die bonding process is completed right before wire bonding is performed.

Figure 11:
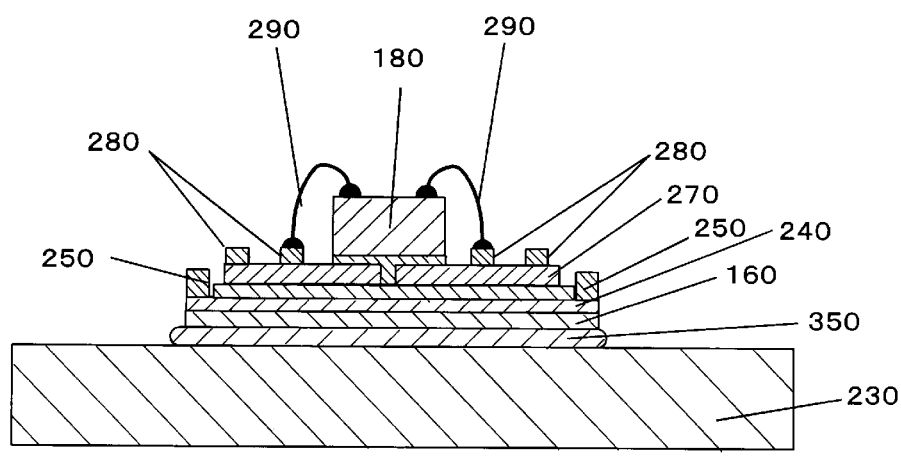
FIG. 11 is a sectional view for description of electrical connection between the semiconductor chip and the metal plate capacitor through a connector including, for example, a wire.

The following describes a wire bonding process with reference to FIG. 11.

Figure 12:
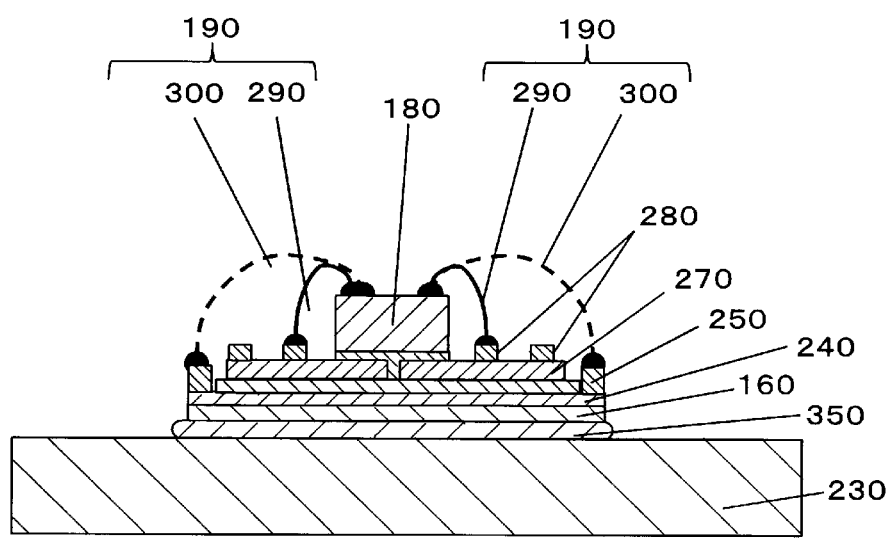
FIG. 12 is a sectional view for description of electrical connection between the semiconductor chip and the metal plate capacitor through a connector including, for example, a wire.
Figure 13:
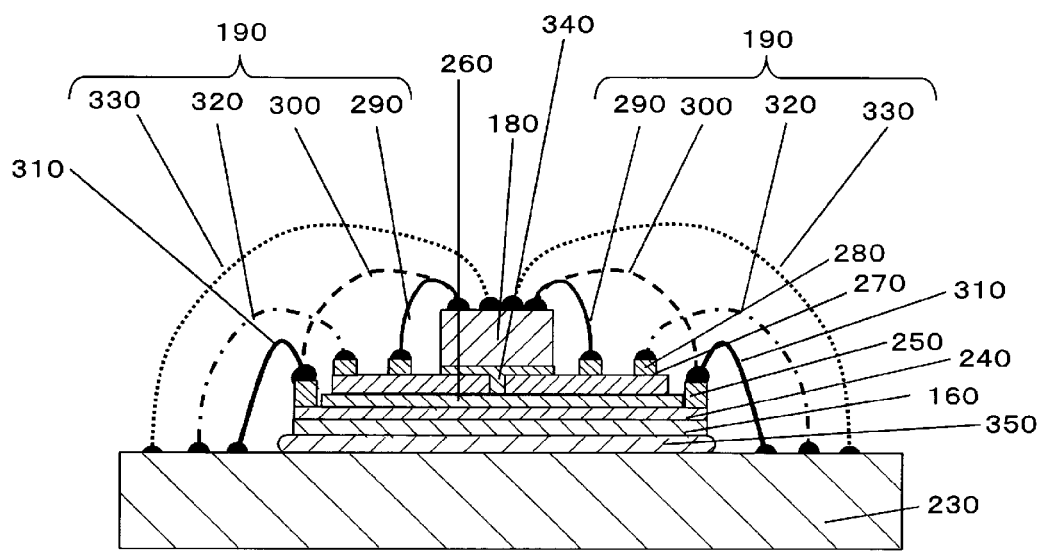
FIG. 13 is a sectional view for description of electrical connection between the semiconductor chip, the metal plate capacitor, and the resin substrate unit through a connector including, for example, a wire.

FIG. 11 to FIG. 13 are each a sectional view illustrating wire bonding.

FIG. 11 is a sectional view for description of the electrical connection between the semiconductor chip and the metal plate capacitor through a connector including, for example, a wire.

As illustrated in FIG. 11, semiconductor chip 180 and upper auxiliary electrode 280 are electrically connected with each other through upper chip connector 290 including, for example, a wire. As illustrated in FIG. 11, when a plurality of upper auxiliary electrodes 280 are provided on upper electrode 270, upper chip connector 290 may be formed on any upper auxiliary electrode 280 closer to semiconductor chip 180. The use of upper auxiliary electrode 280 can reduce influence on sintered dielectric 260 at wire bonding. Upper chip connector 290 may be set to Vdd of semiconductor chip 180.

As illustrated in FIG. 11, when connector 190 including, for example, a wire is bonded not on upper electrode 270 but on upper auxiliary electrode 280 provided on upper electrode 270, influence provided on sintered dielectric 260 by heat, ultrasonic, pressure, and the like necessary for bonding can be reduced. When upper auxiliary electrode 280 is provided on upper electrode 270, the thickness of upper auxiliary electrode 280 is preferably 5 μm or larger, more preferably 10 μm or larger. 5 μm may be written as 5 μm, and 10 μm may be written as 10 μm. When the thickness of upper electrode 270 is smaller than 5 μm, or further smaller than 2 μm, for example, a micro crack is generated in sintered dielectric 260 depending on a bonding condition, resulting in an insufficient pull strength of a bonding wire in some cases.

FIG. 12 is a sectional view for description of the electrical connection between the semiconductor chip and the metal plate capacitor through a connector including, for example, a wire.

As illustrated in FIG. 12, semiconductor chip 180 and lower auxiliary electrode 250 are electrically connected with each other through lower chip connector 300 including, for example, a wire. Lower chip connector 300 may be set to Vss of semiconductor chip 180.

In FIG. 12, connector 190 or the like may be bonded directly on lower electrode 240, but lower auxiliary electrode 250 having a thickness of 5 µm or larger may be provided on lower electrode 240, and connector 190 or the like may be bonded on lower auxiliary electrode 250. When connector 190 or the like is bonded not on lower electrode 240 but directly on lower auxiliary electrode 250, the height of bonding can be increased, thereby achieving an improved bonding stability. When lower auxiliary electrode 250 is provided on lower electrode 240, the thickness of upper auxiliary electrode 280 is preferably 5 µm or larger, more preferably 10 µm or larger. In addition, the thickness is preferably 20 µm or larger depending on the thickness of the dielectric and the thickness of the electrode. When the thickness of lower electrode 240 is 5 µm or smaller, or further smaller than 2 µm, no effect of the auxiliary electrode by bonding is obtained in some cases.

In FIG. 12, lower electrode 240 is provided between heat-resistant metal plate 160 and sintered dielectric 260, but lower electrode 240 may be omitted. When lower electrode 240 is omitted, capacitor unit 170 includes heat-resistant metal plate 160, sintered dielectric 260, and upper electrode 270. When lower electrode 240 is omitted, lower auxiliary electrode 250 may be formed directly on heat-resistant metal plate 160 (not illustrated). Lower auxiliary electrode 250 may be formed directly on heat-resistant metal plate 160, and wire bonding may be provided on lower auxiliary electrode 250. When bonding is performed not on the surface of heat-resistant metal plate 160 thermally processed to have an oxide film formed on the surface, but on lower auxiliary electrode 250 directly formed on heat-resistant metal plate 160, the bonding stability can be improved.

FIG. 13 is a sectional view for description of the electrical connection between the semiconductor chip, the metal plate capacitor, and the resin substrate unit through a connector including, for example, a wire.

As illustrated in FIG. 13, lower auxiliary electrode 250 and the land electrode (not illustrated in FIG. 13 but illustrated as land electrode 480 in FIG. 14 to be described later) formed on the surface of resin substrate unit 230 are electrically connected with each other through lower land connector 310. Lower land connector 310 may be set to Vss. Upper auxiliary electrode 280 and the land electrode (not illustrated) formed on resin substrate unit 230 are electrically connected with each other through upper land connector 320. Semiconductor chip 180 and the land electrode formed on resin substrate unit 230 are electrically connected with each other through chip land connector 330. Chip land connector 330 may be a signal line.

As illustrated in FIG. 13, a wire bonding land electrode (not illustrated) of semiconductor chip 180, upper electrode 270, upper auxiliary electrode 280, and the land electrode (not illustrated) of resin substrate unit 230 are connected with each other through upper chip connector 290, lower chip connector 300, lower land connector 310, upper land connector 320, chip land connector 330, and the like. In this manner, the electrical connection through a plurality of connectors 190 achieves reduction of power-supply voltage fluctuation along with electric charge supply excellent in transient response, thereby largely reducing the amount of signal jitters. This is because, when a plurality of connectors 190 are provided, power-supply voltage fluctuation along with electric charge supply excellent in transient response can be reduced, thereby largely reducing jitters.

It is advantageous to perform a molding process after electric connection process including the wire bonding.

In the molding process, a sample illustrated in FIG. 13 becomes semiconductor device 150 illustrated in FIG. 2 through the molding process using a mold, in which a commercially available molding resin is used as protector 200, and the like.

When protector 200 made of, for example, molding resin is formed, the reliability of semiconductor chip 180, connector 190 including, for example, a wire, metal plate capacitor 210, and the like can be improved. In addition, the handling and reliability of semiconductor device 150 can be improved through protection by protector 200 made of, for example, molding resin. In the molding process, no electric short circuit needs to occur between wires due to misplacement of a bonding wire. Protector 200 made of, for example, molding resin serves as an exterior of semiconductor chip 180 and metal plate capacitor 210.

Figure 14:
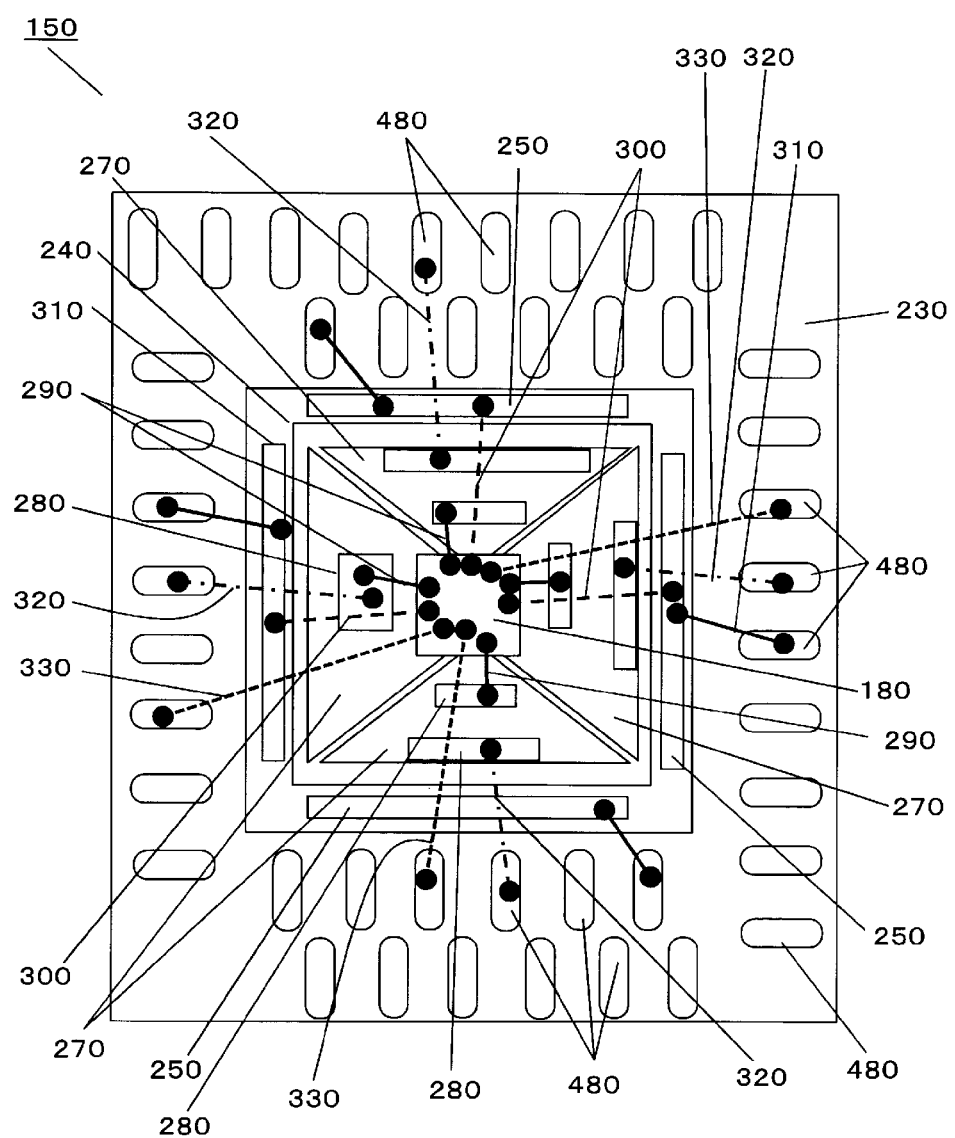
FIG. 14 is a plan view for description of wire connection after completion of bonding that electrically connects the resin substrate, the metal plate capacitor, the semiconductor chip, and the like on the resin substrate unit.

The following describes a device in the wire bonding with reference to FIG. 14.

FIG. 14 is a top view illustrating exemplary wire connection after completion of bonding that electrically connects a resin substrate, the metal plate capacitor, the semiconductor chip, and the like on the resin substrate unit, and illustrating an exemplary internal structure of semiconductor device 150.

In FIG. 14, reference sign 480 denotes the land electrode. Land electrode 480 is provided on resin substrate unit 230 for wire bonding connection. In FIG. 14, land electrode 480 is shaped in an ellipse or an elongated circle, which is a typical example, but does not need to be limited to this pattern shape. As necessary, land electrodes 480 may be arrayed in a shape radially spreading from a center.

As illustrated in FIG. 14, semiconductor chip 180 is electrically connected with upper electrode 270 or upper auxiliary electrode 280 through upper chip connector 290. Semiconductor chip 180 is electrically connected with lower electrode 240 or lower auxiliary electrode 250 through lower chip connector 300. Lower electrode 240 or lower auxiliary electrode 250 is electrically connected with land electrode 480 through lower land connector 310. Upper electrode 270 or upper auxiliary electrode 280 is electrically connected with land electrode 480 through upper land connector 320. Semiconductor chip 180 is electrically connected with land electrode 480 through chip land connector 330.

As illustrated in FIG. 14, it is advantageous to form one or a plurality of upper auxiliary electrodes 280 for one upper electrode 270.

When a plurality of upper auxiliary electrodes 280 are provided on the surface of one upper electrode 270, it is advantageous that upper auxiliary electrode 280 closer to semiconductor chip 180 is connected with upper chip connector 290, and upper auxiliary electrode 280 farther away from semiconductor chip 180 is connected with upper land connector 320.

When one upper auxiliary electrode 280 is provided on the surface of one upper electrode 270, an increased area of upper auxiliary electrode 280 allows a plurality of connectors such as upper chip connector 290, upper land connector 320, and the like to be provided on one upper auxiliary electrode 280.

As illustrated in FIG. 14, it is advantageous to form a plurality of upper electrodes 270 and upper auxiliary electrodes 280 serving as part of metal plate capacitor 210, or a plurality of upper electrodes 270 and upper auxiliary electrodes 280 insulated from each other in a pattern. In this manner, when a plurality of upper auxiliary electrodes 280 insulated from each other in a pattern are formed, one capacitor unit 170 can provide a plurality of bypass capacitors formed independently from each other. This allows optimized designing to achieve reduction of jitters in semiconductor chip 180.

In semiconductor device 150 according to the present disclosure, the pattern shape, area, number, and the like of upper electrodes 270 can be freely designed. Thus, in the present disclosure, the pattern shape of upper electrodes 270 can be optimally designed to achieve a power dividing pattern that allows maximum performance of the characteristics of semiconductor device 150. In semiconductor device 150 according to the present disclosure, such patterning can be provided that a larger area is allocated to a power system that requires a largest capacity among a plurality of power systems required for semiconductor chip 180. Thus, a bypass capacitor necessary for each power system of semiconductor chip 180 even having a large characteristic variation can be formed to achieve reliable operation of semiconductor chip 180. When semiconductor chip 180 is incorporated in semiconductor device 150 according to the present disclosure, improvement can be made on EMC characteristics such as stabilization of power-supply voltage, reduction of jitters, and improvement of resistance to external noise.

At a connection part between semiconductor chip 180 and connector 190, a ball may be formed at a wire leading end by melting wire metal through, for example, discharging, and wire bonding may be performed at this ball part. Alternatively, wire mounting may be performed by a bonding method (for example, wedge bonding) that does not form such a ball. In this manner, capacitor unit 170 can be connected as a bypass capacitor at any optional position of semiconductor chip 180.

In FIG. 14, semiconductor chip 180 is fixed over a plurality of upper electrodes 270 through die attachment 340, but die attachment 340 is not illustrated. When die attachment 340 is an insulating bond member, a plurality of upper electrodes 270 can be insulated from each other in spite of the fixation of semiconductor chip 180 over a plurality of upper electrodes 270.

As illustrated in FIG. 14, metal plate capacitor 210 includes at least heat-resistant metal plate 160, lower electrode 240, sintered dielectric 260, and upper electrode 270 that are formed on at least one surface of heat-resistant metal plate 160. Semiconductor device 150 includes semiconductor chip 180 disposed on metal plate capacitor 210, and resin substrate unit 230 on which heat-resistant metal plate 160 and semiconductor chip 180 are disposed. Semiconductor device 150 further includes upper chip connector 290 which electrically connects semiconductor chip 180 and upper electrode 270, and lower chip connector 300 which electrically connects semiconductor chip 180 and lower electrode 240. Semiconductor device 150 further includes protector 200 which protects semiconductor chip 180, metal plate capacitor 210, upper chip connector 290, lower chip connector 300, and the surface of resin substrate unit 230.

Figure 15A:
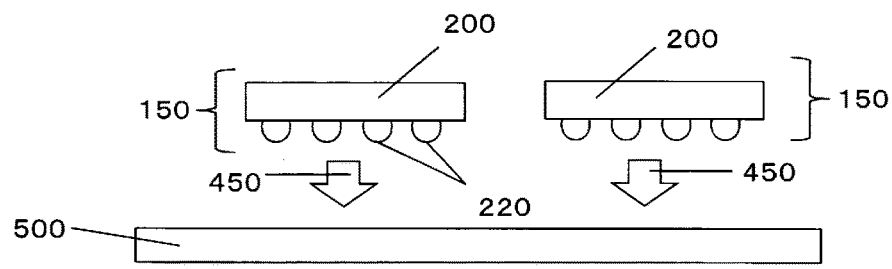
FIG. 15A is a side view for description of a semiconductor package including the semiconductor device according to the present disclosure.
Figure 15B:
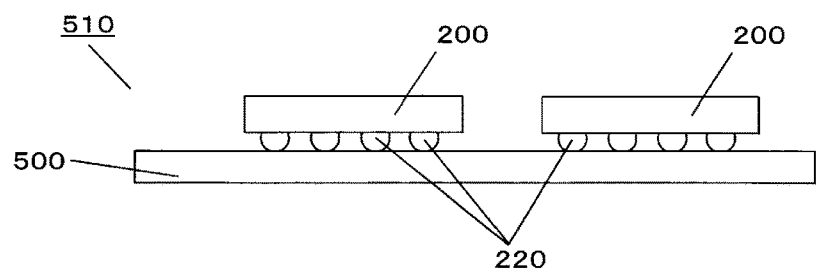
FIG. 15B is a side view for description of the semiconductor package including the semiconductor device according to the present disclosure.
Figure 15C:
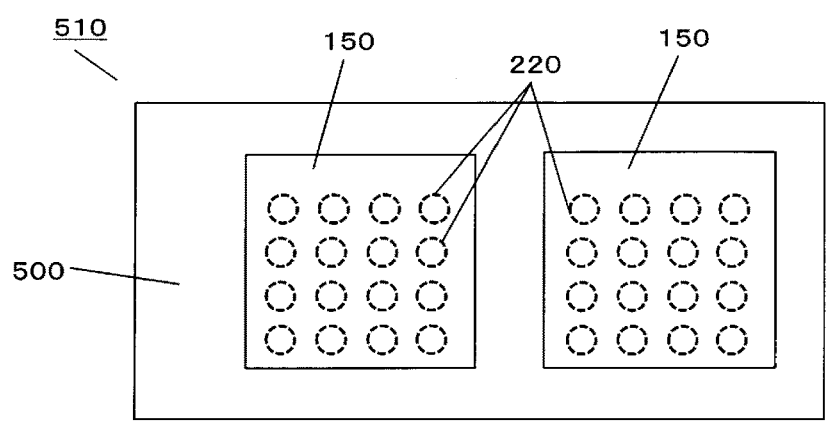
FIG. 15C is a top view for description of the semiconductor package including the semiconductor device according to the present disclosure.

FIGS. 15A to 15C are each a side view or a top view for description of a semiconductor package including the semiconductor device according to the present disclosure.

In FIGS. 15A to 15C, reference sign 500 denotes a wiring substrate, reference sign 510 denotes a semiconductor package. Wiring substrate 500 may be a commercially available multi-layered glass epoxy resin substrate. Semiconductor device 150 illustrated in FIGS. 15A to 15C is semiconductor device 150 according to the present disclosure described with reference to FIG. 2 and the like described above. In FIGS. 15A to 15C, metal plate capacitor 210 and the like included in semiconductor device 150 are not illustrated.

Arrow 450 in FIG. 15A illustrates mounting of semiconductor device 150 according to the present disclosure onto wiring substrate 500. Bump 220 formed on the surface of semiconductor device 150 closer to wiring substrate 500 is illustrated, but solder and the like on wiring substrate 500 are not illustrated.

FIG. 15B is a side view of package 510 including semiconductor device 150 and wiring substrate 500. In FIG. 15B, any other semiconductor, any other chip component, and any other component are not illustrated.

FIG. 15C is a top view of package 510 including semiconductor device 150 and wiring substrate 500. In FIG. 15C, any other semiconductor, any other chip component, and any other component are not illustrated.

As illustrated in FIGS. 15B and 15C, package 510 according to the present disclosure includes at least wiring substrate 500 and semiconductor device 150 mounted on wiring substrate 500.

As described above, the use of semiconductor device 150 according to the present disclosure and package 510 including semiconductor device 150 can achieve higher resolutions of various in-vehicle displays optimized for in-vehicle usage and having excellent high speed transmission quality, a portable terminal, and a high-quality display. This is because metal plate capacitor 210 included in semiconductor device 150 according to the present disclosure can achieve electric charge supply excellent in transient response, so that power quality at high speed operation is improved to achieve large reduction of jitters in a signal circuit of the semiconductor chip.

The following describes exemplary minimization of the length of wiring in the semiconductor device including the metal plate capacitor with reference to FIGS. 16A to 17B.

Figure 16A:
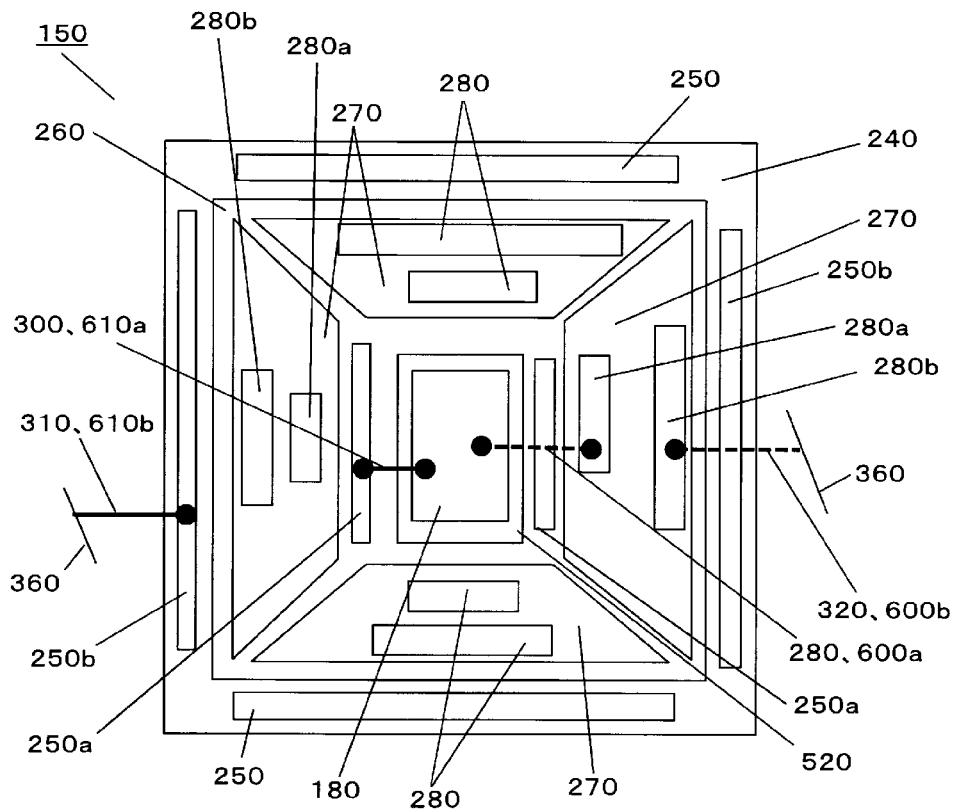
FIG. 16A is a top view for description of exemplary minimization of the length of wiring in the semiconductor device including the metal plate capacitor.
Figure 16B:
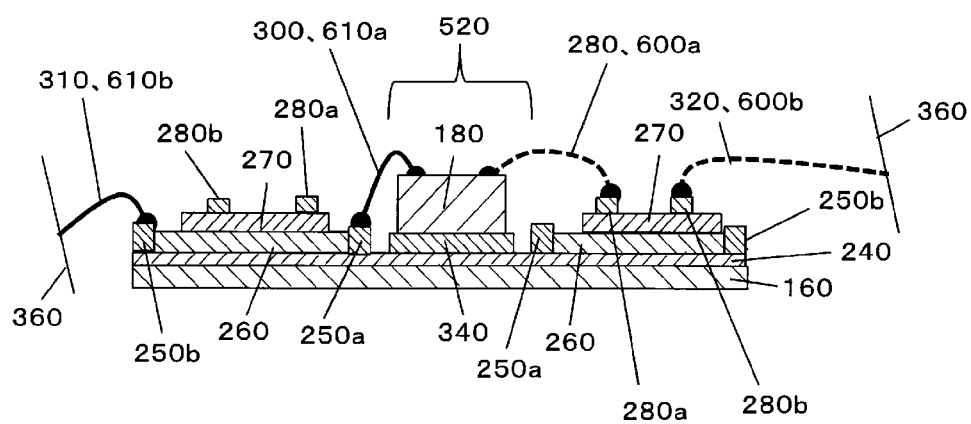
FIG. 16B is a sectional view for description of the exemplary minimization of the length of wiring in the semiconductor device including the metal plate capacitor.

FIGS. 16A and 16B are a top view and a sectional view for description of exemplary minimization of the length of wiring in the semiconductor device including the metal plate capacitor, illustrating an exemplary internal structure of semiconductor device 150. In FIGS. 16A and 16B, protector 200, sintered dielectric 260, die attachment 340, and the like are not illustrated.

As illustrated in FIGS. 16A and 16B, opening 520 having a size that semiconductor chip 180 can be inserted into opening 520 is formed at a central part of metal plate capacitor 210. Opening 520 is a part at which upper electrode 270 and sintered dielectric 260 are not formed, and lower electrode 240 is exposed at a bottom part of opening 520. Upper electrode 270 and sintered dielectric 260 are formed around the opening. Semiconductor chip 180 is fixed, through die attachment 340, onto lower electrode 240 exposed at the bottom part of opening 520.

As illustrated in FIGS. 16A and 16B, lower auxiliary electrode 250a is formed near opening 520 to which semiconductor chip 180 is fixed.

As illustrated in FIGS. 16A and 16B, lower auxiliary electrode 250a is provided closer to semiconductor chip 180, and lower auxiliary electrode 250b is provided farther away from semiconductor chip 180. Semiconductor chip 180 and lower auxiliary electrode 250a are connected with each other through lower chip connector 300. Lower chip connector 300 may be Vss line 610a. Lower auxiliary electrode 250b and the land electrode (not illustrated) are connected with each other through lower land connector 310.

In metal plate capacitor 210 illustrated in FIGS. 16A and 16B, upper electrode 270 and sintered dielectric 260 are not formed on a part where semiconductor chip 180 is mounted. With such a configuration of metal plate capacitor 210, lower electrode 240 can be exposed near semiconductor chip 180, and lower auxiliary electrode 250a can be formed on an exposed surface of lower electrode 240.

In semiconductor device 150 illustrated in FIGS. 16A and 16B, upper chip connector 290 which electrically connects semiconductor chip 180 and upper auxiliary electrode 280a may be Vdd line 600a. Upper land connector 320 which electrically connects upper auxiliary electrode 280b and land electrode 480 (not illustrated) of resin substrate unit 230 (not illustrated) is achieved by Vdd line 600. Upper auxiliary electrode 280b and upper auxiliary electrode 280a are electrically connected with each other through upper electrode 270. In this manner, upper auxiliary electrode 280a is provided closer to semiconductor chip 180, and upper auxiliary electrode 280b is provided closer to land electrode 480 of resin substrate unit 230, thereby achieving reduced wiring resistance and hence an excellent jitter reducing effect.

In FIGS. 16A and 16B, semiconductor chip 180 may be disposed on sintered dielectric 260 exposed at opening 520 when no upper electrode is formed but sintered dielectric 260 is formed at opening 520.

Figure 17A:
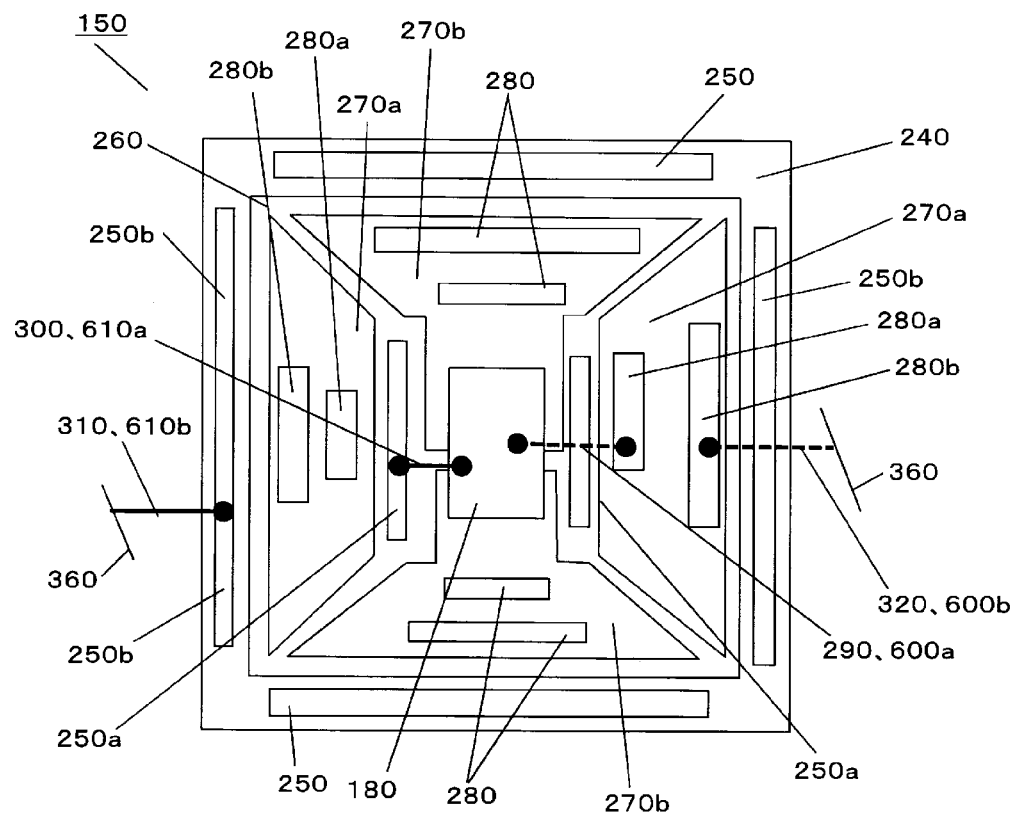
FIG. 17A is a top view for description of exemplary minimization of the length of wiring in the semiconductor device including the metal plate capacitor.
Figure 17B:
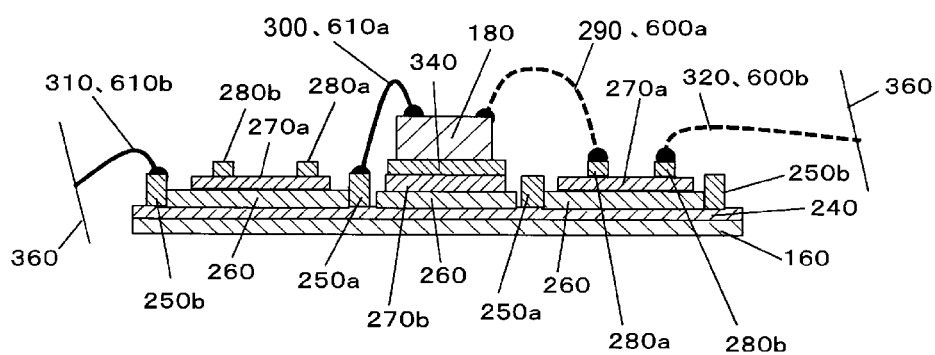
FIG. 17B is a sectional view for description of the exemplary minimization of the length of wiring in the semiconductor device including the metal plate capacitor.

The following describes exemplary minimization of the length of wiring in the semiconductor device including the metal plate capacitor with reference to FIG. 17A and FIG. 17B.

FIGS. 17A and 17B are a top view and a sectional view for description of exemplary minimization of the length of wiring in the semiconductor device including the metal plate capacitor, illustrating an exemplary internal structure of semiconductor device 150. In FIGS. 17A and 17B, protector 200, sintered dielectric 260, die attachment 340, and the like are not illustrated.

As illustrated in FIGS. 17A and 17B, semiconductor chip 180 is fixed on upper electrode 270b through insulating die attachment 340 (not illustrated).

As illustrated in FIGS. 17A and 17B, lower auxiliary electrode 250a is provided closer to semiconductor chip 180, and lower auxiliary electrode 250b is provided farther away from semiconductor chip 180 (or closer to the land electrode). Semiconductor chip 180 and lower auxiliary electrode 250a are connected with each other through lower chip connector 300. Lower chip connector 300 may be Vss line 610a. Lower auxiliary electrode 250b and the land electrode (not illustrated) are connected with each other through lower land connector 310. Lower land connector 310 may be Vss line 610b.

Upper auxiliary electrode 280a is provided closer to semiconductor chip 180, and upper auxiliary electrode 280b is provided farther away from semiconductor chip 180 (or closer to the land electrode). Semiconductor chip 180 and upper auxiliary electrode 280a are connected with each other through upper chip connector 290. Upper chip connector 290 may be Vdd line 600a. Upper auxiliary electrode 280b and the land electrode (not illustrated) are connected with each other through upper land connector 320. Upper land connector 320 may be Vdd line 600b.

The structure illustrated in FIGS. 17A and 17B can achieve reduced wiring resistance and hence an excellent jitter reducing effect.

Comparison will be made between semiconductor device 150 described with reference to, for example, FIGS. 2 to 17B, and Comparative Example 1 as a comparative example of semiconductor device 150 with reference to FIGS. 18A to 20B. In semiconductor device 150 described with reference to, for example, FIGS. 2 to 17B, capacitor unit 170 including sintered dielectric 260 is provided on the surface of heat-resistant metal plate 160. In Comparative Example 1 described with reference to FIGS. 18A to 20B, resin substrate unit 230 is used in place of heat-resistant metal plate 160, and capacitor unit 170 including sintered dielectric 260 is provided on the surface of resin substrate unit 230.

The following describes Comparative Example 1 with reference to FIGS. 18A to 20B.

Figure 18A:
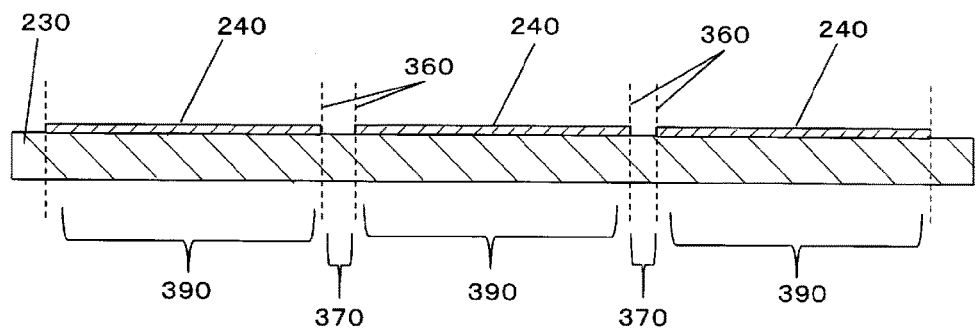
FIG. 18A is a sectional view illustrating formation of a lower electrode on a resin substrate according to Comparative Example 1.
Figure 18B:
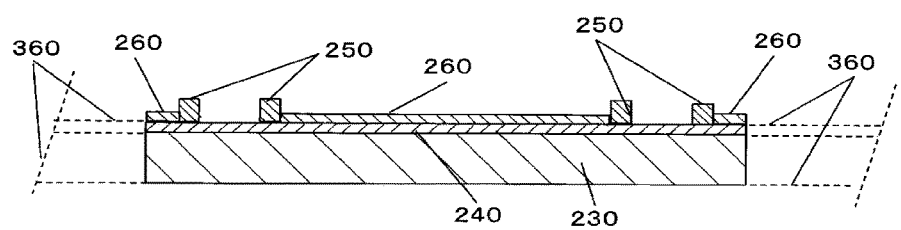
FIG. 18B is a sectional view illustrating formation of a lower auxiliary electrode and a sintered dielectric on the lower electrode according to Comparative Example 1.
Figure 18C:
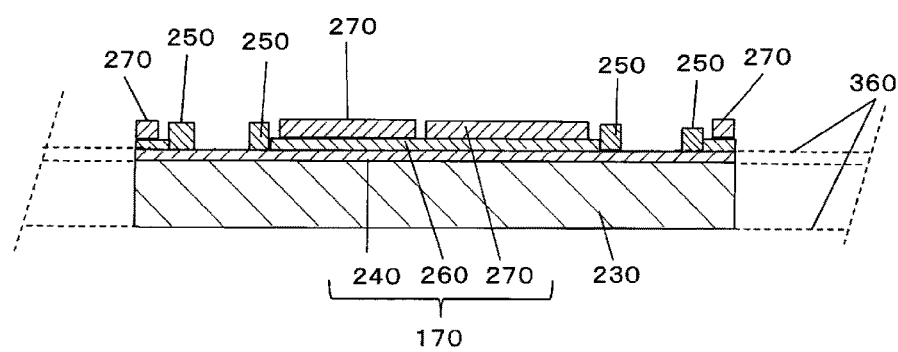
FIG. 18C is a sectional view illustrating formation of the lower electrode, the sintered dielectric, an upper electrode, and the like on the resin substrate according to Comparative Example 1.

FIGS. 18A to 18C are each a sectional view illustrating formation of the lower electrode, the sintered dielectric, the upper electrode, and the like on a resin substrate according to Comparative Example 1.

FIG. 18A is a sectional view illustrating printing of a member for forming lower electrode 240 on resin substrate unit 230.

FIG. 18B is a sectional view illustrating printing of a member forming lower auxiliary electrode 250 on lower electrode 240.

FIG. 18C is a sectional view illustrating printing of a member for forming sintered dielectric 260 on lower electrode 240.

Figure 19A:
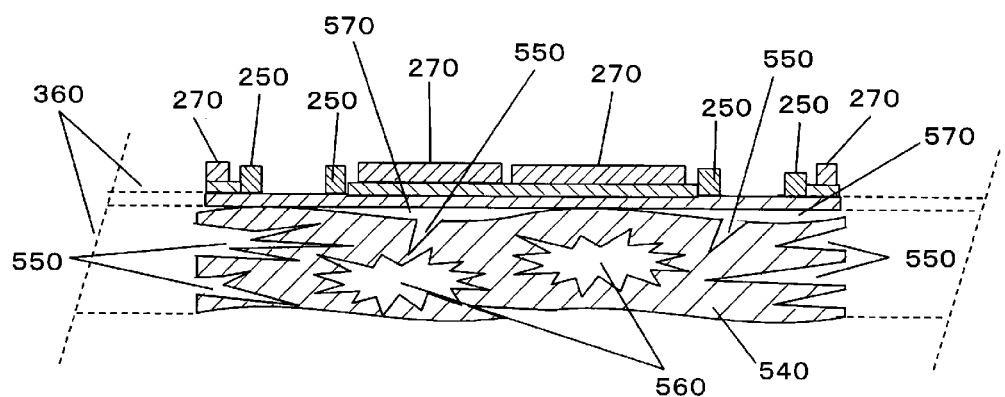
FIG. 19A is a sectional view for description of a problem occurring in high-temperature baking of a member for forming the lower electrode and the sintered dielectric formed by, for example, printing on the resin substrate unit according to Comparative Example 1.
Figure 19B:
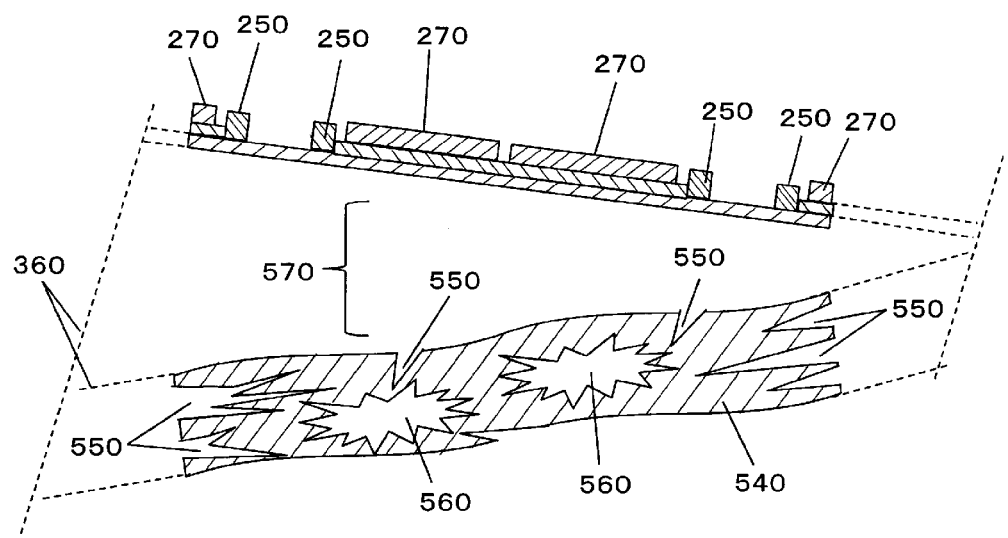
FIG. 19B is a sectional view for description of the problem occurring in high-temperature baking of the member for forming the lower electrode and the sintered dielectric formed by, for example, printing on the resin substrate unit according to Comparative Example 1.

FIGS. 19A and 19B are each a sectional view for description of a problem occurring in high-temperature baking of the members forming the lower electrode and the sintered dielectric, which are formed by, for example, printing on the resin substrate unit according to Comparative Example 1.

As illustrated in FIG. 19A, when the lower electrode, the sintered dielectric, and the like printed on resin substrate unit 230 are baked at 600° C. or higher, resin substrate unit 230 is deformed by heat, and thermally processed resin substrate unit 540 is obtained. This is because epoxy resin and the like forming resin substrate unit 230 are decomposed during baking. Lacked portion 550 as a lack of part of resin substrate unit 230 is formed on a surface of thermally processed resin substrate unit 540. In addition, void 560 obtained by thermal decomposition of part of resin substrate unit 230 is generated inside thermally processed resin substrate unit 540. As a result, flaked portion 570 is generated between the surface of thermally processed resin substrate unit 540, and lower electrode 240 and the like.

FIG. 19B illustrates falling of lower electrode 240 and the like off the surface of thermally processed resin substrate unit 540 through flaked portion 570.

The semiconductor device according to the present application and Comparative Example 1 are compared with each other again with reference to FIG. 20A and FIG. 20B.

Figure 20A:
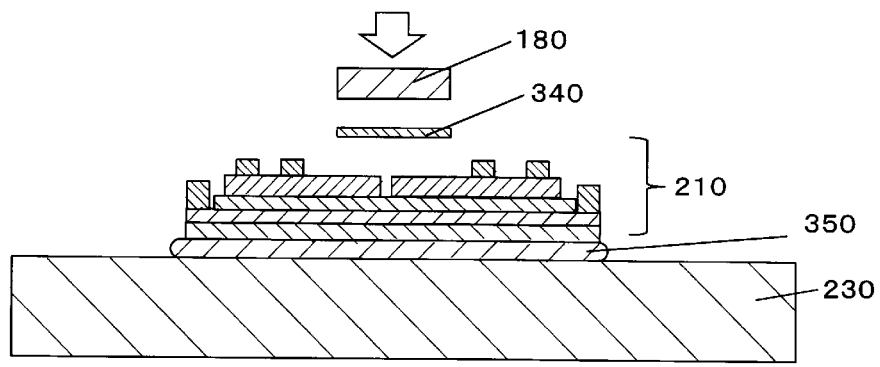
FIG. 20A is a sectional view of the semiconductor device according to the present application.
Figure 20B:
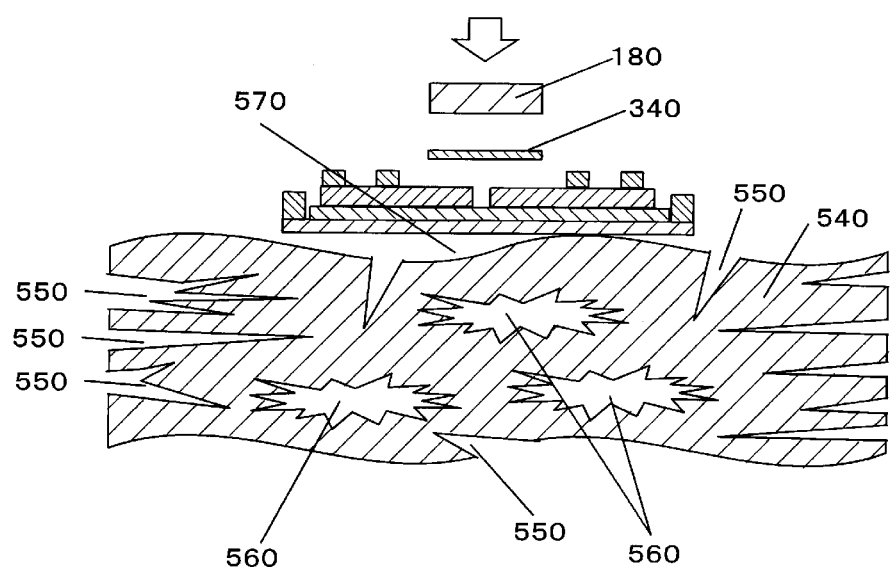
FIG. 20B is a sectional view for description of a problem occurring in high-temperature baking of the member for forming the lower electrode and the sintered dielectric formed by, for example, printing on the resin substrate unit according to Comparative Example 1.

FIGS. 20A and 20B are each a sectional view for the comparison of the semiconductor device according to the present application and Comparative Example 1.

As illustrated in FIG. 20A, in the semiconductor device according to the present application, sintered dielectric 260 and the like are formed on heat-resistant metal plate 160, but not on resin substrate unit 230, and thus no problem occurs.

In Comparative Example 1 illustrated in FIG. 20B, however, sintered dielectric 260 and the like are formed on resin substrate unit 230. Thus, resin substrate unit 230 becomes thermally processed resin substrate unit 540 through the process of thermal processing at 600° C. or higher. Thermally processed resin substrate unit 540 includes void 560 inside and externally includes lacked portion 550. Thus, in Comparative Example 1, a problem caused through the process of thermal processing prevents progress to a wire bonding process and a resin molding process.

Second Exemplary Embodiment

The second exemplary embodiment describes an example in which a lead frame is used in place of resin substrate unit 230 used in the first exemplary embodiment.

Figure 21:
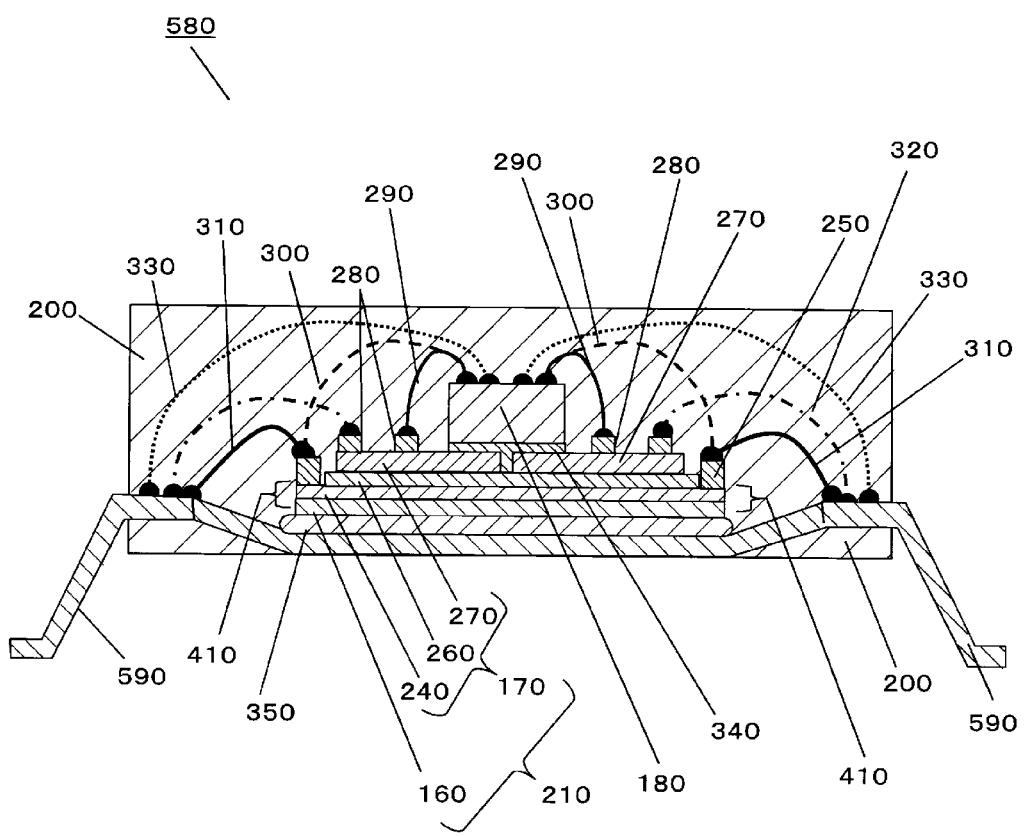
FIG. 21 is a sectional view for description of an exemplary semiconductor device according to an example of the present disclosure when a lead frame is used in place of a resin substrate.

FIG. 21 is a sectional view for description of an exemplary semiconductor device as an example of the present disclosure when a lead frame is used in place of the resin substrate. In FIG. 21, lead frame 590 is used in place of resin substrate unit 230 illustrated in FIGS. 2 to 17 described above. No significant difference is present except for the above-described point. Description of any matter shared with the first exemplary embodiment will be omitted in some cases. For example, a QFP is known as the semiconductor device illustrated in FIG. 21, but the example of the present disclosure does not need to be limited to the QFP.

Semiconductor device 580 illustrated in FIG. 21 includes lead frame 590, metal plate capacitor 210 including heat-resistant metal plate 160, and lower electrode 240, sintered dielectric 260, and upper electrode 270 that are formed on at least one surface of heat-resistant metal plate 160, and semiconductor chip 180 disposed over metal plate capacitor 210. Semiconductor device 580 further includes upper chip connector 290 which electrically connects semiconductor chip 180 and upper electrode 270. Semiconductor device 580 further includes lower chip connector 300 which electrically connects semiconductor chip 180 and lower electrode 240. Semiconductor device 580 further includes protector 200 which protects semiconductor chip 180, metal plate capacitor 210, upper chip connector 290, lower chip connector 300, and at least part of lead frame 590.

In FIG. 21, semiconductor chip 180 is electrically connected with lower electrode 240 and lower auxiliary electrode 250 through lower chip connector 300. Similarly, semiconductor chip 180 is electrically connected with upper electrode 270 and upper auxiliary electrode 280 through upper chip connector 290. Lower chip connector 300 and upper chip connector 290 may be referred to as a first connector.

In FIG. 21, lead frame 590 is electrically connected with lower electrode 240 and lower auxiliary electrode 250 through lower land connector 310. Similarly, lead frame 590 is electrically connected with upper electrode 270 and upper auxiliary electrode 280 through upper land connector 320. Lower land connector 310 and upper land connector 320 may be referred to as a second connector. As illustrated in FIG. 21, the first connector and the second connector (both not denoted by reference signs in FIG. 21) are protected by protector 200.

Similarly to semiconductor device 150 described above, semiconductor device 580 illustrated in FIG. 21 achieves an excellent jitter reducing effect. This is because semiconductor device 580 illustrated in FIG. 21 is semiconductor device 150 described above in which resin substrate unit 230 is replaced with lead frame 590.

Semiconductor device 580 illustrated in FIG. 21 can be manufactured by the above-described method illustrated in FIGS. 3 to 13. Specifically, metal plate capacitor 210 included in semiconductor device 580 illustrated in FIG. 21 can be manufactured through the above-described process illustrated in FIGS. 3 to 8 in which processing on resin substrate unit 230 is replaced with processing on lead frame 590.

In FIG. 21, a surface of lead frame 590, on which metal plate capacitor 210 is mounted (in other words, a surface on which metal plate capacitor 210 is not mounted) may be exposed from protector 200. When the surface of the lead frame, on which metal plate capacitor 210 is mounted is exposed, a heat radiating structure illustrated in, for example, FIGS. 23A and 23B to be described later is achieved.

Figure 22:
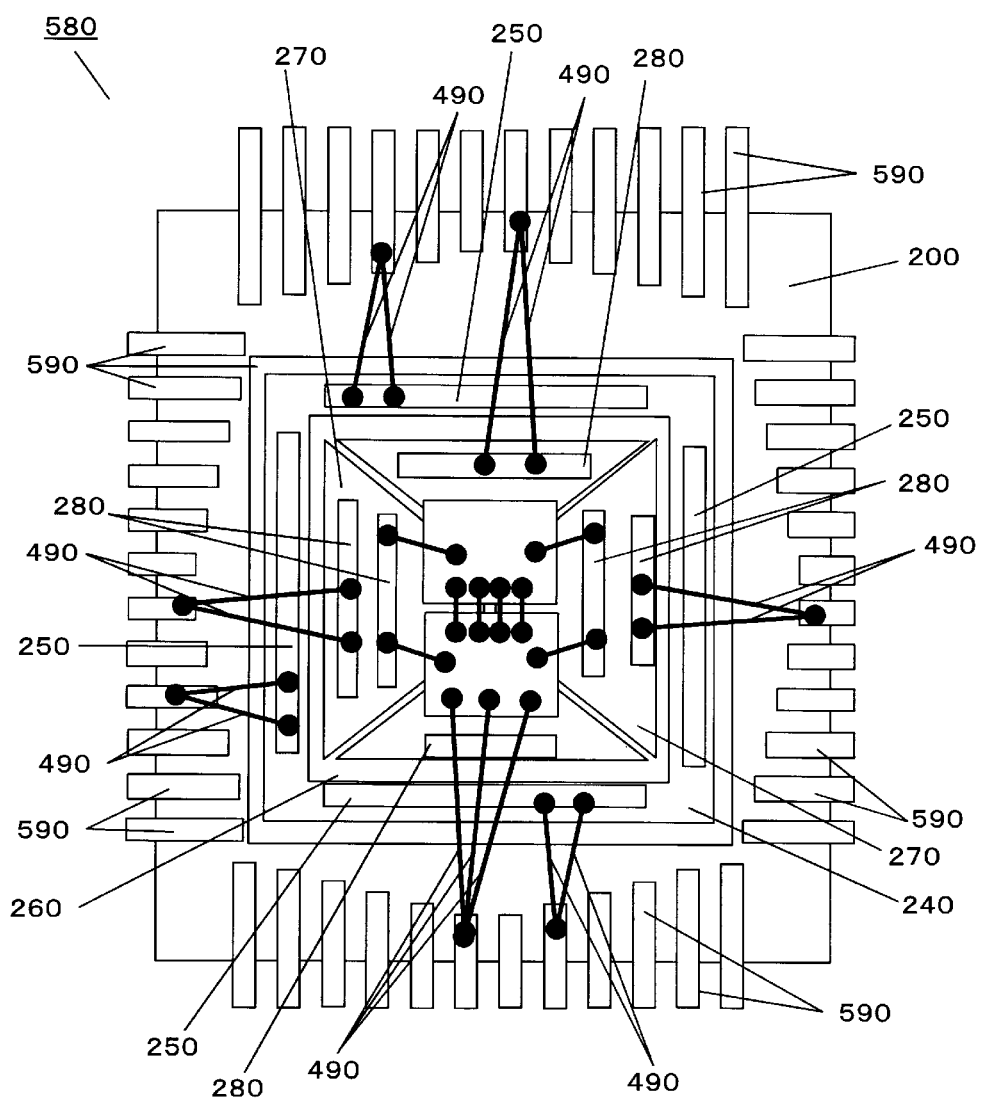
FIG. 22 is a plan view illustrating an exemplary internal structure of the semiconductor device that includes a plurality of semiconductor chips and in which connection between the lead frame and the semiconductor chips is partially achieved by double wires.

FIG. 22 is a plan view illustrating an exemplary internal structure of a semiconductor device that includes a plurality of semiconductor chips and in which double wiring is applied to part of a connection part between the lead frame and the metal plate capacitor. In FIG. 22, protector 200 covering semiconductor device 580 is not illustrated. In FIG. 22, metal plate capacitor 210 (not denoted by a reference sign) is fixed onto lead frame 590 through bonding member 350 (not illustrated).

Part of lead frame 590, at which wire bonding is applied functions as land electrode 480 of resin substrate unit 230. Thus, connector 190 which connects semiconductor chip 180 and lead frame 590 is also achieved by chip land connector 330. This configuration also applies to lower land connector 310, upper land connector 320, and the like.

In FIG. 22, a plurality of semiconductor chips 180 are fixed onto upper electrodes 270 through die attachment 340 (not illustrated) at a central part of one metal plate capacitor 210. Double wires 490 illustrated in FIG. 22 are preferably provided to chip land connector 330, lower land connector 310, and upper land connector 320. This is because the number of land electrodes 480 can be increased by increasing the area of resin substrate unit 230 in semiconductor device 150 as, for example, a BGA illustrated in FIG. 2 and the like described above, but it is difficult to increase the number of lead frames 590 in semiconductor device 580 as a QFP illustrated in FIG. 22.

A plurality of lower land connectors 310 are provided for one lead frame 590 from, for example, a plurality of positions on lower electrode 240 and lower auxiliary electrode 250, and used as double wires 490 to efficiently use lead frame 590. The number of double wires 490 is not limited to two, but may be three for triple wires. In this manner, double wires 490 are provided to connect a plurality of wires with one lead frame 590, thereby preventing increase in the number of lead frames 590.

Figure 23A:
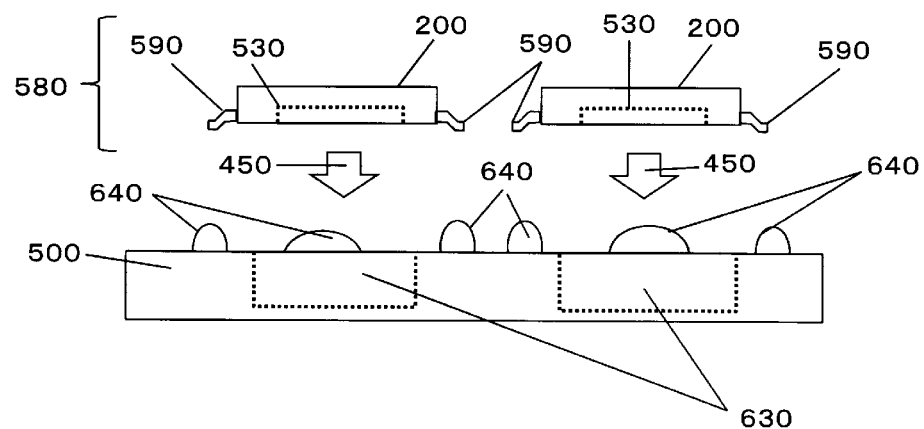
FIG. 23A is a side view for description of an exemplary structure for achieving an improved heat radiating property of the semiconductor device.
Figure 23B:
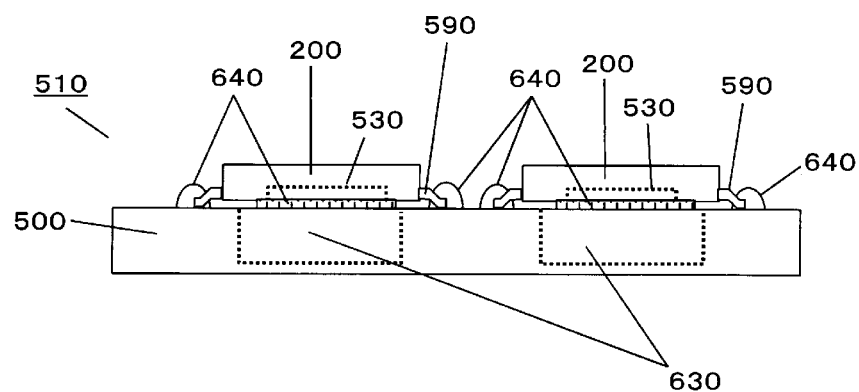
FIG. 23B is a side view for description of an exemplary structure for achieving an improved heat radiating property of the semiconductor device.
Figure 24:
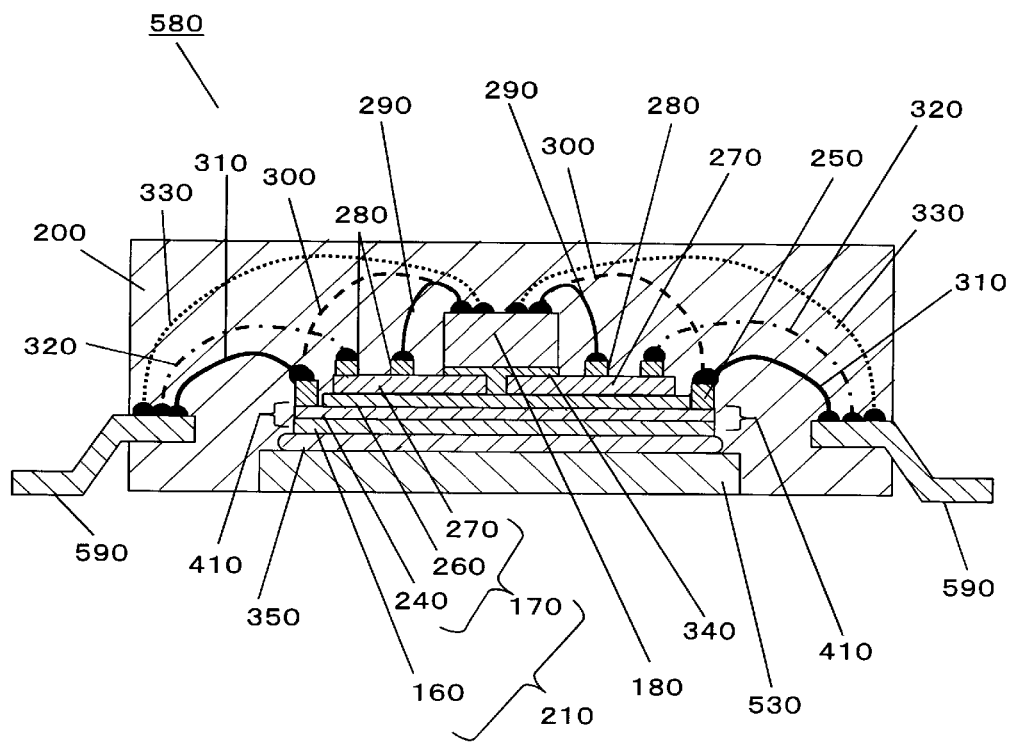
FIG. 24 is a sectional view for description of an exemplary internal structure of the semiconductor device having an improved heat radiating property.
Figure 25:
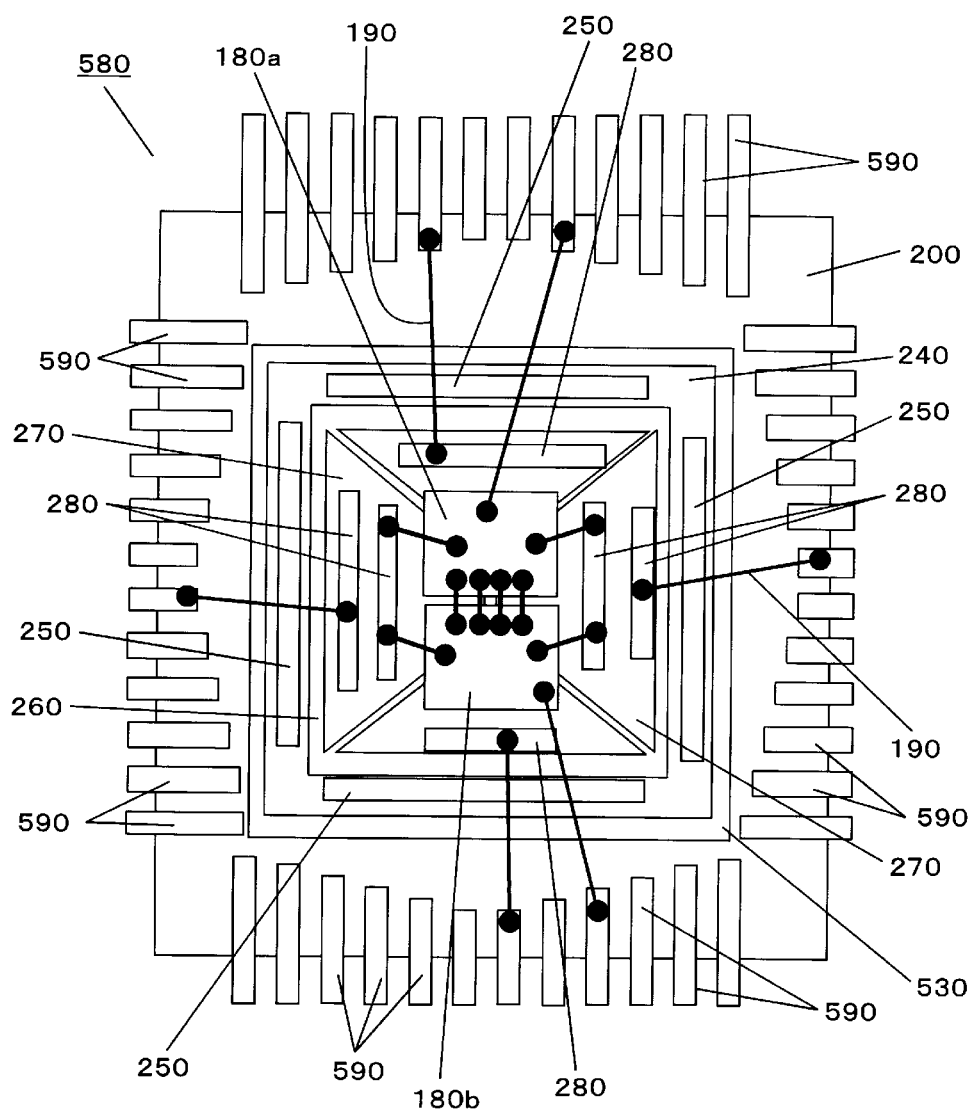
FIG. 25 is a plan view illustrating an exemplary internal structure of a semiconductor device in which a metal plate capacitor including a plurality of semiconductor chips is fixed onto a heat radiating copper plate, and part of connection between the lead frame and the semiconductor chips is performed by double wires.

The following describes an exemplary structure for improving the heat radiating property of semiconductor device 580 with reference to FIGS. 23A to 25. FIGS. 23A to 24 are each a sectional view for description of an exemplary structure for improving the heat radiating property of semiconductor device 580 using a highly thermally conductive metal plate such as a copper plate or an aluminum plate. FIG. 25 is a plan view for description of the structure for improving the heat radiating property when a plurality of semiconductor chips are mounted.

FIGS. 23A and 23B are each a side view for description of an exemplary structure for improving the heat radiating property of the semiconductor device. As illustrated in FIGS. 23A and 23B, semiconductor device 580 includes copper plate 530 as a heat radiating plate inside. Heat radiating copper plate 530 included in semiconductor device 580 is provided at the position of lead frame 590 to which metal plate capacitor 210 (not denoted by a reference sign in the drawing) is fixed in FIG. 21 described above.

As illustrated in FIG. 23A, semiconductor device 580 includes heat radiating copper plate 530 inside, and metal plate capacitor 210 and semiconductor chip 180 (both not illustrated) are fixed onto copper plate 530. As illustrated in FIG. 23A, it is advantageous to provide heat radiating member 630 including a copper plate and a copper through-hole (or, a thermal via, a heat spread structure, or the like) also to wiring substrate 500 on which semiconductor device 580 is mounted.

In addition, as illustrated in FIG. 23B, copper plate 530 included in semiconductor device 580, and heat radiating member 630 included in wiring substrate 500 are connected with each other through solder portion 640 or the like. With this configuration, heat generated in semiconductor device 580 is externally radiated through heat radiating member 630, thereby achieving an improved effect of cooling semiconductor device 580.

A metal plate such as aluminum or lead frame 590, or a ceramic plate made of, for example, alumina or aluminum nitride may be used as copper plate 530 included in semiconductor device 580 depending on usage. When wiring substrate 500 has a high thermal conductivity or when a wiring pattern formed on wiring substrate 500 has a large thickness, heat radiating member 630 does not need to be included in some cases. Heat radiating member 630 may be, depending on usage, a metal plate made of, for example, aluminum, or a ceramic plate made of, for example, alumina or aluminum nitride. When a conductive metal material such as copper plate 530 is provided in semiconductor device 580 and set to GND (ground), a noise reducing effect is obtained, thereby achieving reliable signal processing in semiconductor device 580.

FIG. 24 is a sectional view for description of an exemplary internal structure of the semiconductor device having an improved heat radiating property. Semiconductor device 580 illustrated in FIG. 24 includes, on a bottom surface of semiconductor device 580, copper plate 530 part or one surface of which is exposed. Metal plate capacitor 210 is fixed onto copper plate 530 through bonding member 350. Lead frame 590 is disposed around copper plate 530. In FIGS. 23A and 23B, copper plate 530 may be replaced with lead frame 590 as illustrated in FIG. 21 described above, and the use of copper plate 530 facilitates selection of a thickness different from the thickness of lead frame 590.

FIG. 24 is different from FIG. 21 described above in a metal part fixing metal plate capacitor 210. In FIG. 21 described above, metal plate capacitor 210 is fixed on lead frame 590, but in FIG. 24, metal plate capacitor 210 is fixed on copper plate 530 in place of lead frame 590. With the configuration illustrated in FIG. 24, the lead frame can have a centerless structure. In other words, a central part of lead frame 590, to which metal plate capacitor 210 is fixed can be omitted. With the configuration illustrated in FIG. 24, one kind of lead frame 590 can be used for various semiconductor chips 180 having, for example, different outline dimensions. As a result, the number of kinds of lead frame 590 can be reduced, and a generalized lead frame can be achieved. The thickness and dimension of copper plate 530 can be optimized depending on usage of semiconductor chip 180.

FIG. 25 is a plan view for description of an exemplary internal structure of the semiconductor device in which the metal plate capacitor to which a plurality of semiconductor chips are fixed onto the heat radiating copper plate.

As illustrated in FIG. 25, when metal plate capacitor 210 is fixed onto a heat radiating member such as copper plate 530, external radiation of heat generated in semiconductor chip 180 is easily performed through the heat radiating member such as copper plate 530. In addition, a plurality of semiconductor chips 180 can be fixed on one metal plate capacitor 210 and electrically connected with each other through connector 190. In this manner, a multichip including semiconductor chip 180a and semiconductor chip 180b can be housed in one semiconductor device 580.

With the configuration illustrated in FIG. 25, Vdd and Vss can be each supplied individually from one metal plate capacitor to the plurality of semiconductor chips 180a and 180b, thereby achieving improved performance of the multichip. In FIG. 25, it is advantageous to provide double wires 490 to lead frame 590 as described with reference to FIG. 22 described above. Copper plate 530 in FIG. 25 may be replaced with lead frame 590 as illustrated in FIG. 22 described above. In FIG. 25, four upper electrodes 270 are provided on metal plate capacitor 210, but the number of upper electrodes 270 formed in one metal plate capacitor 210 does not need to be limited to four. Similarly, when a plurality of upper electrodes 270 are formed in one metal plate capacitor 210, upper electrodes 270 do not need to have the same area. When a plurality of upper electrodes 270 having areas different from each other are provided on one metal plate capacitor 210, efficient reduction of jitters in semiconductor chip 180 can be achieved. When a plurality of upper electrodes 270 are provided on metal plate capacitor 210 while being insulated from each other, as illustrated in FIG. 25, a plurality of upper electrodes 270 may be arranged in a checkered pattern (or a tiled pattern with regularly arranged rectangles). However, when each upper electrode 270 is shaped in a trapezoid spreading from a central part toward a peripheral part, formation of upper auxiliary electrode 280 when covered by semiconductor chip 180 can be easily performed.

Figure 26:
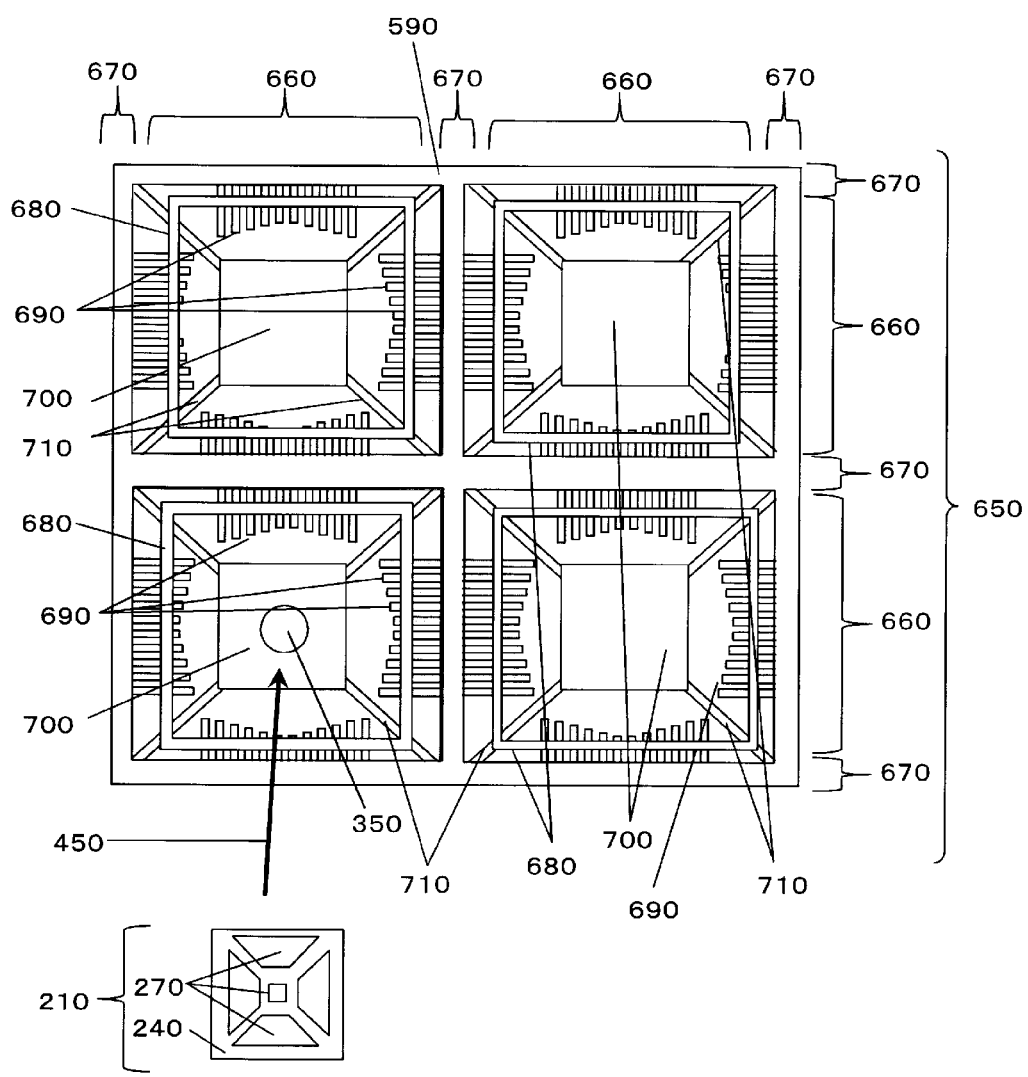
FIG. 26 is a top view for description of fixation of the metal plate capacitor according to the present disclosure at a central part of the lead frame through a connector.
Figure 27:
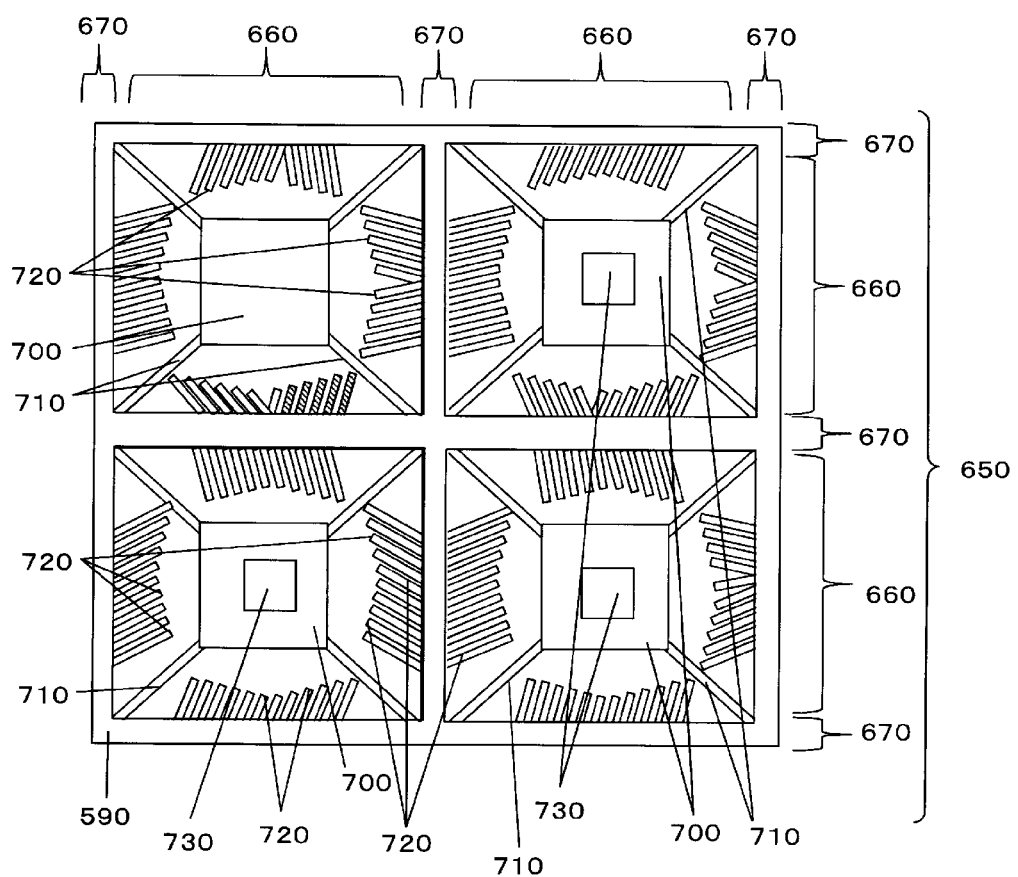
FIG. 27 is a plan view for description of a problem that occurs in Comparative Example 2.
Figure 28:
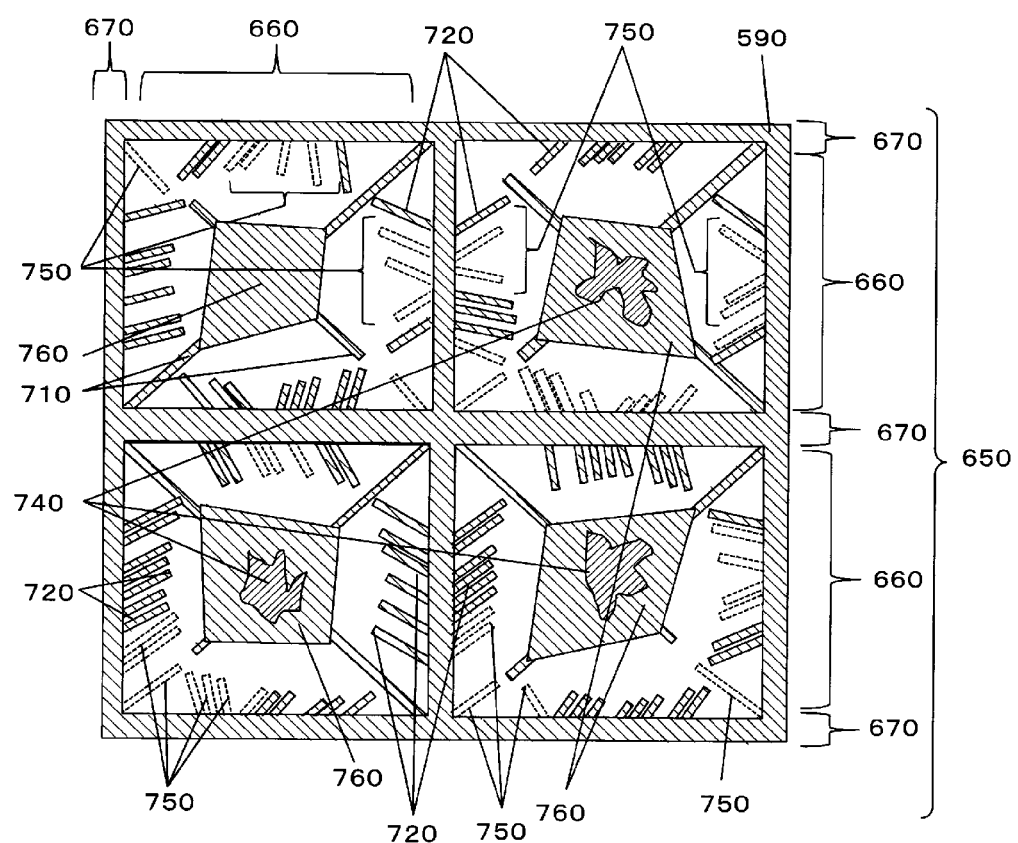
FIG. 28 is a plan view for description of a problem that occurs when the lead frame is subjected to thermal processing at a high temperature necessary for dielectric baking.

The following describes a problem that occurs when sintered dielectric 260 is formed on the lead frame, with reference to a comparative example illustrated in FIG. 26 to FIG. 28. The problem described with reference to FIGS. 26 to 28 has some part in common with the problem described above with reference to FIGS. 19A, 19B, 20A, and 20B, and description of the part will be omitted.

FIG. 26 is a top view for description of fixation of the metal plate capacitor according to the present disclosure to the central part of the lead frame through a connector. As illustrated in FIG. 26, multiple lead frame 650 includes product portion 660, and frame portion 670 which connects product portions 660. Each product portion 660 includes central portion 700 (central portion 700 is called an island portion in some cases), lead frame leading end part 690, and polyimide portion 680 that performs fixation to prevent change in shape and pitch of lead frame leading end part 690.

As illustrated with arrow 450 in FIG. 26, metal plate capacitor 210 is fixed onto a surface of central portion 700 of multiple lead frame 650 through bonding member 350. As illustrated with arrow 450 in FIG. 26, the fixation of metal plate capacitor 210 onto the surface of multiple lead frame 650 corresponds to the fixation of metal plate capacitor 210 onto the surface of resin substrate unit 230 as illustrated with arrow 450 in FIG. 9 described above.

As illustrated with arrow 450 in FIG. 26, after metal plate capacitor 210 is fixed onto the surface of multiple lead frame 650, connector 190 including, for example, a wire is formed as illustrated in FIGS. 10 to 13 described above, and lastly protector 200 is formed. Accordingly, semiconductor device 580 according to the present disclosure illustrated in FIG. 24 described above is obtained. In FIG. 24 described above, polyimide portion 680 for preventing deformation and pitch shift of lead frame 590 is not illustrated.

In semiconductor device 580, sintered dielectric 260 is formed not on multiple lead frame 650 illustrated in FIG. 26 but on separately prepared heat-resistant metal plate 160. Thus, thermal processing for forming sintered dielectric 260 is not performed on multiple lead frame 650.

The following describes Comparative Example 2 of the present disclosure that is a comparative example of semiconductor device 580 according to the present disclosure in which lead frame 590 is used in place of heat-resistant metal plate 160. The description of Comparative Example 2 will be made with reference to FIGS. 26 to 28. Comparative Example 2 will be described again as Comparative Example 2 (corresponding to FIG. 27 to FIG. 28) in Table 2 to be described later.

FIG. 27 is a plan view for description of a problem that occurs in Comparative Example 2. FIG. 27 is an exemplary plan view for description of a problem that occurs when thermal processing (at 400° C. to 600° C., for example) is performed after a capacitor dielectric material is formed by printing on central portion 700 illustrated in FIG. 26 described above for example.

In FIG. 27, deformed leading end part 720 is a thermally processed and deformed part of lead frame leading end part 690. Comparative product dielectric 730 corresponds to the state of the capacitor dielectric material after printed on central portion 700 while being in a paste state, and then thermally processed at 400° C. to 600° C. approximately. The thermal processing at 400° C. to 600° C. corresponds to a state in which, for example, a binding agent component (organic component) in the dielectric paste is vanished but sintering of dielectric powder is yet to start.

When heated at 400° C. to 600° C., even lead frame 590 reinforced with polyimide portion 680 as illustrated in FIG. 26 described above still suffers generation of deformed leading end part 720 as illustrated in FIG. 27. Deformed leading end part 720 is a deformed part of lead frame 590, which is generated when polyimide portion 680 is decomposed and vanished by heating.

Comparative product dielectric 730 in FIG. 27 is not sintered yet because contraction due to sintering has not started yet at 400° C. to 600° C. for a dielectric material of a baking type in some cases.

As described above, when thermally processed at a temperature equal to or higher than a heat-resistant temperature of polyimide portion 680 (400° C. or higher, for example), even lead frame leading end part 690 reinforced with polyimide portion 680 is deformed to become deformed leading end part 720 as illustrated in FIG. 27. Once the lead frame is deformed, it is extremely difficult to recover a highly accurate original state from the deformed state, whereby electrical connection by wire bonding is difficult to achieve.

FIG. 28 is a plan view for description of a problem that occurs when the lead frame is thermally processed at a high temperature necessary for formation of sintered dielectric 260. FIG. 28 corresponds to a case in which the capacitor dielectric material is formed, at room temperature (20° C. to 25° C., for example), on central portion 700 of lead frame 590 obtained through formation of polyimide portion 680 illustrated in FIGS. 26 and 27 described above, and then is thermally processed at 850° C. to 950° C. approximately.

In FIG. 28, reference sign 740 denotes a comparative product sintered dielectric, reference sign 750 denotes a comparative product lacked portion, and reference sign 760 denotes a comparative product central portion.

As illustrated in FIG. 28, lead frame leading end part 690 in multiple lead frame 650 is thermally processed at 850° C. to 950° C. to become deformed leading end part 720 and comparative product lacked portion 750. Comparative product dielectric 730 illustrated in FIG. 27 becomes comparative product sintered dielectric 740. Central portion 700 and center holding unit 710 are also thermally processed at 850° C. to 950° C. to form comparative product central portion 760 and comparative product lacked portion 750, respectively.

As illustrated in FIGS. 27 and 28, in a case of comparative product 2, multiple lead frame 650 has a low thermal resistance, and thus such a problem occurs that lead frame 590 is deformed and lacked through thermal processing at 650° C. to 950° C. which is a sintering temperature of the dielectric material. The problem such as the deformation and lack of lead frame 590 occurring in comparative product 2 is expected to be generated due to, in addition to the low thermal resistance of the lead frame, thermal damage on polyimide portion 680 for preventing deformation of lead frame leading end part 690 formed in a fine shape.

As described above, in semiconductor device 580 according to the present disclosure, since lower electrode 240, sintered dielectric 260, upper electrode 270, and any other component are formed on the surface of heat-resistant metal plate 160, no deformation nor lack occurs to heat-resistant metal plate 160, lower electrode 240, sintered dielectric 260, upper electrode 270, and any other component during thermal processing at 650° C. to 950° C. for forming lower electrode 240, sintered dielectric 260, upper electrode 270, and any other component.

Third Exemplary Embodiment

The following describes, as a third exemplary embodiment, improvement of connection of semiconductor chip 180 and metal plate capacitor 210 with land electrode 480 of resin substrate unit 230 and lead frame leading end part 690 of lead frame 590 with reference to FIGS. 29A to 32.

The description with reference to FIGS. 29A to 32 is made on the lead frame (or lead frame leading end part 690), but the present exemplary embodiment is applicable to semiconductor device 150 described with reference to FIG. 2 and the like described above when lead frame leading end part 690 is replaced with land electrode 480 in resin substrate unit 230.

Figure 29A:
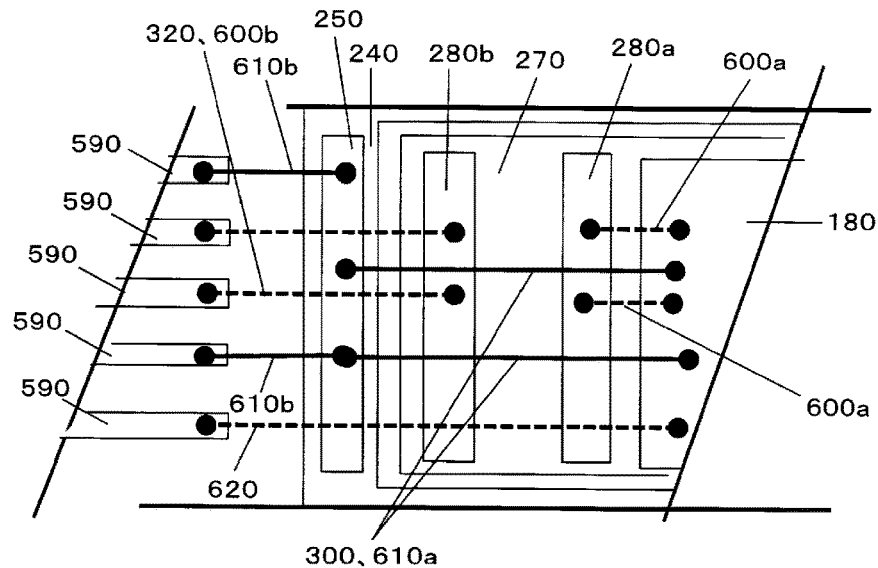
Figure 29B:
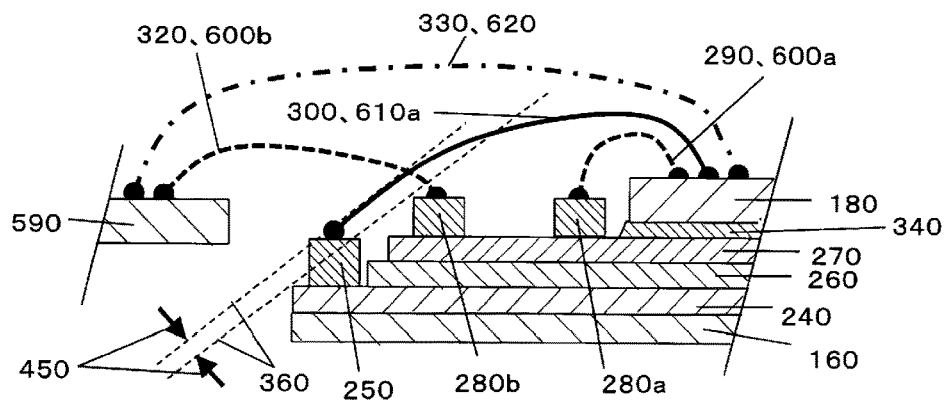
Figure 29C:
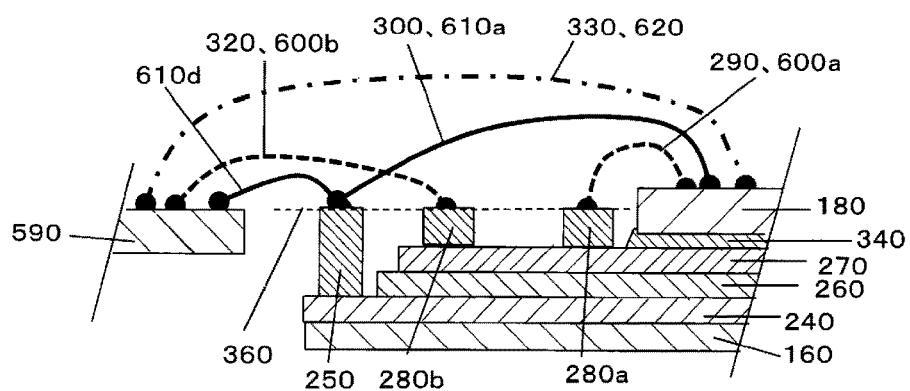
FIG. 29C is a side view for description of one structure of the metal plate capacitor for optimization of the Vdd line, the Vss line, the signal line, and the like in the semiconductor chip and the metal plate capacitor.

FIGS. 29A to 29C are each a top view or a side view for description of one structure of the metal plate capacitor for optimizing a Vdd line, a Vss line, a signal line, and the like in the semiconductor chip, the metal plate capacitor, and the like.

In FIG. 29A, semiconductor chip 180 and upper auxiliary electrode 280a are connected with each other through upper chip connector 290 (may be Vdd line 600a). Lead frame leading end part 690 and upper auxiliary electrode 280b are connected with each other through upper land connector 320 (upper land connector 320 may be Vdd line 600b). In this manner, when upper auxiliary electrode 280a and upper auxiliary electrode 280b are electrically connected with each other through upper electrode 270, ESR and ESL can be reduced, thereby reducing noise in semiconductor chip 180.

In lower chip connector 300 (lower chip connector 300 may be Vss 610) which electrically connects semiconductor chip 180 and lower auxiliary electrode 250 illustrated in FIG. 29A, a problem as illustrated with arrow 450 in FIG. 29B occurs in some cases.

In FIG. 29B, arrow 450 and auxiliary line 360 indicate a gap (clearance) between upper auxiliary electrode 280b and lower chip connector 300 (or Vss line 610a). When the gap between lower chip connector 300 and upper auxiliary electrode 280b is small, lower chip connector 300 (or Vss line 610a) potentially contacts with upper auxiliary electrode 280b (upper auxiliary electrode 280b corresponds to upper land connector 320 or Vdd line 600b). In such a case, as illustrated with auxiliary line 360 in FIG. 29C, it is advantageous that the height of lower auxiliary electrode 250 is aligned with the heights of upper auxiliary electrode 280a and upper auxiliary electrode 280b.

As illustrated with auxiliary line 360 in FIG. 29C, the height of lower auxiliary electrode 250 is aligned with the heights of upper auxiliary electrode 280a and upper auxiliary electrode 280b. With this configuration, the distance between lower chip connector 300 (or Vss line 610a) and upper auxiliary electrode 280b can be increased.

The structure illustrated in FIG. 29C is applicable not only to semiconductor device 580 of, for example, QFP described in the first exemplary embodiment, but also to semiconductor device 150 of, for example, PBGA described in the second exemplary embodiment.

Figure 30A:
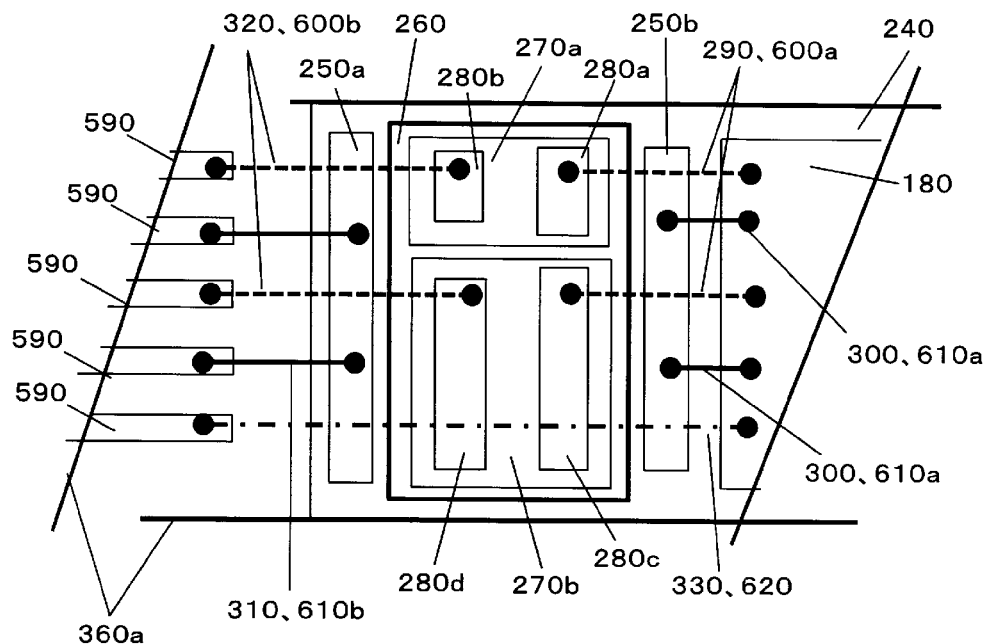
FIG. 30A is a top view for description of one exemplary improvement of the structure of the lower auxiliary electrode.
Figure 30B:
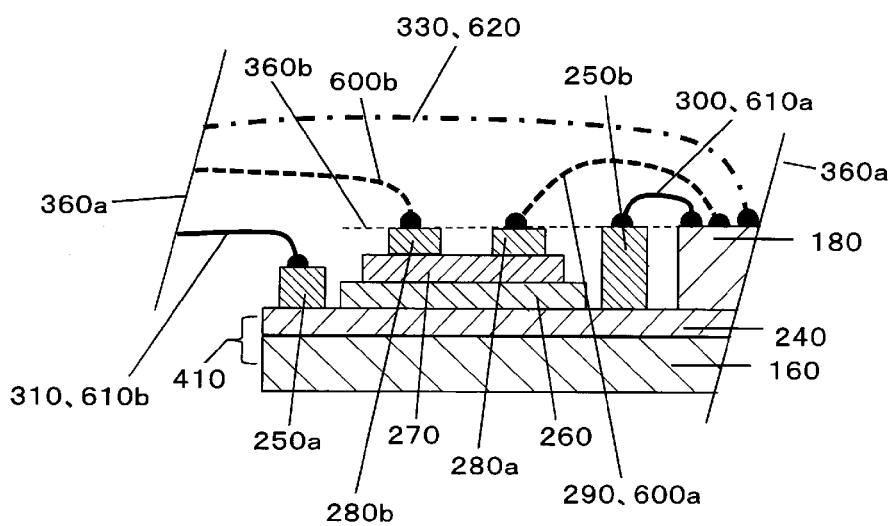
FIG. 30B is a side view for description of the one exemplary improvement of the structure of the lower auxiliary electrode.

FIGS. 30A and 30B are each a top view and a side view for description of exemplary improvement of the structure of the lower auxiliary electrode. As illustrated in FIG. 30A, part of lower electrode 240 is exposed at part of metal plate capacitor 210, which is closer to semiconductor chip 180, to form lower auxiliary electrode 250b. Similarly, part of lower electrode 240 is exposed at part of metal plate capacitor 210, which is closer to lead frame 590, to form lower auxiliary electrode 250a. Then, the semiconductor chip and lower auxiliary electrode 250b are connected with each other through lower chip connector 300 (or Vss line 610a). Then, lead frame 590 and lower auxiliary electrode 250a are connected with each other through lower land connector 310 (or may be Vss line 610b). This configuration achieves low ESR and low ESL at Vss line 610.

As illustrated with auxiliary line 360b in FIG. 30B, it is advantageous to align the heights of upper auxiliary electrode 280a, upper auxiliary electrode 280b, lower auxiliary electrode 250b, and the like. When, for example, the shape of a capillary at wire bonding is taken into consideration, it is advantageous to increase the height of, for example, lower auxiliary electrode 250b as illustrated with auxiliary line 360b in FIG. 30B.

As illustrated in FIG. 30A, it is advantageous to provide, on one surface of sintered dielectric 260, upper electrode 270a, upper electrode 270b, and a plurality of upper electrodes 270 formed independently from each other in a pattern shape. When a plurality of upper electrodes 270a and 270b electrically insulated from each other are provided on one surface of sintered dielectric 260, mutual interference between upper electrode 270a and upper electrode 270b can be reduced. As a result, Vdd at upper electrode 270a and Vdd at upper electrode 270b can be independent from each other, thereby achieving reduction of jitters in semiconductor chip 180 due to mutual voltage interference. In addition, it is advantageous that the heights of upper auxiliary electrode 280a, upper auxiliary electrode 280b, lower auxiliary electrode 250a, and lower auxiliary electrode 250b are aligned with substantially the same height (at least ±10 μm or smaller, more preferably ±5 μm or smaller). With such a structure, the intersecting problem between a plurality of adjacent wires as illustrated in FIG. 29C described above can be avoided to achieve high-speed wire connection.

Semiconductor chip 180 requires multiple power sources in some cases. For example, in a case of a DRAM, three power sources are used for an LSI chip. Thus, even for the same voltage, separate power sources are allocated (power cut off is performed) to achieve noise reduction in some cases. In this manner, depending on the specification of semiconductor chip 180, a plurality of upper electrodes 270 are provided on one sintered dielectric 260, and power supply (Vdd) is performed from the plurality of upper electrodes 270 to one LSI (or semiconductor chip 180), thereby achieving noise reduction.

Figure 31A:
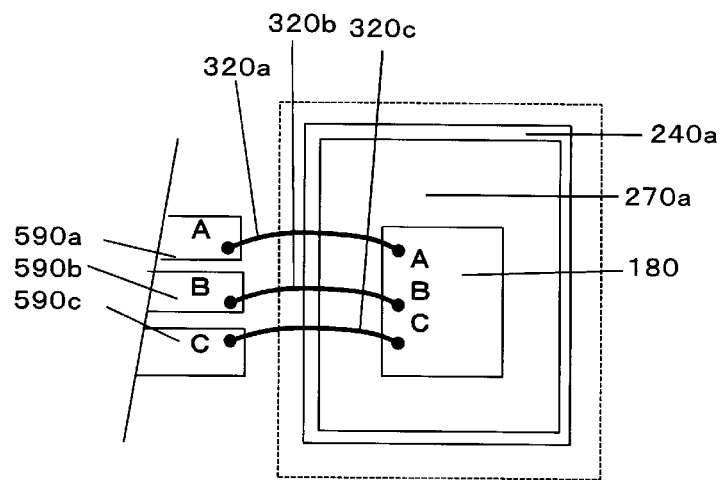
FIG. 31A is a top view for description of one structure of electrical connection between the semiconductor chip and the lead frame.
Figure 31B:
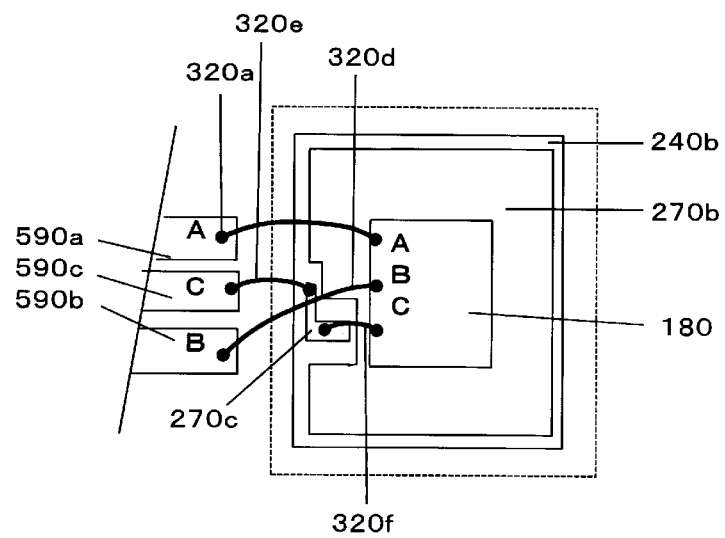
FIG. 31B is a top view for description of one structure for optimizing electrical connection between the semiconductor chip and the lead frame.

The following describes improvement at a connection part between the semiconductor chip and the lead frame with reference to FIG. 31A and FIG. 31B.

FIGS. 31A and 31B are each a top view for description of one structure for optimizing electrical connection between the semiconductor chip and the lead frame. In FIGS. 31A and 31B, for example, protector 200 is not illustrated.

In FIG. 31A, Terminals A, B, and C of semiconductor chip 180 are connected with Part A of lead frame 590a, Part B of lead frame 590b, and Part C of lead frame 590c, respectively, in this order.

However, as illustrated in FIG. 31B, the order (for example, A->B->C) of Terminal A, Terminal B, and Terminal C on semiconductor chip 180 is different from the order (for example, A->C->B) of the lead frames in some cases. In such a case, when crossed wiring (also called twisted wiring) is performed only by wire bonding, wires potentially contact with each other. In this case, as illustrated in FIG. 31B, when a plurality of patterns of upper electrodes 270 of metal plate capacitor 210 are provided, crossing by wire bonding can be prevented.

For the terminal order (A->B->C) of the semiconductor chip and the terminal order (A->C->B) of the lead frames as illustrated in FIG. 31B, crossed wiring can be performed through combination of upper electrode 270b and upper electrode 270c. As illustrated in FIG. 31B, a problem caused by crossed wiring (or twisted wiring) by wire bonding can be prevented. The direction, position, and the like of crossing in crossed wiring (or the direction of twist in twisted wiring) may be optimized depending on usage.

Figure 32:
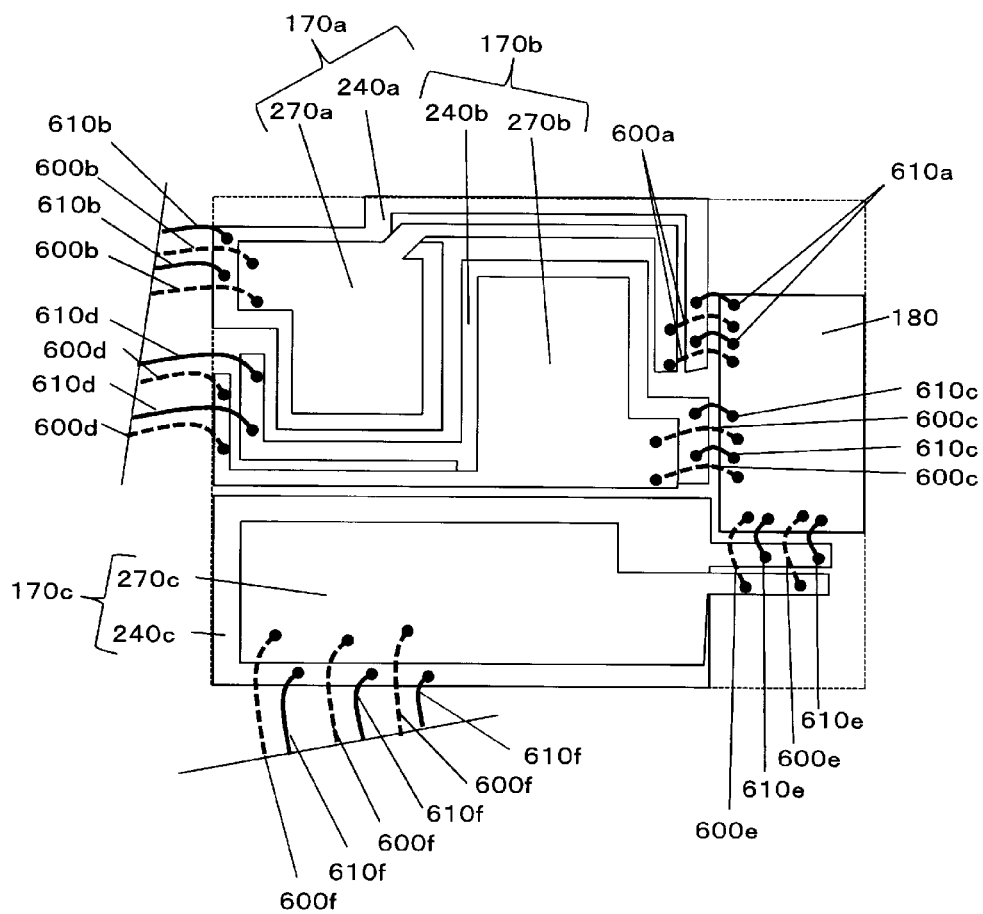
FIG. 32 is a top view for description of one improved structure of a connection part between the semiconductor chip and the lead frame.

FIG. 32 is a top view for description of one structure for improving the connection part between the semiconductor chip and the lead frame. As illustrated in FIG. 32, a plurality of capacitor units 170 electrically independent from each other are formed on one metal plate capacitor 210. The plurality of capacitor units 170 may be in a wiring pattern for connecting semiconductor chip 180 with lead frame 590 and land electrode 480 (both not illustrated).

As illustrated in FIG. 32, a plurality of capacitor units 170a, 170b, and 170c electrically independent from each other are provided on one metal plate capacitor 210. Parts of upper electrodes 270a, 270b, and 270c, and parts of lower electrodes 240a, 240b, and 240c are each used as an electrical wire connecting semiconductor chip 180 with lead frame 590 and land electrode 480 of resin substrate unit 230 (both not illustrated), thereby achieving improved freedom of wiring routing.

As illustrated in FIG. 32, when a plurality of lower electrodes 240a and 240b and the like are formed on heat-resistant metal plate 160, it is advantageous to electrically insulate the plurality of lower electrodes 240a and 240b from heat-resistant metal plate 160.

For example, in FIG. 32, Vss line 610a and Vss line 610b are electrically connected with each other through lower electrode 240a. Similarly, Vdd line 600a and Vdd line 600b are electrically connected with each other through upper electrode 270a. Similarly, Vss line 610c and Vss line 610d are connected with each other, and Vss line 610e and Vss line 610f are connected with each other. Similarly, Vdd line 600c and Vdd line 600d are connected with each other.

Similarly, Vdd line 600e and Vdd line 600f are electrically connected with each other through upper electrode 270c. In this manner, upper electrodes 270a, 270b, and 270c, and lower electrodes 240a, 240b, and 240c are used as parts of electrodes, thereby achieving improved freedom of electrode routing. In FIG. 32, sintered dielectric 260, upper auxiliary electrode 280, lower auxiliary electrode 250, and the like are not illustrated.

In FIGS. 30A and 30B described above, only Vdd is a plurality of wires insulated from each other, but, as illustrated in FIG. 32, Vss as well as Vdd may be a plurality of wires insulated from each other. In FIG. 32, an insulating layer that insulates heat-resistant metal plate 160 from lower electrode 240a, lower electrode 240b, and lower electrode 240c may be made of a glass or ceramic insulating material that can be sintered at 600° C. to 950° C. approximately. Also when heat-resistant metal plate 160 is insulated from lower electrodes 240a to 240c, fabricated connection part 410 described above with reference to FIGS. 6A, 6B, and 8 may be made of a glass or ceramic insulating material that can be sintered at 600° C. to 950° C. approximately. Even when heat-resistant metal plate 160 is insulated from lower electrodes 240a to 240c, fabricated connection part 410 described above with reference to FIGS. 6A, 6B, and 8 are provided to enable conduction between heat-resistant metal plate 160 and lower electrodes 240a to 240c.

Fourth Exemplary Embodiment

Figure 33A:
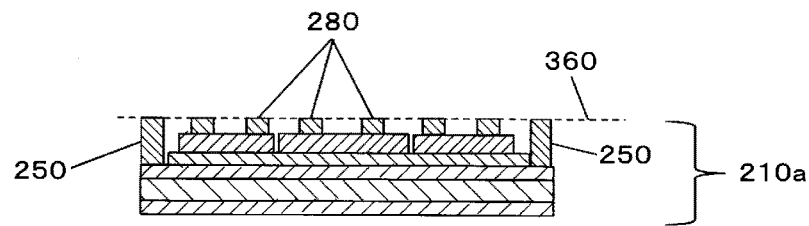
FIG. 33A is a sectional view for description of one process among a series of processes in which a bump is formed on a surface of the metal plate capacitor and the metal plate capacitor is mounted on a semiconductor at a shortest distance by using the bump.
Figure 33B:
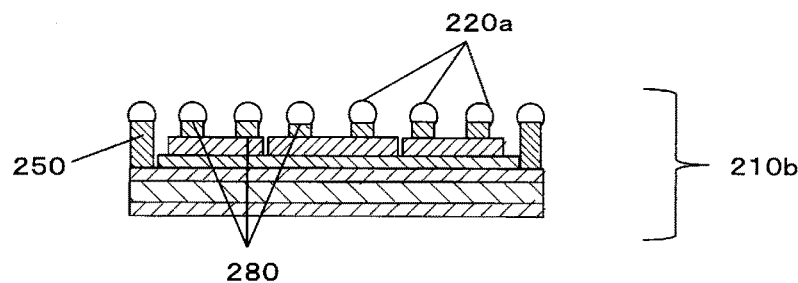
FIG. 33B is a sectional view for description of one process among the series of processes in which a bump is formed on a surface of the metal plate capacitor and the metal plate capacitor is mounted on a semiconductor at a shortest distance by using the bump.
Figure 33C:
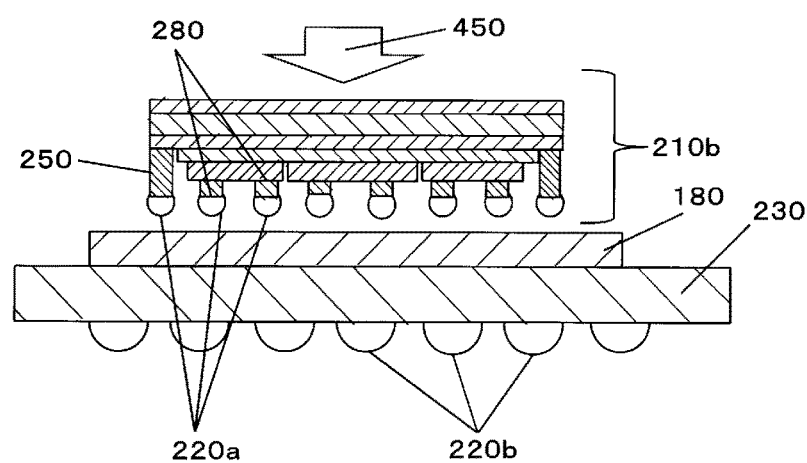
FIG. 33C is a sectional view for description of one process among the series of processes in which a bump is formed on a surface of the metal plate capacitor and the metal plate capacitor is mounted on a semiconductor at a shortest distance by using the bump.

The following describes, as a fourth exemplary embodiment, an exemplary configuration in which bump connection is achieved between semiconductor chip 180 and metal plate capacitor 210, with reference to FIGS. 33A to 33C.

FIGS. 33A to 33C are each a sectional view for description of connection of the semiconductor chip and the metal plate capacitor at a shortest distance using bumps formed on the surface of the metal plate capacitor.

As illustrated in FIG. 33A, metal plate capacitor 210a is prepared. The heights of lower auxiliary electrode 250 and upper auxiliary electrode 280 provided on a surface of metal plate capacitor 210a are preferably substantially identical to each other as illustrated with auxiliary line 360.

In metal plate capacitor 210b illustrated in FIG. 33B, bump 220a is formed on lower auxiliary electrode 250 and upper auxiliary electrode 280.

FIG. 33C illustrates mounting of the metal plate capacitor including a bump onto the surface of semiconductor chip 180. As illustrated in FIG. 33C, metal plate capacitor 210b is connected onto semiconductor chip 180 through bump 220a. With this configuration, at an optional part of semiconductor chip 180 (in other words, a central part of semiconductor chip 180 as well as a peripheral part of semiconductor chip 180), Vdd, Vss, and the like independent from each other can be supplied from the metal plate capacitor to semiconductor chip 180. Bump 220b illustrated in FIG. 33C may be formed after semiconductor chip 180 and metal plate capacitor 210b are protected by protector 200.

Fifth Exemplary Embodiment

Figure 34A:
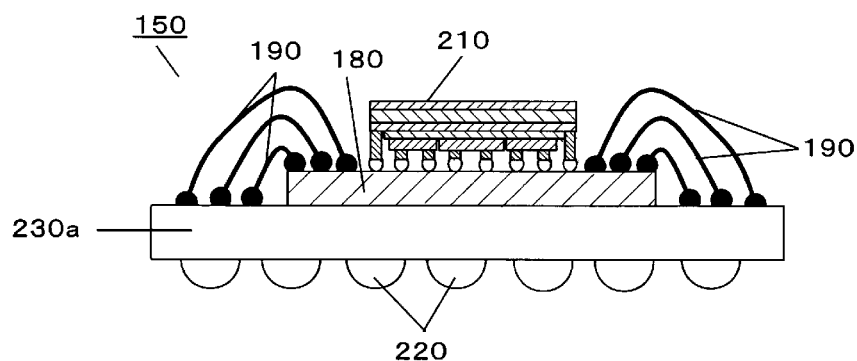
FIG. 34A is a sectional view of the present disclosure for description of a structural difference between the semiconductor device according to the present disclosure and the conventional semiconductor device including a capacitor.
Figure 34B:
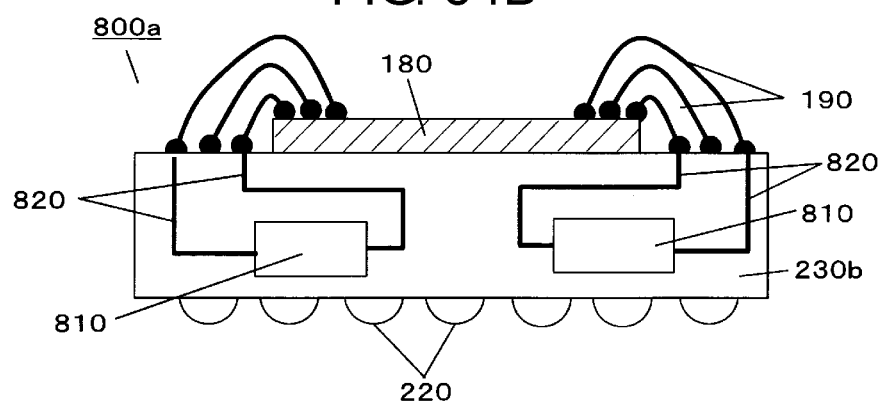
FIG. 34B is a sectional view of a comparative example for description of the structural difference between the semiconductor device according to the present disclosure and the conventional semiconductor device including a capacitor.
Figure 34C:
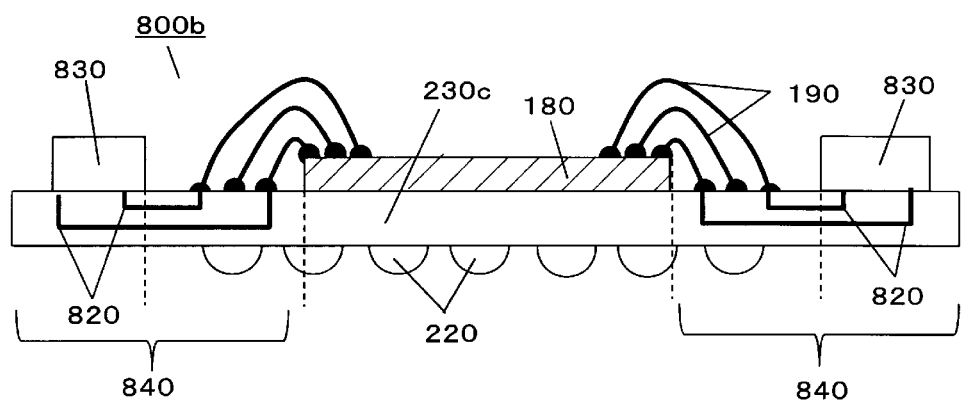
FIG. 34C is a sectional view of the comparative example for description of the structural difference between the semiconductor device according to the present disclosure and the conventional semiconductor device including a capacitor.
Figure 35:
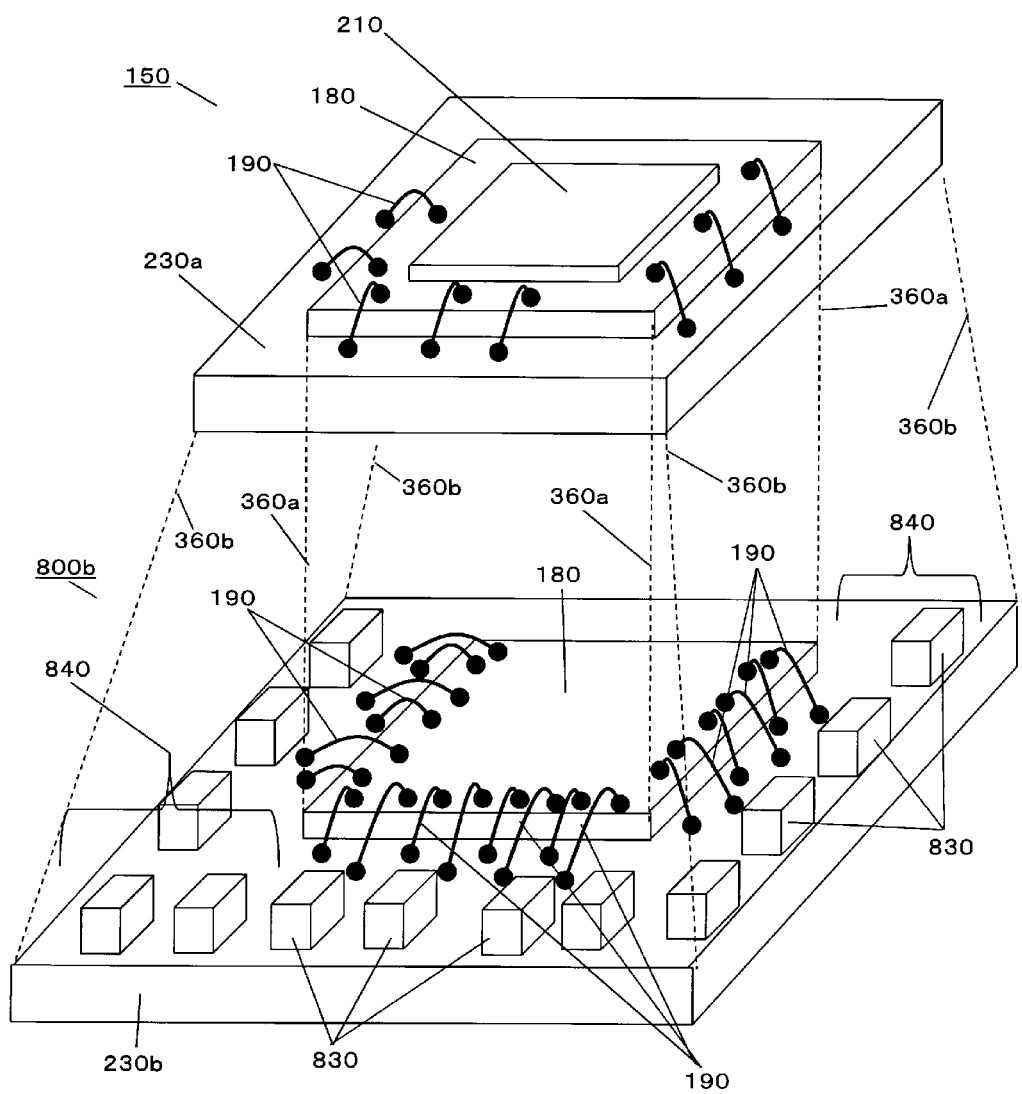
FIG. 35 is a perspective view for description of a dimensional difference between a disclosed product illustrated in FIG. 34A and a sample (comparative product) illustrated in FIG. 34B.

The following describes, as a fifth exemplary embodiment, a structure difference between the conventional semiconductor device including the capacitor and the semiconductor device according to the present disclosure, with reference to FIGS. 34A to 35.

FIGS. 34A to 35 are each a sectional view for description of a structure difference between the conventional semiconductor device including the capacitor and the semiconductor device according to the present disclosure.

FIGS. 34A to 34C are each a sectional view of comparison between the semiconductor device according to the present disclosure and a semiconductor device as a comparative example. In FIGS. 34A to 34C, protector 200 and the like are not illustrated.

FIG. 34A is a side view of semiconductor device 150 according to the present disclosure. In FIG. 34A, protector 200 and the like are not illustrated. As illustrated in FIG. 34A, in semiconductor device 150 according to the present disclosure, Vss or Vdd can be supplied at an optional position of semiconductor chip 180, and in addition, semiconductor chip 180 and metal plate capacitor 210 can be connected with each other at a shortest distance, thereby achieving reduced ESL and ESR. As a result, with the configuration in FIG. 34A, an excellent jitter reducing effect can be obtained.

FIG. 34B is a sectional view of a semiconductor device (hereinafter referred to as comparative product 800a) as a comparative example of the present disclosure. In comparative product 800a illustrated in FIG. 34B, embedded capacitor 810 is included in resin substrate unit 230b to achieve reliable operation of semiconductor chip 180. In comparative product 800a illustrated in FIG. 34B, a capacitor including laminated ceramic capacitor and the like is embedded, as embedded capacitor 810, inside resin substrate unit 230, thereby achieving a reduced projected area. However, in comparative product 800a, a longer copper wire is needed to connect semiconductor chip 180 and embedded capacitor 810 to embed embedded capacitor 810 inside resin substrate unit 230, and in addition, an interlayer connection structure through a conductive via is needed. In this manner, in comparative product 800a, internal wire 820 is long and complicated. As a result, ESR and ESL are increased with the configuration of comparative product 800a illustrated in FIG. 34B as compared to the configuration in FIG. 34A, and a jitter reducing effect is unlikely to be obtained. When embedded capacitor 810 is included, the cost and thickness of resin substrate unit 230 are increased.

FIG. 34C is a sectional view of a semiconductor device (hereinafter referred to as comparative product 800b) as a comparative example of the present disclosure. In comparative product 800b illustrated in FIG. 34C, external capacitor 830 is provided on resin substrate unit 230c to achieve reliable operation of a semiconductor chip. In comparative product 800b illustrated in FIG. 34C, a capacitor including a commercially available laminated ceramic capacitor and the like is mounted, as external capacitor 830, on a surface of resin substrate unit 230c. This configuration needs an area for mounting external capacitor 830, leading to an increased projected area of resin substrate unit 230. As a result, internal wire 820 connecting semiconductor chip 180 and external capacitor 830 is long and complicated. As a result, ESR and ESL are increased with the configuration of comparative product 800b illustrated in FIG. 34C as compared to the configuration in FIG. 34A, and a jitter reducing effect is unlikely to be obtained.

As described above, ESL can be minimized with the structure of semiconductor device 150 including metal plate capacitor 210, as illustrated in FIG. 34A, as compared to the structures illustrated in FIGS. 34B and 34C.

In addition, the structure illustrated in FIG. 34A can provide improved reliability. With the structure illustrated in FIG. 34A, heat-resistant metal plate 160 functions as a structural member in metal plate capacitor 210. As a result, semiconductor device 150 has a physical strength necessary at baking and mounting, and is unlikely to break even when dropped.

In contrast, the typical laminated ceramic capacitors as illustrated in FIGS. 34B and 34C do not include heat-resistant metal plate 160 as a structural member. Thus, in some cases, the configurations illustrated in FIGS. 34B and 34C have such a physical problem that the laminated ceramic capacitors are likely to break when dropped.

As described above, metal plate capacitor 210 includes heat-resistant metal plate 160 as part of a structural unit, thereby achieving excellent physical strength and dimension stability, which is one of characteristics that cannot be obtained by the conventional ceramic capacitor.

FIG. 35 is a perspective view for description of a dimensional difference between the disclosed product illustrated in FIG. 34A and the sample (comparative product 800b) illustrated in FIG. 34C. In FIG. 35, a pad surface (also called a pad electrode; not illustrated) of semiconductor chip 180 may have an area pad structure (an area pad is a pad structure in which an electrode pad is disposed in a region on a semiconductor chip element, that is, near a central portion at which the semiconductor chip element is located, or in an active area as a core area). Alternatively, a power source pad and a GND pad (both not illustrated) in semiconductor chip 180 may be provided at the central part of semiconductor chip 180.

In FIG. 35, semiconductor device 150 is one example of the present disclosure. As illustrated in FIG. 35, in semiconductor device 150, semiconductor chip 180 and metal plate capacitor 210 are stacked to be connected with each other at a shortest distance and to have a reduced projected area. In addition, in semiconductor device 150, since an increased number of connectors 190 each including, for example, a wire are provided, ESL and ESR between semiconductor chip 180 and metal plate capacitor 210 are not affected even when a larger number of land electrodes 480 (not illustrated) are provided.

In FIG. 35, comparative product 800b is comparative product 800b illustrated in FIG. 34C. In comparative product 800b, external capacitor 830 is provided in peripheral region 840 as a peripheral part of resin substrate unit 230b. Thus, resin substrate unit 230b is larger than resin substrate unit 230a. Accordingly, comparative product 800b has a projected area larger than the projected area of semiconductor device 150 according to the present disclosure. In addition, in comparative product 800b, when an increased number of connectors 190 each including, for example, a wire are provided, peripheral region 840 necessary for formation of external capacitor 830 and the like as well as land electrode 480 (not illustrated) is further increased. Then, the length of a wire connecting semiconductor chip 180 and external capacitor 830 is increased by an amount corresponding to an increase in the area of peripheral region 840 necessary for formation of land electrode 480 and the like, which leads to complicated wiring, and accordingly, ESR and ESL are increased to have increased jitters.

Figure 36A:
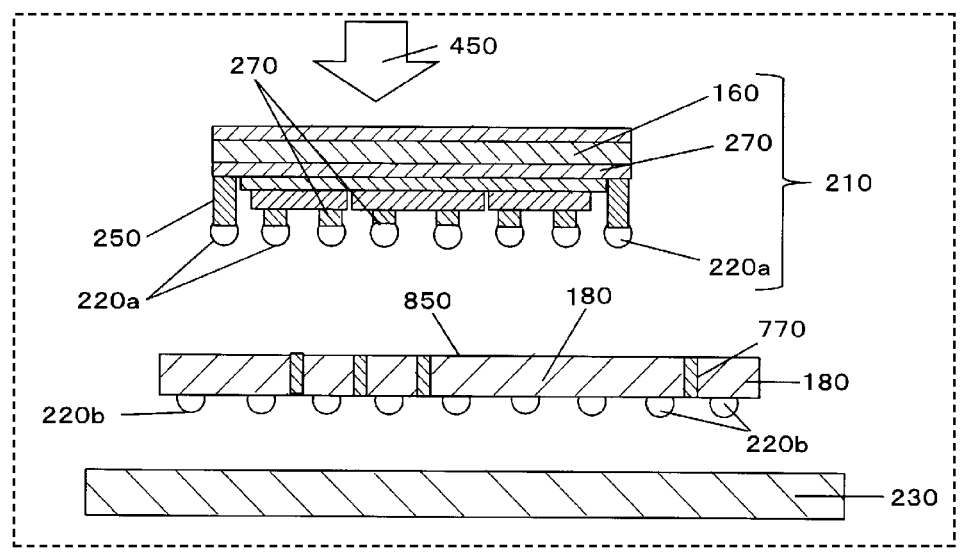
FIG. 36A is a sectional view illustrating an exemplary process of connecting the semiconductor chip and the metal plate capacitor.
Figure 36B:
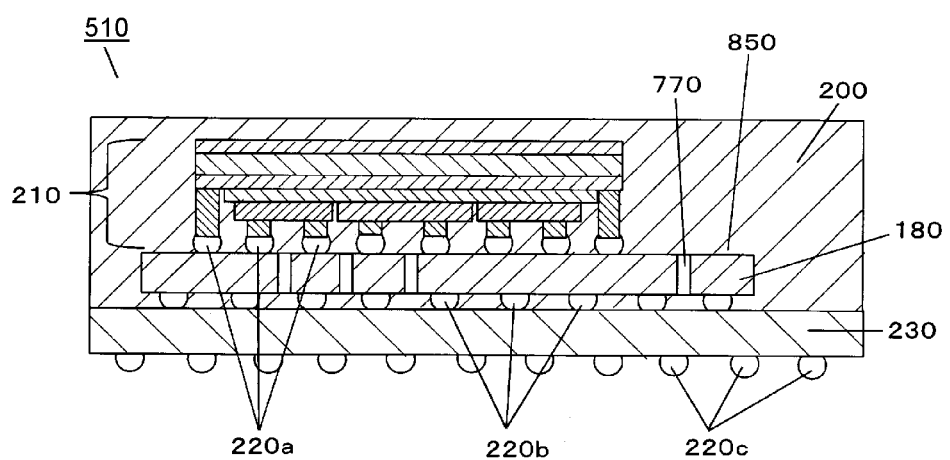
FIG. 36B is a sectional view illustrating an exemplary structure of connection between the semiconductor chip and the metal plate capacitor.

FIGS. 36A and 36B are each a sectional view illustrating an exemplary structure of connection between the semiconductor chip and the metal plate capacitor. As illustrated in FIG. 36A, bumps 220a made of solder or the like are formed on lower auxiliary electrode 250 and upper auxiliary electrode 280 of metal plate capacitor 210. In FIGS. 36A and 36B, protector 200 and the like are not illustrated.

As illustrated in FIG. 36A, through silicon via (TSV) 770 is formed in semiconductor chip 180. In FIG. 36A, face side 850 as a circuit forming surface of semiconductor chip 180 is formed on a side closer to metal plate capacitor 210. Bump 220b is provided on a side of semiconductor chip 180, which is closer to resin substrate unit 230. As illustrated with arrow 450 in FIG. 36A, metal plate capacitor 210 is mounted on face side 850 of semiconductor chip 180 and protected by protector 200 made of, for example, a molding material, which obtains package 510 illustrated in FIG. 36B.

FIG. 36B is a sectional view of an exemplary semiconductor device according to the present disclosure. As illustrated in FIG. 36B, when metal plate capacitor 210 is mounted on face side 850 of semiconductor chip 180, jitters can be reduced. Vdd, Vss, a signal, and the like are transferred to bump 220c through TSV 770 formed in semiconductor chip 180 and resin substrate unit 230.

In FIG. 36, TSV 770 may be a signal line, Vss, or Vdd to externally connect semiconductor chip 180.

Figure 37A:
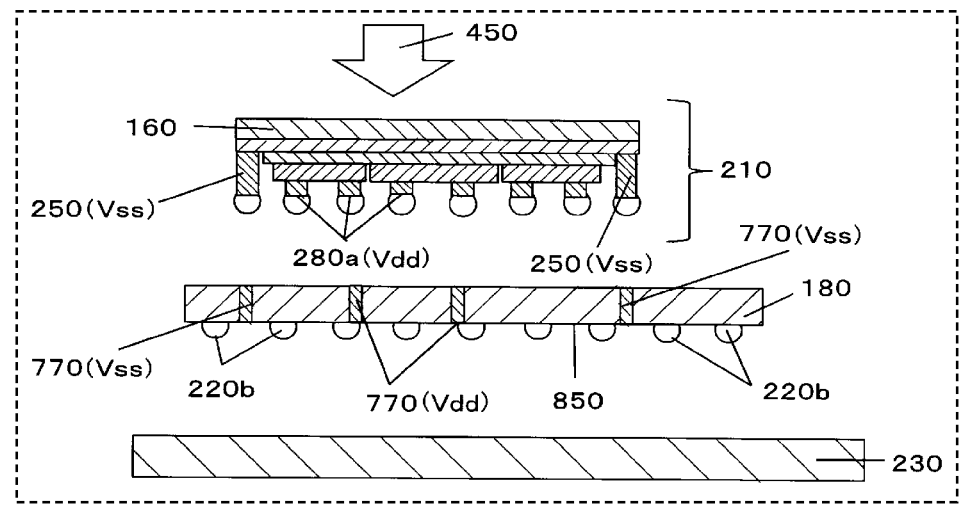
FIG. 37A is a sectional view illustrating an exemplary process of connecting the semiconductor chip and the metal plate capacitor.
Figure 37B:
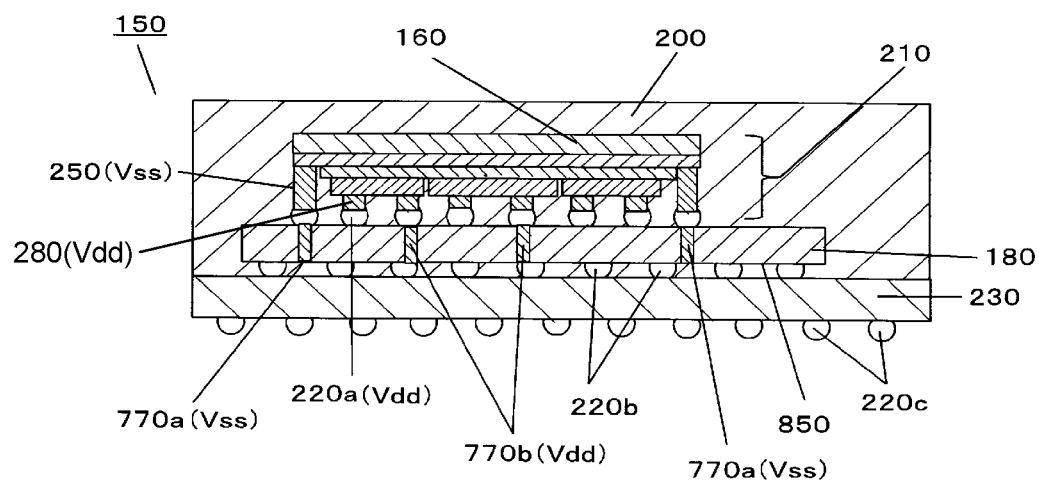
FIG. 37B is a sectional view illustrating an exemplary structure of connection of the semiconductor chip and the metal plate capacitor with the resin substrate.

FIGS. 37A and 37B are each a sectional view illustrating an exemplary structure of connection between the semiconductor chip and the metal plate capacitor. As illustrated in FIG. 37A, bump 220a made of solder or the like is formed on lower auxiliary electrode 250 and upper auxiliary electrode 280 of metal plate capacitor 210.

As illustrated in FIG. 37A, TSV 770 is formed in semiconductor chip 180. In FIG. 37A, face side 850 as a circuit forming surface of semiconductor chip 180 is formed on a side closer to resin substrate unit 230. Bump 220b is provided on a side of semiconductor chip 180, which is closer to resin substrate unit 230. As illustrated with arrow 450 in FIG. 37A, metal plate capacitor 210 is mounted on a side of semiconductor chip 180, which is opposite to face side 850, and protected by protector 200 made of, for example, molding material, which obtains package 510 illustrated in FIG. 36B.

As illustrated in FIG. 37B, metal plate capacitor 210 is connected on the side of semiconductor chip 180, which is different from face side 850, through bump 220a. TSV 770 formed in semiconductor chip 180 may be provided to connect Vss and Vdd between metal plate capacitor 210 and semiconductor chip 180. For example, lower auxiliary electrode 250 may be set to Vss, and accordingly, TSV 770a electrically connected with lower auxiliary electrode 250 may be set to Vss. Upper auxiliary electrode 280 may be set to Vdd, and accordingly TSV 770b electrically connected with upper auxiliary electrode 280 may be set to Vdd.

In the structures illustrated in FIGS. 21, 23A, 23B, 24, 36A, 36B, 37A, 37B, 38A, 38B, 38C, and the like as well as the structure illustrated in FIG. 37B, one surface of heat-resistant metal plate 160 may be exposed from protector 200. When one surface of heat-resistant metal plate 160 is exposed from protector 200, an improved heat radiating property can be obtained. An electrically insulating and highly thermally conductive material (for example, a thermally conductive material obtained by adding, to thermosetting epoxy resin, highly thermally conductive ceramic powder of, for example, alumina or magnesia) of 10 μm to 500 μm approximately is applied and cured on the surface of heat-resistant metal plate 160. With this configuration, a heat sink and the like can be fixed directly onto the surface of heat-resistant metal plate 160 without performing, for example, insulation processing.

Figure 38A:
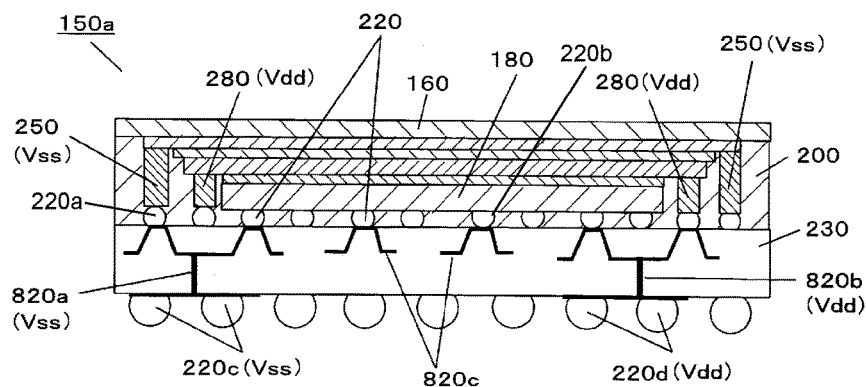
FIG. 38A is a sectional view illustrating an exemplary structure of connection between the semiconductor chip and the metal plate capacitor.
Figure 38B:
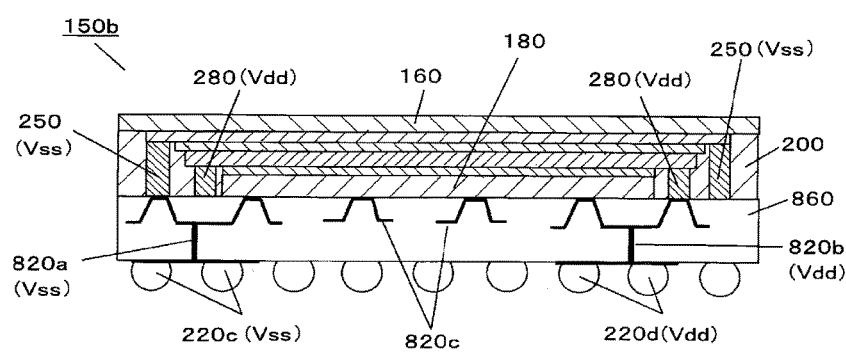
FIG. 38B is a sectional view illustrating an exemplary structure of connection of the semiconductor chip and the metal plate capacitor with a buildup substrate.
Figure 38C:
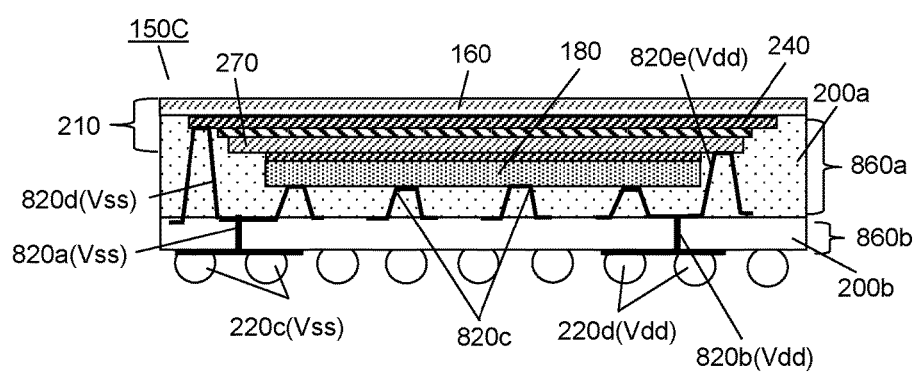
FIG. 38C is a sectional view illustrating an exemplary structure of connection between the semiconductor chip and the metal plate capacitor.

FIGS. 38A, 38B, and 38C are each a sectional view illustrating an exemplary structure of connection between the semiconductor chip and metal plate capacitor, illustrating an exemplary CSP or WLCSP.

FIG. 38A is a sectional view illustrating an exemplary semiconductor device in which semiconductor chip 180 and metal plate capacitor 210 are electrically connected, through bumps 220b and 220a, on resin substrate unit 230 including internal wire 820a (internal wire 820a may be Vss) and internal wire 820b (internal wire 820b may be Vdd). As illustrated in FIG. 38A, semiconductor chip 180 is fixed onto resin substrate unit 230 on which internal wires 820a and 820b are formed. In addition, metal plate capacitor 210 is fixed on semiconductor chip 180 by using die attachment 340 and the like. Bump 220b is used for connection between semiconductor chip 180 and resin substrate unit 230, and bump 220a is used for connection between metal plate capacitor 210 and resin substrate unit 230. Then, protection is provided by protector 200 made of, for example, molding resin, which obtains semiconductor device 150a illustrated in FIG. 38A.

FIG. 38B is a sectional view of semiconductor device 150b obtained by providing buildup wiring portion 860 after semiconductor chip 180 and metal plate capacitor 210 are molded by protector 200. In semiconductor device 150b illustrated in FIG. 38B, internal wire 820a (internal wire 820a may be Vss) and internal wire 820b (internal wire 820b may be Vdd) are formed in buildup wiring portion 860 by using a buildup technique. Bumps 220c and 220d are formed on a surface of buildup wiring portion 860. As illustrated in FIG. 38B, semiconductor chip 180 and metal plate capacitor 210 are directly connected with internal wires 820a and 820b, thereby achieving improved connection reliability.

As illustrated in FIGS. 38A, 38B, and 38C, bump 220c is exposed on one surface of semiconductor device 150, and heat-resistant metal plate 160 is exposed on the other surface of semiconductor device 150. Lower auxiliary electrode 250 formed on lower electrode 240 of metal plate capacitor 210 transfers Vss to internal wire 820a formed in resin substrate unit 230. Upper auxiliary electrode 280 formed on upper electrode 270 of metal plate capacitor 210 transfers Vdd to internal wire 820b formed in resin substrate unit 230.

FIG. 38C is a sectional view of semiconductor device 150C, illustrating another exemplary structure of connection between the semiconductor chip and the metal plate capacitor. Semiconductor chip 180 and metal plate capacitor 210 are molded by protector 200a to form buildup wiring portion 860a. Unlike FIG. 38B, upper auxiliary electrode 280 and lower auxiliary electrode 250 are not formed, but through-holes are formed at parts of buildup wiring portion 860a at which internal wires 820c, 820d, and 820e are to be formed, and then internal wires 820c, 820d, and 820e are formed by Cu plating. Internal wires 820d and 820e are directly connected with lower electrode 240 and upper electrode 270, respectively. Then, buildup wiring portion 860b is formed through further molding by protector 200b. Through-holes are formed at parts at which internal wires 820a and 820b are to be formed, and internal wires 820a and 820b are formed by Cu plating and connected with bumps 220c and 220d.

As illustrated in FIGS. 38A, 38B, and 38C, when semiconductor chip 180 and metal plate capacitor 210 are adhered to each other, ESR and ESL can be reduced. In addition, heat generated in semiconductor chip 180 can be externally released in an efficient manner.

Sixth Exemplary Embodiment

The following describes, as a sixth exemplary embodiment, stacking of a plurality of semiconductor chips in a semiconductor device, and multiple layers of metal plate capacitors with reference to FIGS. 39 to 42C.

Figure 39:
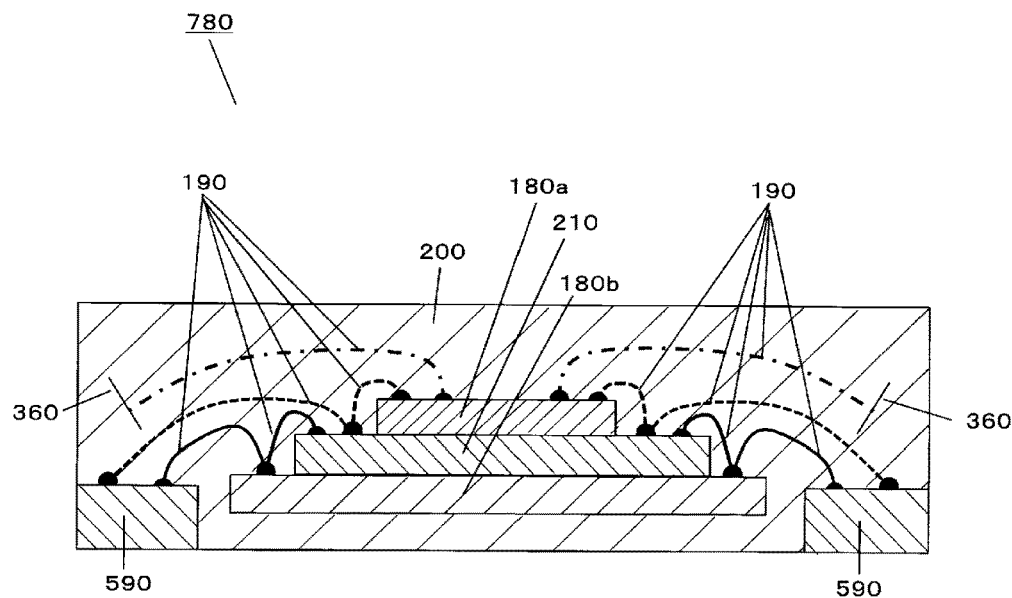
FIG. 39 is a sectional view for description of an exemplary semiconductor device in which semiconductor chips are provided above and below the metal capacitor.

FIG. 39 is a sectional view for description of an exemplary semiconductor device in which semiconductor chips are provided above and below a metal plate capacitor. Semiconductor device 780 illustrated in FIG. 39 has a QFN form, but may have a PBGA or QFP form. In semiconductor device 780, semiconductor chip 180a and semiconductor chip 180b are stacked above and below metal plate capacitor 210 through die attachment 340 (not illustrated) and the like.

As illustrated in FIG. 39, when metal plate capacitor 210 and a plurality of semiconductor chips 180 are stacked, downsizing of semiconductor device 780 can be achieved.

In FIG. 39, semiconductor chip 180a and metal plate capacitor 210, and semiconductor chip 180b and metal plate capacitor 210 are connected with each other through connector 190 including, for example, a wire. Similarly, semiconductor chip 180a and semiconductor chip 180b, and semiconductor chip 180a and lead frame 590, and any other components are connected with each other through connector 190 including, for example, a wire. For example, whether connector 190 is a Vdd line (in other words, a negative power-supply voltage line of a MOS element), a Vss line (in other words, a power-supply voltage line of a MOS element), or a signal line may be designed as appropriate.

Lead frame 590 illustrated in FIG. 39 has a QFN form, and thus does not protrude from protector 200 made of, for example, molding resin, but does not need to be limited to the QFN form.

Figure 40:
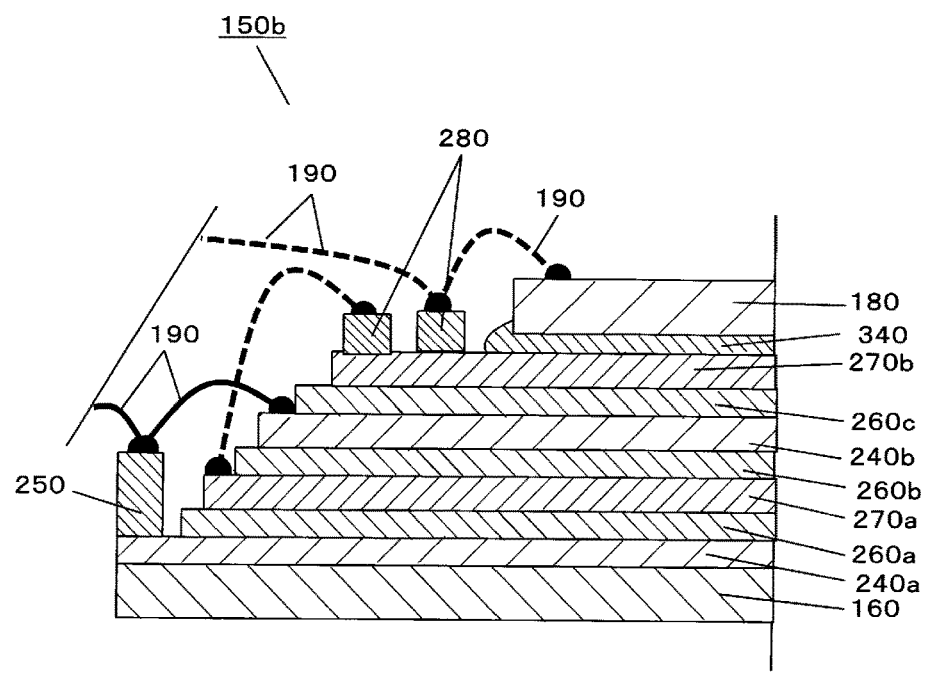
FIG. 40 is a sectional view of an exemplary metal capacitor obtained by stacking a plurality of sintered dielectrics on one heat-resistant metal plate.

The following describes, with reference to FIG. 40, a case in which a plurality of layers of sintered dielectrics 260 are provided in metal plate capacitor 210 of semiconductor device 150b.

FIG. 40 is a sectional view of an exemplary metal plate capacitor in which a plurality of sintered dielectrics are stacked on one heat-resistant metal plate. In FIG. 40, protector 200 and the like are not illustrated.

As illustrated in FIG. 40, lower electrode 240a, sintered dielectric 260a, upper electrode 270a, sintered dielectric 260b, lower electrode 240b, sintered dielectric 260c, and upper electrode 270b are formed on one heat-resistant metal plate 160 in this order from the bottom. In addition, lower auxiliary electrode 250 is provided on a surface of lower electrode 240a directly provided on heat-resistant metal plate 160. Upper auxiliary electrode 280 is provided on a surface of topmost upper electrode 270b. Then, semiconductor chip 180 is fixed onto topmost upper electrode 270b through die attachment 340. Then, semiconductor chip 180, upper electrode 270b, upper electrode 270a, lower electrode 240a, and lower electrode 240b are wired by using connectors 190 each including, for example, a wire through parallel connection with the capacitor part.

In FIG. 40, the capacitor can have an increased capacity through parallel wiring with the capacitor part, but the wiring through connector 190 at the capacitor part may be changed depending on usage.

In FIG. 40, when upper auxiliary electrode 280 (not illustrated) is provided on surfaces of upper electrode 270b, upper electrode 270a, and the like, lower auxiliary electrode 250 (not illustrated) is provided on surfaces of lower electrode 240a, lower electrode 240b, and the like, and connectors 190 each including, for example, a wire are connected with upper auxiliary electrode 280 and lower auxiliary electrode 250, influence on sintered dielectric 260a and sintered dielectric 260b can be reduced.

The following describes, with reference to FIGS. 41A to 42C, an exemplary method for manufacturing a metal plate capacitor in which a plurality of sintered dielectrics are provided on one heat-resistant metal plate.

Figure 41A:
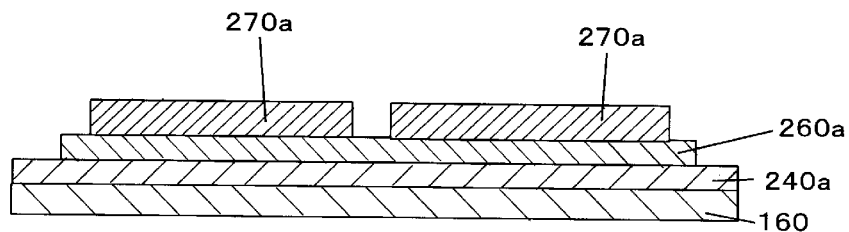
FIG. 41A is a sectional view for description of one process among a series of processes of an exemplary method for manufacturing a metal capacitor in which a plurality of sintered dielectrics are provided on one heat-resistant metal plate.
Figure 41B:
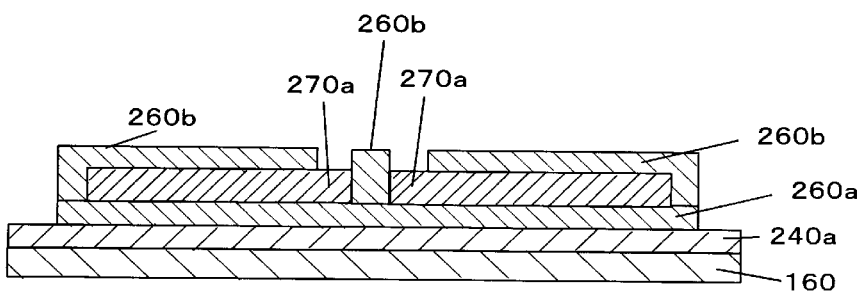
FIG. 41B is a sectional view for description of one process among the series of processes of an exemplary method for manufacturing a metal capacitor in which a plurality of sintered dielectrics are provided on one heat-resistant metal plate.
Figure 41C:
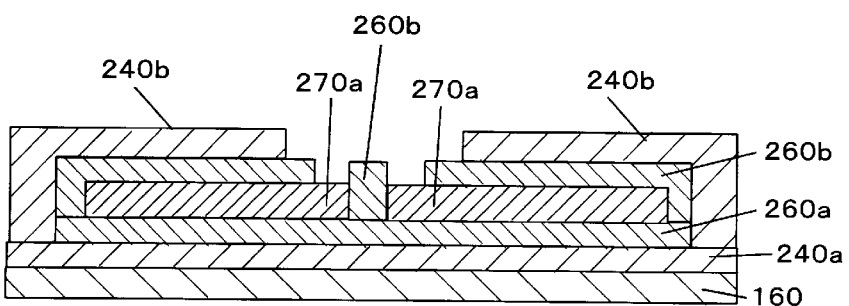
FIG. 41C is a sectional view for description of one process among the series of processes of an exemplary method for manufacturing a metal capacitor in which a plurality of sintered dielectrics are provided on one heat-resistant metal plate.

FIGS. 41A to 41C are each a sectional view for description of an exemplary method for manufacturing a metal plate capacitor in which a plurality of layers of sintered dielectrics are provided on one heat-resistant metal plate.

As illustrated in FIG. 41A, lower electrode 240a, sintered dielectric 260a, and upper electrode 270a are provided on heat-resistant metal plate 160.

Next, as illustrated in FIG. 41B, sintered dielectric 260b is provided on upper electrode 270a. As illustrated in FIG. 41B, when sintered dielectric 260b is provided between a plurality of upper electrodes 270a, the insulating property between a plurality of upper electrodes 270a can be maintained.

Next, as illustrated in FIG. 41C, lower electrode 240b is provided on sintered dielectric 260b.

The following description will be made with reference to FIGS. 42A to 42C.

Figure 42A:
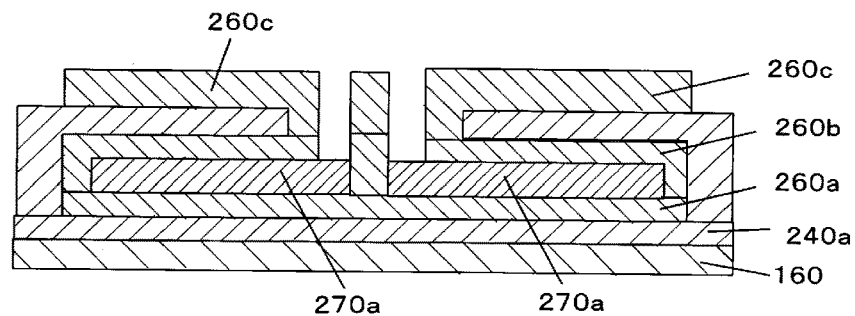
FIG. 42A is a sectional view for description of one process among the series of processes of an exemplary method for manufacturing a metal capacitor in which a plurality of sintered dielectrics are provided on one heat-resistant metal plate.
Figure 42B:
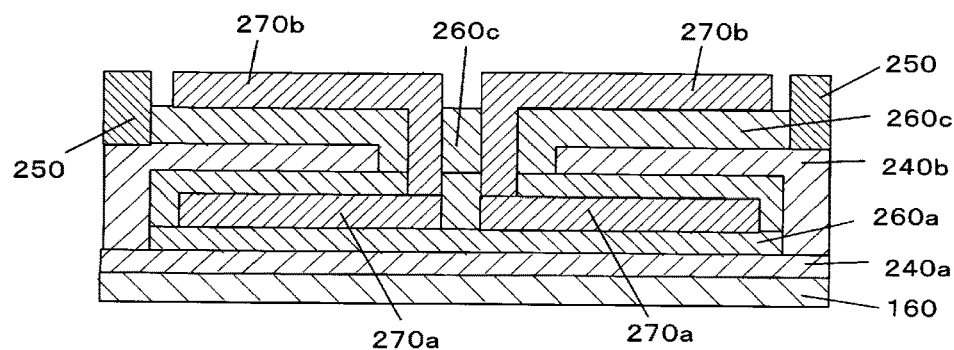
FIG. 42B is a sectional view for description of one process among the series of processes of an exemplary method for manufacturing a metal capacitor in which a plurality of sintered dielectrics are provided on one heat-resistant metal plate.
Figure 42C:
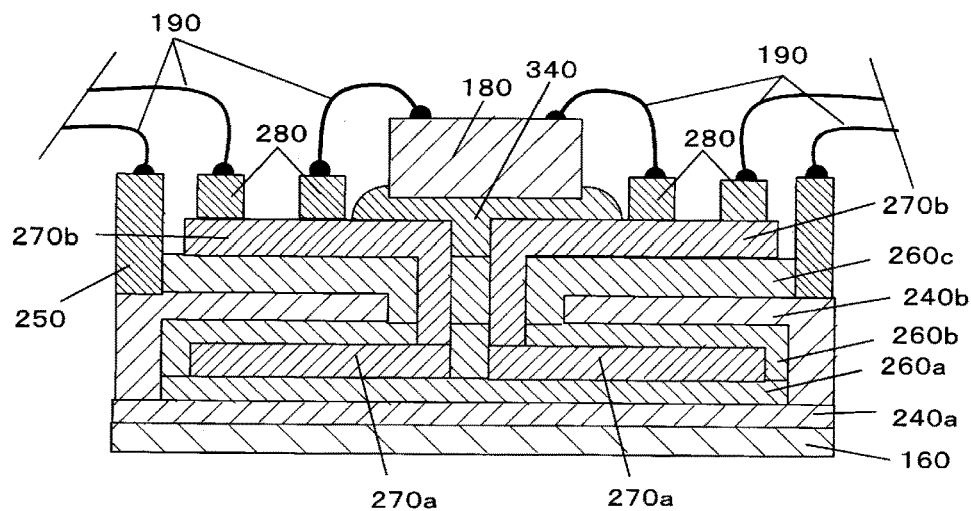
FIG. 42C is a sectional view for description of one process among the series of processes of an exemplary method for manufacturing a metal capacitor in which a plurality of sintered dielectrics are provided on one heat-resistant metal plate.

FIGS. 42A to 42C are each a sectional view for description of an exemplary method for manufacturing a metal plate capacitor in which a plurality of sintered dielectrics are provided on one heat-resistant metal plate, and this method can be performed after the process illustrated in FIGS. 41A to 41C.

As illustrated in FIG. 42A, sintered dielectric 260c is provided on lower electrode 240b.

As illustrated in FIG. 42B, upper electrode 270b is provided on sintered dielectric 260c.

As illustrated in FIG. 42C, die attachment 340 is formed on topmost upper electrode 270b, and semiconductor chip 180 is mounted on upper electrode 270b through die attachment 340. Then, lower auxiliary electrode 250 is provided on lower electrode 240b, and upper auxiliary electrode 280 is provided on upper electrode 270b. Thereafter, these components are electrically connected with each other through connector 190 including, for example, a wire. Thereafter, protector 200 made of, for example, molding resin is formed to obtain the semiconductor device described above with reference to FIGS. 2, 20A, and 20B.

As illustrated in FIG. 40, connection between stacked capacitors may be achieved through connector 190 including, for example, a wire, or through a device such as a printed pattern as illustrated in FIGS. 42A to 42C.

Seventh Exemplary Embodiment

The following describes, as a seventh exemplary embodiment, a configuration for description of mounting of semiconductor chip 180 into a through-hole provided to metal plate capacitor 210 with reference to FIGS. 43A to 44C. In FIG. 16 described above, bottomed opening 520 is formed in metal plate capacitor 210, and semiconductor chip 180 is housed in bottomed opening 520. However, in FIGS. 43A to 44C, through-hole 790 is formed in metal plate capacitor 210, and semiconductor chip 180 is housed in the through-hole.

FIGS. 43A to 43D are each a sectional view for description of mounting of the semiconductor chip into the through-hole provided to the metal plate capacitor.

Figure 43A:
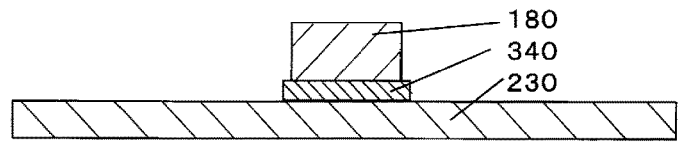
FIG. 43A is a sectional view for description of one process among a series of processes in which the semiconductor chip is mounted into a through-hole provided to the metal plate capacitor.

As illustrated in FIG. 43A, resin substrate unit 230 is prepared, and then semiconductor chip 180 is fixed onto resin substrate unit 230 through die attachment 340.

Figure 43B:
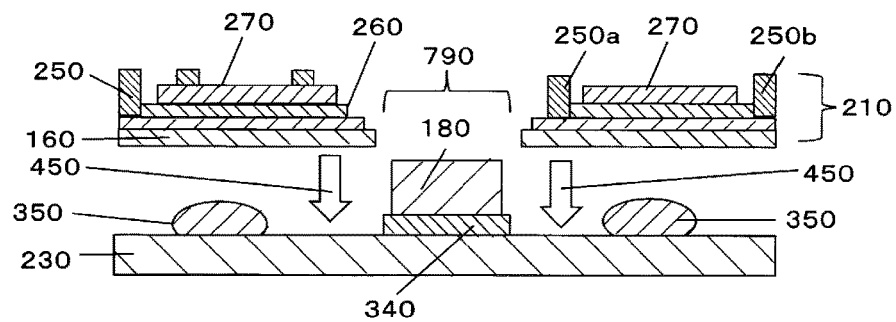
FIG. 43B is a sectional view for description of one process among the series of processes in which the semiconductor chip is mounted into a through-hole provided to the metal plate capacitor.

As illustrated in FIG. 43B, metal plate capacitor 210 in which through-hole 790 into which semiconductor chip 180 can be inserted is formed is prepared. Then, bonding member 350 is formed on resin substrate unit 230 to which semiconductor chip 180 is fixed, and metal plate capacitor 210 in which through-hole 790 is formed is set on resin substrate unit 230 through bonding member 350.

Figure 43C:
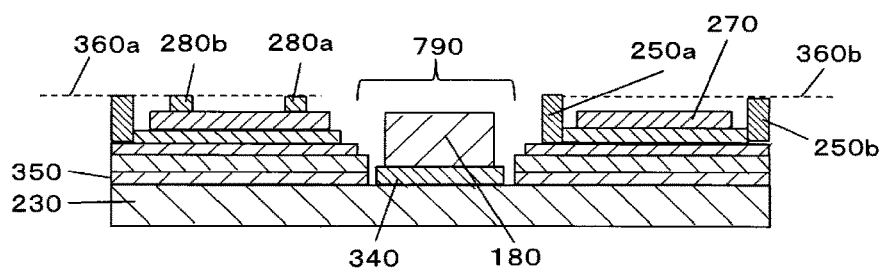
FIG. 43C is a sectional view for description of one process among the series of processes in which the semiconductor chip is mounted into a through-hole provided to the metal plate capacitor.

As illustrated in FIG. 43C, semiconductor chip 180 and metal plate capacitor 210 are fixed onto resin substrate unit 230. After metal plate capacitor 210 is fixed on resin substrate unit 230 through bonding member 350, semiconductor chip 180 may be fixed into through-hole 790 formed in metal plate capacitor 210, by using die attachment 340 and the like. In this manner, a fixation order of semiconductor chip 180 and metal plate capacitor 210 in which through-hole 790 is formed may be optimized as necessary.

FIG. 43C illustrates formation of connectors 190 each including, for example, a wire on metal plate capacitor 210 fixed onto resin substrate unit 230, and semiconductor chip 180. As illustrated with auxiliary line 360a in FIG. 43C, it is advantageous to align the height of upper auxiliary electrode 280a closer to semiconductor chip 180, and the height of upper auxiliary electrode 280b farther away from semiconductor chip 180. As illustrated with auxiliary line 360b in FIG. 43C, it is also advantageous that lower auxiliary electrode 250a is provided closer to semiconductor chip 180 to have a height aligned with the height of lower auxiliary electrode 250b farther away from semiconductor chip 180.

Figure 43D:
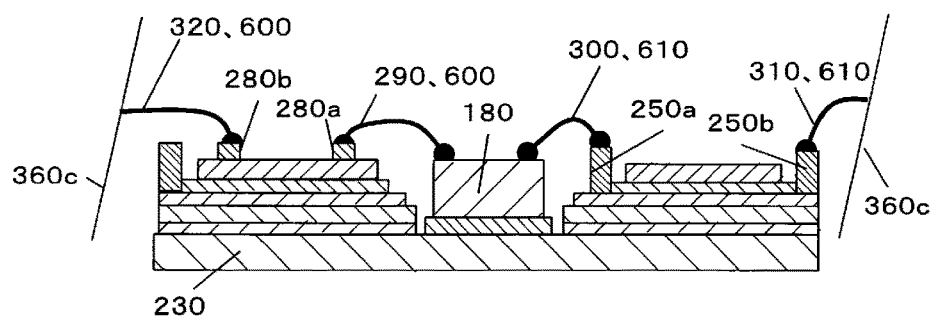
FIG. 43D is a sectional view for description of one process among the series of processes in which the semiconductor chip is mounted into a through-hole provided to the metal plate capacitor.

FIG. 43D illustrates that upper chip connector 290 is provided between upper auxiliary electrode 280a and semiconductor chip 180. Upper chip connector 290 may be Vdd line 600. Upper land connector 320 for connecting upper auxiliary electrode 280b with land electrode 480 (omitted in illustration by using auxiliary line 360c) provided on resin substrate unit 230 or with lead frame 590 (omitted in illustration by using auxiliary line 360c) is provided. Upper land connector 320 may be Vdd line 600. Semiconductor chip 180 and lower auxiliary electrode 250a may be connected with each other through lower chip connector 300, and lower auxiliary electrode 250b may be connected, through lower land connector 310, with land electrode 480 (omitted in illustration by using auxiliary line 360c) provided on resin substrate unit 230 or lead frame 590 (omitted in illustration by using auxiliary line 360c). Lower chip connector 300 or lower land connector 310 may be Vss line 610. Thereafter, protector 200 made of, for example, molding resin is provided to obtain semiconductor device 150 illustrated in FIG. 2 described above, semiconductor device 580 illustrated in FIGS. 20A, 20B, 23A, and FIG. 23B, or semiconductor device 780 illustrated in FIG. 39.

As illustrated in FIG. 43D, heat-resistant metal plate 160 includes through-hole 790 into which semiconductor chip 180 is inserted. Upper electrode 270, sintered dielectric 260, and lower electrode 240 are formed around through-hole 790. Semiconductor chip 180 is disposed in through-hole 790.

Figure 44A:
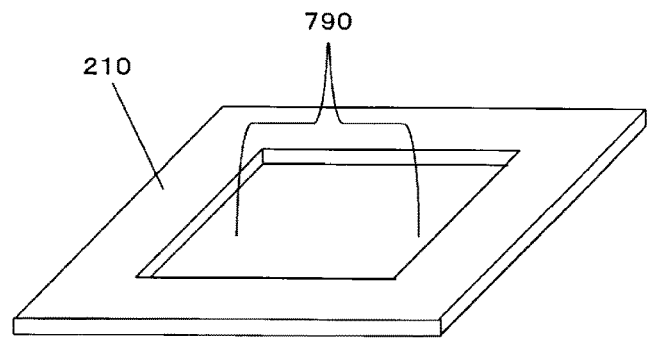
Figure 44B:
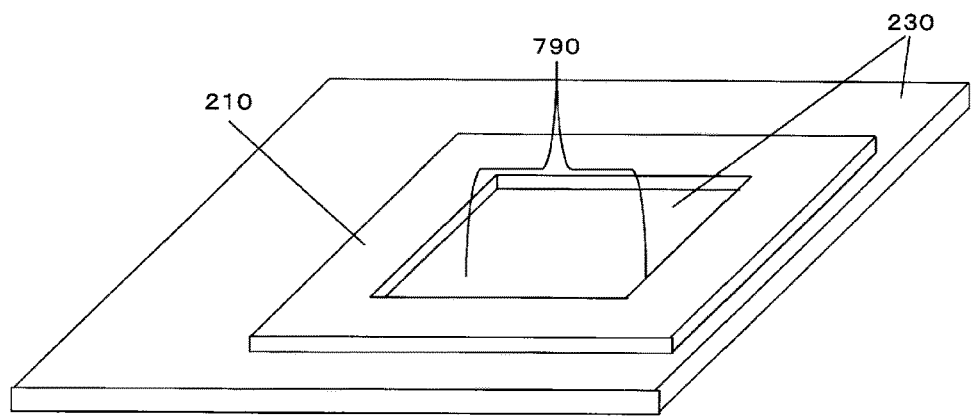
Figure 44C:
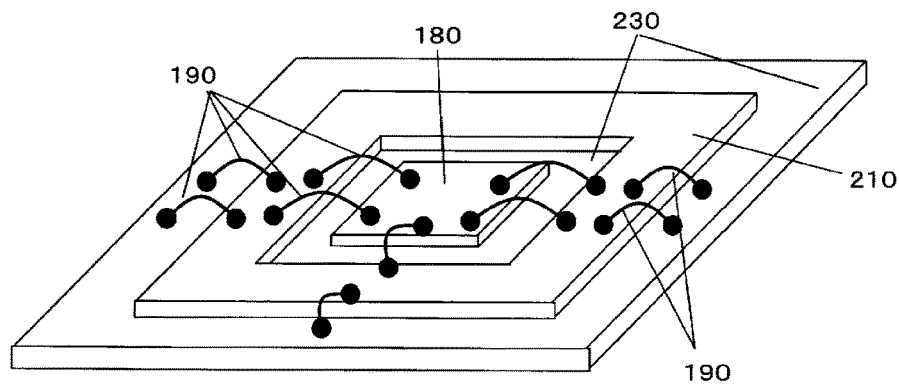

FIGS. 44A to 44C are each a perspective view for description of a case in which a through-hole into which at least one semiconductor chip can be inserted is formed at a central part or the like of the metal plate capacitor.

As illustrated in FIG. 44A, metal plate capacitor 210 including, at a central part or the like, through-hole 790 into which at least one semiconductor chip can be inserted is prepared. Through-hole 790 may penetrate through heat-resistant metal plate 160 (not illustrated). A non-defective product an electric characteristic and the like of which are already checked on whether there is a problem with sintered dielectric 260 (not illustrated) and the like is used as metal plate capacitor 210.

As illustrated in FIG. 44B, the metal plate capacitor including through-hole 790 is fixed onto the surface of resin substrate unit 230 through bonding member 350 (not illustrated). Thereafter, semiconductor chip 180 is fixed onto the surface of resin substrate unit 230 exposed in through-hole 790 by using die attachment 340 (not illustrated) and the like. Thereafter, semiconductor chip 180 is electrically connected, through connectors 190 each including, for example, a wire, with upper electrode 270, upper auxiliary electrode 280 (both not illustrated), lower electrode 240, and lower auxiliary electrode 250 of metal plate capacitor 210, land electrode 480 on the surface of resin substrate unit 230, and the like. Lead frame 590 or the like may be used in place of resin substrate unit 230. Thereafter, protector 200 made of, for example, molding resin is provided to obtain semiconductor device 150 illustrated in FIG. 2 described above, semiconductor device 580 illustrated in FIGS. 20A, 20B, 23A, and FIG. 23B, or semiconductor device 780 illustrated in FIG. 39.

With the structure illustrated in FIG. 44C, an improved jitter characteristic and further reduction in thickness are achieved for semiconductor device 150 illustrated in FIG. 2 described above, semiconductor device 580 illustrated in FIGS. 20A, 20B, 23A, and 23B, semiconductor device 780 illustrated in FIG. 39.

Figure 45A:
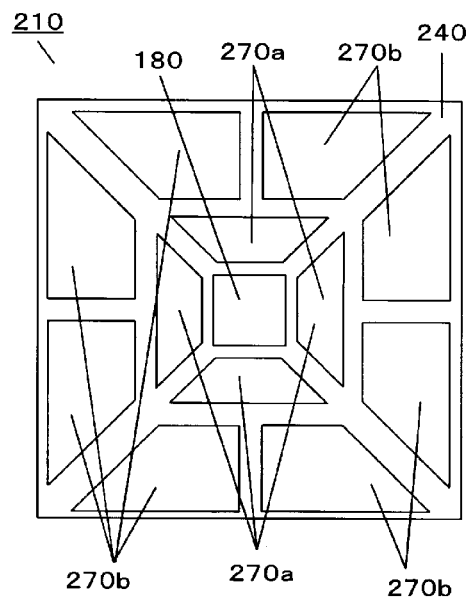
FIG. 45A is a top view of the metal plate capacitor.
Figure 45B:
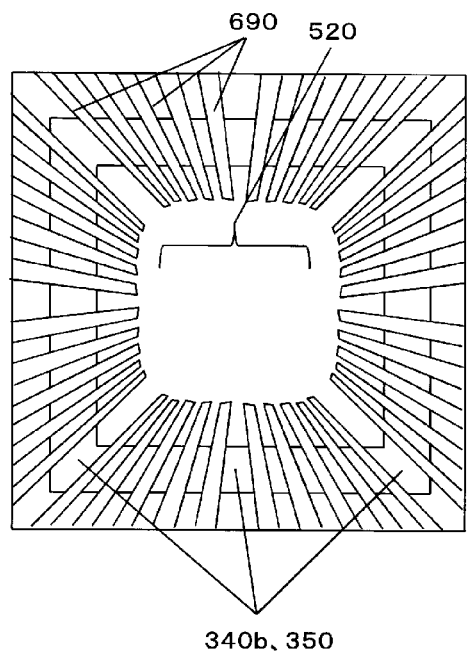
FIG. 45B is a top view of a leading end part of the lead frame.
Figure 45C:
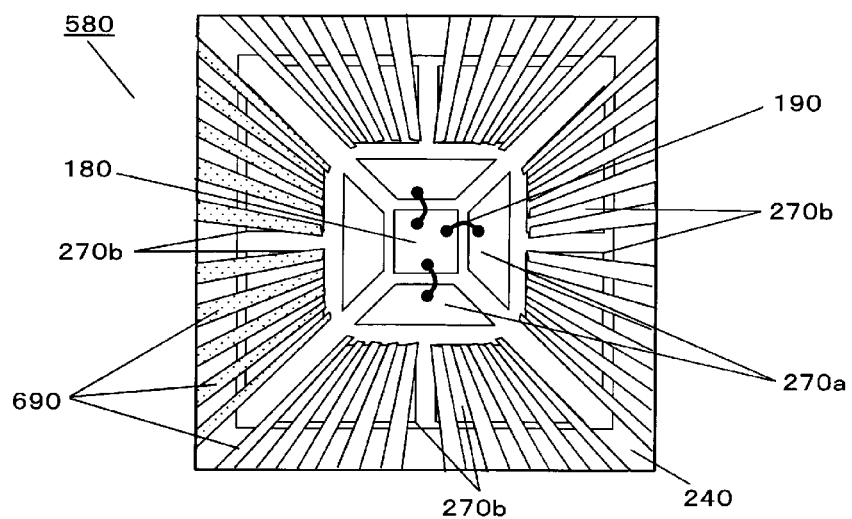
FIG. 45C is a top view for description of downsizing of the semiconductor device achieved when part of the lead frame and part of the metal plate capacitor are placed over each other.
Figure 46:
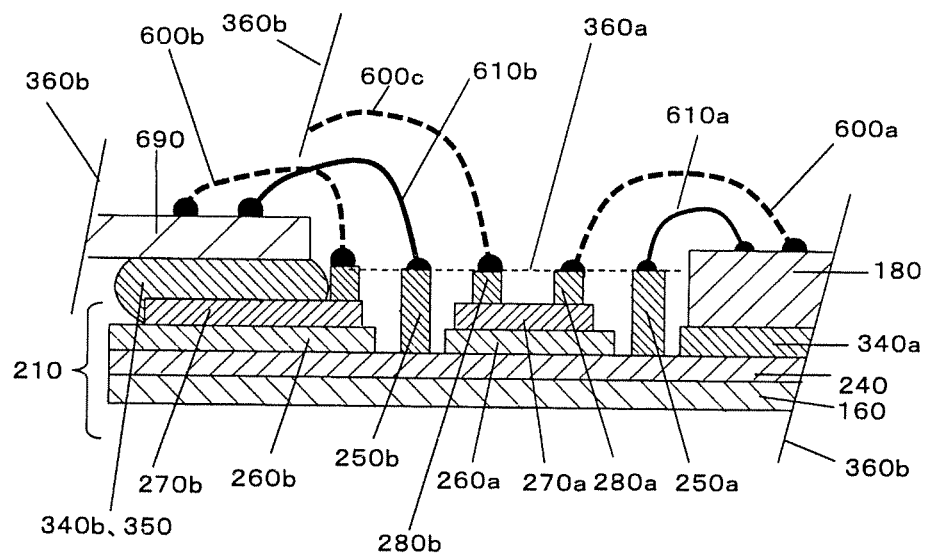
FIG. 46 is a sectional view for description of exemplary connection among the semiconductor chip in FIG. 45C, the upper electrode and the lower electrode of the metal plate capacitor, and the lead frame through, for example, a wire.

The following describes, with reference to FIGS. 45A to 46, downsizing of the semiconductor device achieved when part of the lead frame and part of the metal plate capacitor are placed over each other.

FIGS. 45A to 45C are each a top view for description of downsizing of the semiconductor device achieved when part of the lead frame and part of the metal plate capacitor are placed over each other.

FIG. 45A is a top view of the metal plate capacitor before the lead frame is placed over. In FIG. 45A, a plurality of upper electrodes 270a and 270b are formed in a polygonal ring shape around semiconductor chip 180 at a central part.

As illustrated in FIG. 45A, a plurality of upper electrodes 270a are provided around semiconductor chip 180. A plurality of upper electrodes 270b are formed around a plurality of upper electrodes 270a at a peripheral part of metal plate capacitor 210. Upper electrodes 270b may be parts over which lead frame leading end part 690 that is part of the lead frame is placed.

FIG. 45B is a top view of lead frame leading end part 690 that is part of the lead frame placed over metal plate capacitor 210. Polyimide portion 680 (not illustrated) may be provided to prevent reduction in the accuracy of a position interval or the like of lead frame leading end part 690. In FIG. 45B, die attachment 340 or bonding member 350 is formed on a lower side of lead frame leading end part 690, which is closer to metal plate capacitor 210. However, die attachment 340 or bonding member 350 may be provided on a surface of metal plate capacitor 210 illustrated in FIG. 45A. Opening 520 is formed being surrounded by lead frame leading end part 690. Semiconductor chip 180 and upper electrodes 270a formed around semiconductor chip 180 are installed being exposed in opening 520.

FIG. 45C is a top view after the lead frame illustrated in FIG. 45B is stacked and fixed on metal plate capacitor 210 illustrated in FIG. 45A. As illustrated in FIG. 45C, lead frame leading end part 690 is placed over upper electrode 270b of metal plate capacitor 210 and fixed through die attachment 340 or bonding member 350. In FIG. 45C, die attachment 340 or bonding member 350 are not illustrated to indicate a positional relation between lead frame leading end part 690 and upper electrode 270b. Thereafter, semiconductor chip 180 is electrically connected with upper electrode 270a and the like through connectors 190 each including, for example, a wire.

FIG. 46 is a sectional view for description of exemplary connection among the semiconductor chip in FIG. 45C, the upper and lower electrodes of the metal plate capacitor, and the lead frame through wires or the like. In FIG. 46, protector 200 and the like are not illustrated.

As illustrated in FIG. 46, metal plate capacitor 210 includes at least upper electrode 270a closer to semiconductor chip 180 and upper electrode 270b provided over lead frame leading end part 690. Lead frame leading end part 690 is fixed onto upper electrode 270b through electrically insulating die attachment 340 or bonding member 350. The use of electrically insulating die attachment 340 or bonding member 350 allows Vdd 600b at a voltage different from a voltage at upper electrode 270b, Vss 610b, a signal line (Vdd 600c), and the like to be individually connected with a plurality of lead frame leading end parts 690.

For example, semiconductor chip 180 and lower auxiliary electrode 250a are connected with each other through Vss line 610a. Lower auxiliary electrode 250a and lower auxiliary electrode 250b are connected with each other through lower electrode 240. Lower auxiliary electrode 250b and lead frame leading end part 690 are connected with each other through Vss line 610b.

Similarly, semiconductor chip 180 and upper auxiliary electrode 280a are connected with each other through Vdd line 600a. Upper auxiliary electrode 280a and upper auxiliary electrode 280b are connected with each other through upper electrode 270a. In addition, upper electrode 270b provided over lead frame leading end part 690 is connected with lead frame leading end part 690 through Vdd line 600b. Upper auxiliary electrode 280b and another lead frame leading end part 690 (not illustrated) are connected with each other through Vdd line 600c and the like. In this manner, these wires can be connected at shortest distances, thereby achieving reduction in ESL and ESR of the wires. Thereafter, protector 200 made of, for example, molding resin is provided to obtain semiconductor device 580 illustrated in FIGS. 20A, 20B, 23A, and 23B or semiconductor device 780 illustrated in FIG. 39 described above.

In FIG. 46, it is advantageous to use double wire 490 (not illustrated in FIG. 46) described above with reference to FIG. 21 for connection of lead frame leading end part 690 with upper auxiliary electrode 280b, lower auxiliary electrode 250b, or the like.

As described above with reference to FIGS. 44A to 45C, upper electrode 270b and the like are provided over lead frame leading end part 690. With this configuration, an improved jitter characteristic and further downsizing can be achieved for semiconductor device 580 illustrated in FIGS. 20A, 20B, 23A, and 23B, semiconductor device 780 illustrated in FIG. 39 described above and the like.

Eighth Exemplary Embodiment

The following describes, in an eighth exemplary embodiment, an example (disclosed product) achieved by the inventors, and a comparative example (comparative product 1, comparative product 2) for studying an effect of the example.

Table 1 lists results of an experiment performed on disclosed product 1 and comparative product 1 by the inventors when disclosed product 1 is an example including resin substrate unit 230 illustrated in FIG. 2 and the like described above and comparative product 1 is a comparative example including resin substrate unit 230. In Table 1, disclosed product 1 is semiconductor device 150 having a form of PBGA or the like illustrated in FIG. 2 described above. Comparative product 1 corresponds to the sample illustrated in FIGS. 19A, 19B, and 20B described above.

In addition, Table 2 lists results of an experiment performed on disclosed product 2 and comparative product 2, when disclosed product 2 is an example including lead frame 590 for resin substrate unit 230 illustrated in FIGS. 20A and 20B described above and the like, and comparative product 2 is comparative example including lead frame 590. In Table 2, disclosed product 2 is semiconductor device 580 having a form of QFP or the like illustrated in FIGS. 20A and 21 described above. Comparative product 2 corresponds to the sample illustrated in FIGS. 27 and 28 described above.

Table 1 to Table 4 list exemplary trial production results in the first to seventh exemplary embodiments performed by the inventors.

TABLE 1

State of sintered dielectric after thermal processing (using resin substrate unit)

|  | Disclosed Product 1 (FIG. 2) | Comparative Product 1 (FIGS. 18 and 19) |
|---|---|---|
| Crack of Dielectric | Good (no crack) | NG (crack generated) |
| Peel-off of Dielectric | Good (no peel-off) | NG (peel-off generated) |
| Capacitor Characteristic | Good (capacitor function achieved) | NG (capacitor function not achieved) |

TABLE 2

State of sintered dielectric after thermal processing (using lead frame)

|  | Disclosed Product 2 (FIG. 20A) | Comparative Product 2 (FIGS. 27 and 28) |
|---|---|---|
| Crack in Dielectric | Good (no crack) | NG (crack generated) |
| Peel-off of Dielectric | Good (no peel-off) | NG (peel-off generated) |
| Capacitor Characteristic | Good (capacitor function achieved) | NG (capacitor function not achieved) |

In Table 1 and Table 2 above, crack of sintered dielectric indicates an appearance state of sintered dielectric 260 obtained through baking at 850° C. to 950° C. As indicated in Table 1 and Table 2, no crack nor peel-off were generated in sintered dielectric 260 for disclosed product 1 and disclosed product 2 (Good; non-defective product). A capacitor produced by using sintered dielectric 260 indicated a predetermined capacitor characteristic.

However, in comparative product 1 including resin substrate unit 230, the problem illustrated in FIGS. 19A, 19B, and 20B described above occurred as crack, deformation, peel-off, and the like of sintered dielectric 260. Similarly, in comparative product 2 even including lead frame 590, crack, deformation, peel-off, and the like of sintered dielectric 260 were generated as illustrated in FIGS. 27 and 28 described above. In comparative products 1 and 2, the capacitor did not function due to the generated crack, deformation, peel-off, and the like of sintered dielectric 260.

The following describes a problem that occurs, during thermal processing for forming the sintered dielectric, to resin substrate unit 230 and lead frame 590 on which metal plate capacitor 210 is mounted, with reference to Table 3 and Table 4.

TABLE 3

Problem of resin substrate unit occurring during baking of sintered dielectric

|  | Disclosed Product 1 (FIG. 2) | Comparative Product 1 (FIGS. 18 and 19) |
|---|---|---|
| Deformation of Resin Substrate Unit | Good (no deformation) | NG (deformation generated) |
| Lack in Resin Substrate | Good (no lack) | NG (lack generated) |

TABLE 3-continued

Problem of resin substrate unit occurring during baking of sintered dielectric

|  | Disclosed Product 1 (FIG. 2) | Comparative Product 1 (FIGS. 18 and 19) |
|---|---|---|
| Wire Bonding Property to Resin Substrate Unit | Good (no problem) | NG (wire bonding failed) |

TABLE 4

Problem of lead frame (LF) occurring during baking of sintered dielectric

|  | Disclosed Product 2 (FIG. 20A) | Comparative Product 2 (FIGS. 27 and 28) |
|---|---|---|
| Deformation of LF | Good (no deformation) | NG (deformation generated) |
| Lack in LF | Good (no lack) | NG (lack generated) |
| Wire Bonding Property to LF | Good (no problem) | NG (wire bonding failed) |

As indicated in Table 3 and Table 4 above, in both of disclosed product 1 (for example, semiconductor device 150) including resin substrate unit, and disclosed product 2 (for example, semiconductor device 580) including lead frame 590, no deformation nor lack were generated in resin substrate unit 230 or multiple lead frame 650 during thermal processing of the dielectric at high temperature. This is because the dielectric was baked on heat-resistant metal plate 160, not on lead frame 590 and resin substrate unit 230, in both of disclosed products 1 and 2, and thus lead frame 590 and resin substrate unit 230 were not subjected to the thermal processing at high temperature.

As described above, disclosed products 1 and 2 each had an excellent wire bonding property to lead frame 590 and resin substrate unit 230 (or land electrode 480 provided on the surface of resin substrate unit 230). In addition, in disclosed product 2, the wire bonding described above with reference to FIGS. 11 to 13 and the like can be performed after polyimide portion 680 is formed as illustrated in FIG. 26 described above, thereby achieving highly accurate bonding (polyimide portion 680 for maintaining the accuracy for lead frame 590 is not illustrated in FIGS. 21, 22, 24, 25, 45B to 45C, and the like).

However, in comparative product 2, lead frame 590 was deformed as illustrated in FIGS. 27 and 28 described above to become deformed leading end part 720, comparative product lacked portion 750, comparative product central portion 760, and the like, and was partially lacked. This is partially because of burning of polyimide portion 680 when a dielectric material formed by printing on lead frame 590 was baked together with lead frame 590 at 650° C. to 950° C. This is also because lead frame 590 is easily deformed and lacked when baking heating processing is performed after polyimide portion 680 is removed. It is difficult to perform wire bonding for lead frame 590 including deformed and lacked parts after burning of polyimide portion 680 as in comparative product 2.

As described above, in both of disclosed products 1 and 2, sintered dielectric 260 for forming a bypass capacitor is formed on heat-resistant metal plate 160, and thus resin substrate unit 230 and lead frame 590 are not affected by thermal processing at high temperature. As a result, disclosed products 1 and 2 each can satisfy requirements for a lead frame package having an excellent wire bonding property and compatible with multiple pins.

In this manner, an improved high speed transmission quality can be achieved by a lead frame package having excellent productivity, cost performance, and vibration-resistant property due to the use of lead frame 590. Thus, an extremely preferable device can be provided in the field of in-vehicle devices for which high speed image processing is increasingly required. In addition, a device having improved noise resistance achieved by, for example, reduction in fluctuation in a power-supply voltage due to external noise can be provided.

Ninth Exemplary Embodiment

Ninth exemplary embodiment describes, with reference to Table 5, measurement results of the high speed transmission quality evaluated by the inventors for the semiconductor device according to the present disclosure and the semiconductor package according to the present disclosure.

Table 5 lists exemplary results of evaluation of the jitter reducing effect in semiconductor devices 150 including a conventional example and a comparative example produced as trial products by the inventors.

Table 5 lists exemplary trial production results in the first to eighth exemplary embodiments performed by the inventors.

Table 5 lists an exemplary transmission characteristic comparison result. Item conventional product in Table 5 has an exemplary transmission characteristic when no capacitor is included. Item comparative product 3 in Table 5 has an exemplary transmission characteristic in a case illustrated in FIG. 48 described above. Item comparative product 4 in Table 5 has an exemplary transmission characteristic when a non-sintered conventional dielectric (that is a thermosetting dielectric material obtained by adding barium titanate powder to epoxy resin, and having K=30) is used as a dielectric in place of sintered dielectric 260. Items disclosed products 3 to 6 in Table 5 are results for QFP illustrated in FIG. 21 described above and the like, but are results for BGA or the like when lead frame 590 illustrated in FIG. 21 is replaced with resin substrate unit 230 illustrated in FIG. 2 described above.

Table 5 indicates structural comparison and contrast between the conventional example (in which no capacitor is included), comparative product 3 (in which the present disclosure is partially performed), comparative product 4 (in which the non-sintered conventional dielectric including resin is used in place of sintered dielectric 260), and examples of the present disclosure (disclosed products 3 to disclosed product 6). Disclosed products 4 to 6 in Table 5 were evaluated on semiconductor device 580 having a QFP

TABLE 5

Exemplary comparison of transmission characteristic and the like between disclosed products (first to fourth exemplary embodiments) of lead frame package provided with metal capacitor 210 according to the present disclosure and comparative products (conventional product and comparative products 3 and 4)

|  | Dielectric Material | Sheet Capacitor Electrode | Ground (GND) Metal Body | 3 Gpbs Clock Jitter Average | 6 Gpbs Clock Jitter Average | 6 Gpbs Data Jitter Average | Thermal Impact Reliability |
|---|---|---|---|---|---|---|---|
| Conventional Product | None Bypass capacitor on main board only | None | None LF die pad connected to GND | Poor 90 psec | Poor 81 psec | Poor 105 psec |  |
| Comparative Product 3 | None Bypass capacitor on main board only | Metal Only lower electrode of capacitor is connected to GND through wiring | Heat-resistant metal plate containing Al (thickness: 100 μm) | Poor 92 psec | Poor 79 psec | Poor 121 psec | Good |
| Comparative Product 4 | BTO Epoxy resin, K = 30 | Cu foil, upper Cu foil + NAu plating | Lower Cu foil electrode (thickness 18 μm) | Poor 88 psec | Poor 77 psec | Poor 104 psec | Good |
| Disclosed Product 3 | BTO (sintered dielectric), K = 500 | AgPd upper and lower electrodes | Heat-resistant metal plate containing Al (thickness: 50 μm) | Good 49 psec | Good 49 psec | Good 78 psec | Poor |
| Disclosed Product 4 | BTO (sintered dielectric), K = 500 | AgPd upper and lower electrodes Ag auxiliary electrodes | Heat-resistant metal plate containing Al (thickness: 50 μm) | Good 47 psec | Good 48 psec | Good 76 psec | Good |
| Disclosed Product 5 | BTO (sintered dielectric), K = 500 | AgPd upper and lower electrodes Ag auxiliary electrodes | Heat-resistant metal plate containing Al (thickness: 100 μm) | Good 47 psec | Good 48 psec | Good 75 psec | Good |
| Disclosed Product 6 | BTO (sintered dielectric), K = 500 | AgPd upper and lower electrodes AgPd auxiliary electrodes | Heat-resistant metal plate containing Al (thickness: 100 μm) | Good 48 psec | Good 49 psec | Good 83 psec | Poor | form illustrated in FIG. 20A described above and the like, but results of disclosed products 4 to 6 indicated in Table 5 are applicable to the PBGA structure illustrated in FIGS. 2 to 16B described above and the like. This is because the structure of connection between semiconductor chip 180, metal plate capacitor 210, and the like is the same for the disclosed products having outline shapes of PBGA, QFP, and WLCSP.

Figure 47:
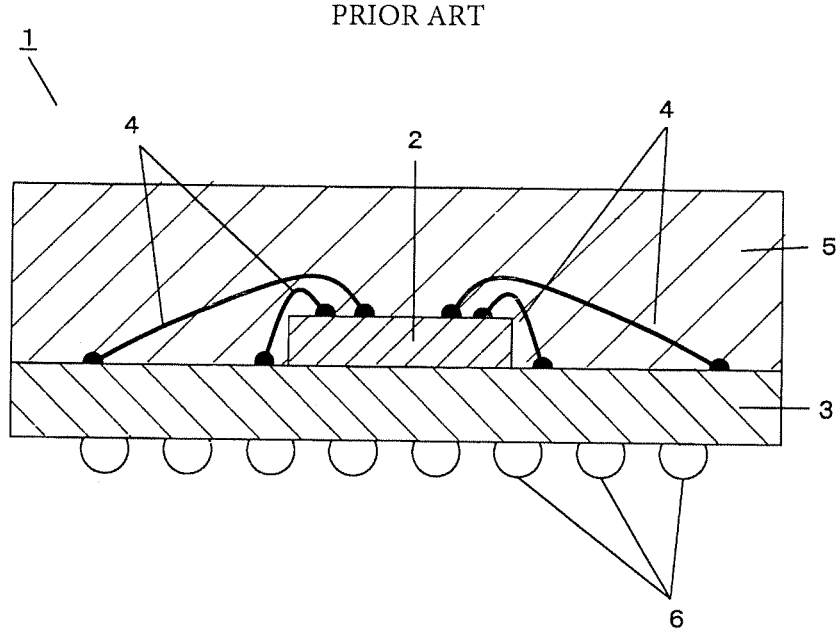
FIG. 47 is a sectional view illustrating an exemplary conventional signal processing semiconductor package.

In Table 5, the conventional product had a QFP package configuration in which metal plate capacitor 210 was not provided, and was, for example, a sample illustrated in FIG. 47 described above. In the conventional product, no capacitor was provided, and thus a capacity density was thought to be substantially zero. This is because only a capacity of pF order can be formed at most, even when a capacitance component formed between a power source layer and a GND layer formed in resin substrate unit 230 is used as a bypass capacitor.

In this manner, the conventional product was a normal lead frame package mounted on an evaluation board through a socket, and all necessary bypass capacitors (bypass capacitors having various capacities of 0.1 μF and 1 μF are mounted) were mounted on the evaluation board. In the conventional example, as the total length of a lead frame, a bonding wire, a wire on the evaluation board, and the like from an LSI power terminal to a bypass capacitor increased, equivalent series inductance (ESL) due to the wiring length increased. As a result, power impedance increased. As a result, in the conventional example, as indicated in Table 5, clock jitter and data jitter of 3 Gbps and 6 Gbps both increased. As a result, in the conventional example, an internal standard value to satisfy a characteristic of a product could not be satisfied.

In comparative product 3 in Table 5, a lead frame package on which metal plate capacitor 210 is mounted was produced, a ground electrode (GND) wire was connected with metal plate capacitor 210, and only a power (Vdd) wire was connected directly from the semiconductor chip to the lead frame.

In this manner, comparative product 3 in Table 5 is a sample in which metal plate capacitor 210 was included but not electrically connected with semiconductor chip 180. Specifically, similarly to the conventional product, comparative product 3 included only a bypass capacitor provided on a main board. Specifically, comparative product 3 had a structure in which upper electrode 270 and upper auxiliary electrode 280 included in metal plate capacitor 210 were not electrically connected with semiconductor chip 180 in FIG. 2 described above (in other words, no capacitor was connected with semiconductor chip 180, and accordingly, the capacity density is zero). Metal plate capacitor 210 in comparative product 3 included a stainless-steel foil containing Al (aluminum) and having a thickness of 100 μm. Only metal plate capacitor 210 was connected to ground (GND) through wiring.

Figure 48:
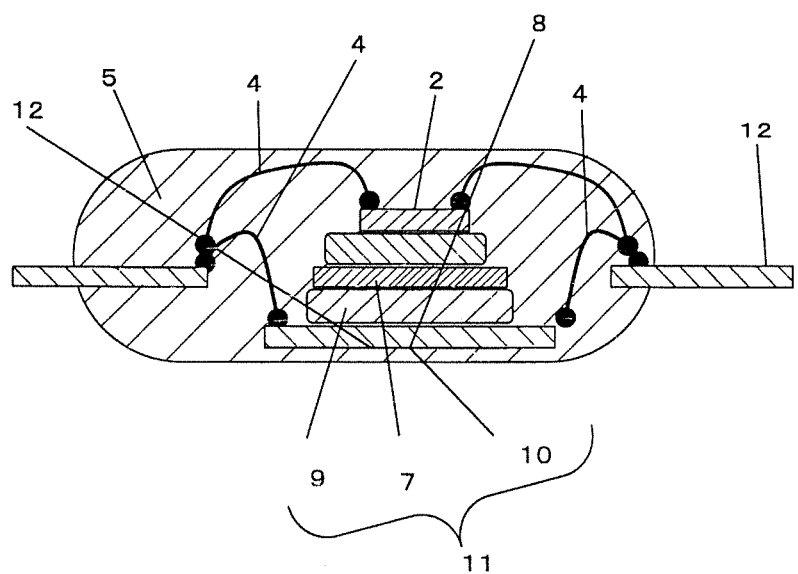
FIG. 48 is a sectional view of a semiconductor package including a conventional parallel plate capacitor achieved by an insulating film and a metal foil.
Figure 49:
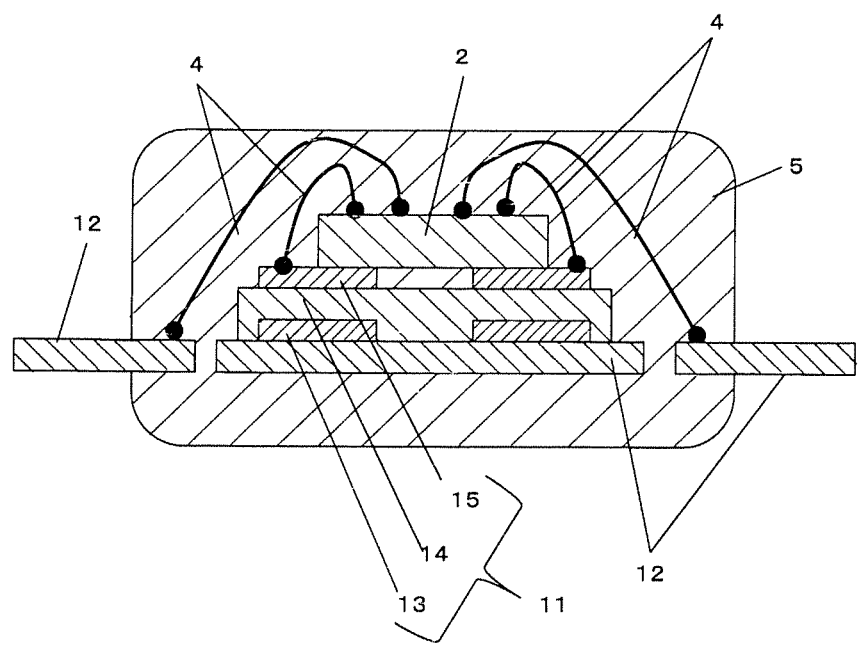
FIG. 49 is a sectional view of a semiconductor package including a conventional capacitor obtained by forming a dielectric on a lead frame.

In comparative product 4 in Table 5, a combination of dielectric paste (K=30) obtained by dispersing BTO powder in epoxy resin, and a copper foil having a thickness of 18 μm was used as a dielectric material included in metal plate capacitor 210 (corresponding to, for example, the sample illustrated in FIG. 48 described above). In comparative product 4, the capacity density was low at 7 pF/mm², which was the same in a case in which a capacitor having a capacity of 0.17 nF is included. As described above, in comparative product 4, since the dielectric paste had a low dielectric constant, a jitter value at 3 Gbps clock, a jitter value at 6 Gbps clock, and a data jitter value at 6 Gbps were large, which was a poor result. As described above, the sample of Comparative Example 4 had a low capacity density and was poor (undesired result).

Disclosed product 3 in Table 5 is a sample in which BTO (K=500) was used as a dielectric material, and corresponds to, for example, semiconductor device 580 illustrated in FIG. 21 described above. Disclosed product 3 was produced in the same manner as disclosed products 1 and 2 described above. In disclosed product 3, a stainless-steel foil (having a thickness of 50 μm) containing aluminum was used as heat-resistant metal plate 160. In disclosed product 3, lower electrode 240 and upper electrode 270 were AgPd electrodes, and lower auxiliary electrode 250 and upper auxiliary electrode 280 were not provided. As a result, in disclosed product 3, metal plate capacitor 210 obtained a high capacity density of 400 pF/mm². However, among n=5 of metal plate capacitors 210 as trial products, the number of non-defective products was two, and the number of NG products was three. In these NG products, short-circuit was generated in a capacitor electrical examination. Accordingly, when heat-resistant metal plate 160 has a small thickness of 50 μm, the proof strength of heat-resistant metal plate 160 decreases without lower auxiliary electrode 250 and upper auxiliary electrode 280. This indicates that, for example, a micro crack is generated in sintered dielectric 260 due to force and heat generated at wire bonding in some cases.

Disclosed product 4 in Table 5 is a sample including sintered dielectric 260 in which BTO (K=500) was used as a dielectric material. In disclosed product 4, stainless steel foil (having a thickness of 50 μm) containing aluminum was used as heat-resistant metal plate 160. In disclosed product 4, lower electrode 240 and upper electrode 270 were AgPd electrodes, and in addition, Ag electrodes as lower auxiliary electrode 250 and upper auxiliary electrode 280 were provided. Wire bonding was performed on lower auxiliary electrode 250 and upper auxiliary electrode 280. In disclosed product 4, metal plate capacitor 210 obtained a high capacity density of 400 pF/mm². No damage or the like was generated in the capacitor by wire bonding. This is because lower auxiliary electrode 250 and upper auxiliary electrode 280 were formed even when heat-resistant metal plate 160 had a small thickness of 50 μm. This is because force and heat generated at wire bonding were absorbed and reduced by lower auxiliary electrode 250 and upper auxiliary electrode 280, thereby preventing generation of, for example, a micro crack in sintered dielectric 260. In addition, when the thickness is 50 μm, deflection occurs through a mounting process, and insulation breakdown and crack are generated due to bending, which potentially affects insulation reliability.

Disclosed product 5 in Table 5 is a sample including sintered dielectric 260 in which BTO (K=500) was used as a dielectric material. In disclosed product 5, a stainless-steel foil (having a thickness of 100 μm) containing aluminum was used as heat-resistant metal plate 160. In disclosed product 5, lower electrode 240 and upper electrode 270 were AgPd electrodes, and in addition, Ag electrodes as lower auxiliary electrode 250 and upper auxiliary electrode 280 were provided. Wire bonding was performed on lower auxiliary electrode 250 and upper auxiliary electrode 280. In disclosed product 5, metal plate capacitor 210 obtained a high capacity density of 400 pF/mm². No damage or the like was generated in the capacitor by wire bonding. This is because, when lower auxiliary electrode 250 and upper auxiliary electrode 280 were formed, force and heat generated at wire bonding were absorbed and reduced by lower auxiliary electrode 250 and upper auxiliary electrode 280, thereby preventing generation of, for example, a micro crack in sintered dielectric 260. An excellent wire bonding property was obtained even for a small die pad.

Disclosed product 6 in Table 5 is a sample including sintered dielectric 260 in which BTO (K=500) was used as a dielectric material. In disclosed product 6, a stainless-steel foil (having a thickness of 100 μm) containing aluminum was used as heat-resistant metal plate 160. In disclosed product 6, lower electrode 240 and upper electrode 270 were AgPd electrodes, and in addition, AgPd electrodes as lower auxiliary electrode 250 and upper auxiliary electrode 280 were provided. Wire bonding was performed on lower auxiliary electrode 250 and upper auxiliary electrode 280. In disclosed product 6, metal plate capacitor 210 obtained a high capacity density of 400 pF/mm². No damage or the like was generated in the capacitor by wire bonding. This is because, as illustrated for disclosed product 3, generation of, for example, a micro crack in sintered dielectric 260 was prevented by lower auxiliary electrode 250 and upper auxiliary electrode 280 formed as in disclosed product 4 even when heat-resistant metal plate 160 had a small thickness of 50 μm. An excellent wire bonding property was obtained even for a small die pad. In disclosed product 4, the wire bonding property had a problem in some cases depending on, for example, the magnitude of the area of the die pad.

Comparison among comparative product 2, disclosed product 5, and disclosed product 6 in Table 5 indicates that components are substantially the same, but power wires are connected differently. As a result, in comparative product 3, a jitter measured value as a high speed transmission characteristic had a problem. In particular, at 30 psec or larger for 3 Gbps and 6 Gbps, advantage in jitters appears as an effect achieved by capacitor unit mounting and direct connection. This clearly indicates an effect achieved by connection between a power terminal of semiconductor chip 180 and a power terminal part of metal plate capacitor 210 with a short wire, that is, at low ESL.

Item comparative product 4 is a result obtained when a sheet capacitor obtained by dispersing BTO powder in commercially available epoxy resin was used an embedded capacitor, mounted, and connected by wire bonding. As described with item comparative product 4, a semiconductor device including a conventional commercially available capacitor (for example, the semiconductor device described above with reference to FIG. 48, which includes a capacitor formed using thermoset dielectric paste obtained by dispersing dielectric powder of BTO or the like in thermosetting resin such as epoxy resin) has an advantage of being able to use a copper foil as an electrode. However, the relative dielectric constant is small due to a dielectric layer structure in which resin is filled with dielectric filler. A result of trial production performed by the inventors indicates that a capacity that can be mounted was low at 0.17 nF approximately. Thus, in comparative product 4, a slight jitter reducing effect was obtained but at such a level that the effect could be regarded as measurement fluctuation.

The sheet capacitor that is a trial product as comparative product 4 had low rigidness (or stiffness), and thus, when a lead frame having a small die pad was used, formation of wire bonding was difficult at a large number of places. In addition, in comparative product 4, the insulating property of the capacitor was broken down at some places due to wire bonding, which is a problem in achieving the device formability.

In all of disclosed products 3 to 6 in which metal plate capacitor 210 including a BTO sintered body formed on a stainless-steel metal body as a heat-resistant metal plate containing aluminum was mounted, a significant effect of reduction of jitters by about 30 psec or longer was found for initial characteristics as compared to the conventional product, comparative product 3, and comparative product 4.

For example, in disclosed product 3 (in which sintered dielectric 260 in which BTO is used as a dielectric, and lower electrode 240 and upper electrode 270 are AgPd electrodes), excellent results of clock jitter of 49 psec at 3 Gbps, clock jitter of 49 psec at 6 Gbps, and data jitter of 78 psec at 6 Gbps were obtained. Disclosed product 3 had a problem in some cases in an impact resistance experiment, but would be evaluated to be "Good" by optimizing a QFP form and the like or employing a configuration of PBGA instead of QFP.

The following (A), (B), and (C) were found from the results of Table 1 to Table 5 above.

(A) Bonding is possible but enough pull strength cannot be obtained in some cases when electrodes as connection surfaces for wire bonding are only upper electrode 270 and lower electrode 240 that are AgPd electrodes. In such a case, when Ag electrodes as upper auxiliary electrode 280 and lower auxiliary electrode 250 are formed on AgPd electrodes as upper electrode 270 and lower electrode 240, an extremely favorable wire bonding property is obtained. In addition, when upper auxiliary electrode 280 and lower auxiliary electrode 250 are provided, damage on a dielectric layer in sintered dielectric 260 due to bonding can be avoided, and a dielectric characteristic such as a capacity density can be maintained.

(B) A thermal resistance stainless steel metal plate containing aluminum was examined as heat-resistant metal plate 160 for different thicknesses of 30 μm, 50 μm, 100 μm, and 200 μm. This examination found that bonding was difficult at some places for a thickness of 30 μm and a thickness of 50 μm when the die pad has a small size of 50 μm or smaller. When heat-resistant metal plate 160 had a thickness of 30 μm or a thickness of 50 μm, failure of bending, deformation, and the like occurred during the process of mounting metal plate capacitor 210 in some cases. When heat-resistant metal plate 160 having a thickness of 200 μm was used, a designing problem that a sufficient height could not be obtained for wire bonding occurred, resulting in a limited range of usage in some cases. Table 3 and Table 4 only list results for the thickness of 50 μm and thickness of 100 μm of the stainless-steel foil (heat-resistant metal plate 160) containing aluminum, but do not list results for the thickness of 30 μm, 200 μm, and the like.

(C) Case in which Ag electrodes or AgPd electrode were used as upper auxiliary electrode 280 and lower auxiliary electrode 250. Comparison between disclosed product 5 and disclosed product 6 indicates that both products had excellent jitter reducing characteristics for initial characteristics. However, in a heat impact test, peel-off between electrodes (for example, at an interface between upper auxiliary electrode 280 and solid upper electrode 270) occurred in some cases only when the AgPd electrodes having large thicknesses were selectively stacked on the AgPd electrodes. In such a case, the problem can be solved by increasing an Ag ratio in an electrode to 80 mass % or more, 90 mass % or more, and 95 mass % or more, for lower auxiliary electrode 250 and upper auxiliary electrode 280. In addition, it was found that Ag electrode is more preferable as auxiliary electrode materials of upper auxiliary electrode 280 and lower auxiliary electrode 250 than AgPd electrode.

In the present disclosure, heat-resistant metal plate 160 may be referred to as a heat-resistant metal foil. A foil and a plate are effectively the same in the present disclosure.

In the examples described above with reference to FIGS. 2, 9 to 17B, 21 to 25, 29A to 46, and the like, it is easy and advantageous to replace lead frame 590 with resin substrate unit 230 and land electrode 480. In FIGS. 21 to 25, 32, 45A to 46 described above, and the like, polyimide portion 680 to which lead frame 590 is fixed is not illustrated.

According to the present disclosure, as described above, when a capacitor unit including a sintered dielectric is formed on a heat-resistant metal plate, the capacity of a capacitor can be improved significantly. This can lead to large reduction of jitters and improved instrument performance during high speed signal processing performed in a vehicle high-definition television, and an electronic device required to perform high speed signal processing at 2K, 4K, and the like.

What is claimed is:

1. A semiconductor device comprising:
   a metal plate capacitor including a heat-resistant metal plate and a capacitor unit including a sintered dielectric formed on at least one surface of the heat-resistant metal plate, the heat-resistant metal plate containing aluminum in an amount of 0.5 mass % to 20 mass %, inclusive;
   a semiconductor chip disposed on the metal plate capacitor;
   a connector configured to electrically connect the semiconductor chip and the metal plate capacitor; and
   a protector configured to protect the semiconductor chip, the metal plate capacitor, and the connector.

2. A semiconductor device comprising:
   a metal plate capacitor including a heat-resistant metal plate, and a lower electrode, a sintered dielectric, and an upper electrode that are formed on at least one surface of the heat-resistant metal plate, the heat-resistant metal plate containing aluminum in an amount of 0.5 mass % to 20 mass %, inclusive;
   a semiconductor chip disposed on the metal plate capacitor;
   a resin substrate unit on which the heat-resistant metal plate and the semiconductor chip are disposed;
   an upper chip connector configured to electrically connect the semiconductor chip and the upper electrode;
   a lower chip connector configured to electrically connect the semiconductor chip and the lower electrode; and
   a protector configured to protect the semiconductor chip, the metal plate capacitor, the upper chip connector, the lower chip connector, and a surface of the resin substrate unit.

3. The semiconductor device according to claim 2, wherein the lower electrode and the heat-resistant metal plate are electrically connected with each other.

4. The semiconductor device according to claim 2, wherein the lower electrode and the heat-resistant metal plate are connected with each other through a fabricated connection part formed in at least the metal plate capacitor.

5. The semiconductor device according to claim 2, wherein
   the heat-resistant metal plate further includes a back electrode, and
   the back electrode is formed on a side of the heat-resistant metal plate, on which the lower electrode is not formed.

6. The semiconductor device according to claim 2, wherein
   the upper electrode includes an upper auxiliary electrode formed on a surface of the upper electrode, and
   part of the upper chip connector is connected with the upper auxiliary electrode.

7. The semiconductor device according to claim 2, wherein
   the lower electrode includes a lower auxiliary electrode formed on a surface of the lower electrode, and
   part of the lower chip connector is connected with the lower auxiliary electrode.

8. The semiconductor device according to of claim 2, wherein a plurality of the upper electrodes insulated from each other in a pattern shape are formed on one surface of the sintered dielectric.

9. The semiconductor device according to claim 2, wherein a plurality of the semiconductor chips are disposed on one surface of the metal plate capacitor.

10. The semiconductor device according to of claim 2, wherein
    an insulating oxide layer is formed on a surface of the heat-resistant metal plate, and
    at least the heat-resistant metal plate and the lower electrode are connected with each other through a fabricated connection part formed at an end part of the heat-resistant metal plate.

11. The semiconductor device according to of claim 2, wherein
    the upper electrode and the lower electrode are each a sintered electrode containing silver of 50 mass % to 100 mass % inclusive, and
    the sintered dielectric is a sintered dielectric having a thickness of 3 μm to 50 μm inclusive and obtained through sintering.

12. The semiconductor device according to claim 2, wherein
    the heat-resistant metal plate includes a through-hole into which the semiconductor chip is inserted,
    the upper electrode, the sintered dielectric, and the lower electrode are formed around the through-hole, and
    the semiconductor chip is disposed in the through-hole.

13. The semiconductor device according to claim 2, wherein
    the metal plate capacitor includes an opening in which the sintered dielectric and the upper electrode are not formed,
    the upper electrode and the sintered dielectric are formed around the opening, and
    the semiconductor chip is disposed in the opening.

14. A semiconductor device comprising:
    a lead frame;
    a metal plate capacitor including a heat-resistant metal plate, and a lower electrode, a sintered dielectric, and an upper electrode that are formed on at least one surface of the heat-resistant metal plate, the heat-resistant metal plate containing aluminum in an amount of 0.5 mass % to 20 mass %, inclusive;
    a semiconductor chip disposed on the metal plate capacitor;
    an upper chip connector configured to electrically connect the semiconductor chip and the upper electrode;
    a lower chip connector configured to electrically connect the semiconductor chip and the lower electrode;
    a protector configured to protect the semiconductor chip, the metal plate capacitor, the upper chip connector, the lower chip connector, and at least part of the lead frame.

15. The semiconductor device according to claim 14, wherein the lower electrode and the heat-resistant metal plate are electrically connected with each other.

16. The semiconductor device according to claim 14, wherein the lower electrode and the heat-resistant metal plate are connected with each other through a fabricated connection part formed in at least the metal plate capacitor.

17. The semiconductor device according to claim 14, wherein
the heat-resistant metal plate further includes a back electrode, and
the back electrode is formed on a side of the heat-resistant metal plate, on which the lower electrode is not formed.

18. The semiconductor device according to claim 14, wherein
the upper electrode includes an upper auxiliary electrode formed on a surface of the upper electrode, and
part of the upper chip connector is connected with the upper auxiliary electrode.

19. The semiconductor device according to claim 14, wherein
the lower electrode includes a lower auxiliary electrode formed on a surface of the lower electrode, and
part of the lower chip connector is connected with the lower auxiliary electrode.

20. The semiconductor device according to of claim 14, wherein a plurality of the upper electrodes insulated from each other in a pattern shape are formed on one surface of the sintered dielectric.

21. The semiconductor device according to of claim 14, wherein a plurality of the semiconductor chips are disposed on one surface of the metal plate capacitor.

22. The semiconductor device according to of claim 14, wherein
an insulating oxide layer is formed on a surface of the heat-resistant metal plate, and
at least the heat-resistant metal plate and the lower electrode are connected with each other through a fabricated connection part formed at an end part of the heat-resistant metal plate.

23. The semiconductor device according to of claim 14, wherein
the upper electrode and the lower electrode are each a sintered electrode containing silver of 50 mass % to 100 mass % inclusive, and
the sintered dielectric is a sintered dielectric having a thickness of 3 µm to 50 µm inclusive and obtained through sintering.

24. The semiconductor device according to claim 14, wherein
the heat-resistant metal plate includes a through-hole into which the semiconductor chip is inserted,
the upper electrode, the sintered dielectric, and the lower electrode are formed around the through-hole, and
the semiconductor chip is disposed in the through-hole.

25. The semiconductor device according to claim 14, wherein
the metal plate capacitor includes an opening in which the sintered dielectric and the upper electrode are not formed,
the upper electrode and the sintered dielectric are formed around the opening, and
the semiconductor chip is disposed in the opening.

* * * * *